(12) United States Patent
Richards

(10) Patent No.: US 7,286,906 B2
(45) Date of Patent: Oct. 23, 2007

(54) PREDICTIVE CONTROL SYSTEM AND METHOD

(75) Inventor: Michael J. Richards, Mississauga (CA)

(73) Assignee: Zetacon Corporation, Mississauga (CA)

( * ) Notice: Subject to any disclaimer, the term of this patent is extended or adjusted under 35 U.S.C. 154(b) by 0 days.

(21) Appl. No.: 11/504,595

(22) Filed: Aug. 16, 2006

(65) Prior Publication Data

US 2007/0021873 A1 Jan. 25, 2007

Related U.S. Application Data

(62) Division of application No. 10/370,476, filed on Feb. 24, 2003.

(60) Provisional application No. 60/383,771, filed on May 30, 2002, provisional application No. 60/359,898, filed on Feb. 28, 2002.

(51) Int. Cl.
G01R 21/00 (2006.01)

(52) U.S. Cl. ........................ 700/286; 700/291

(58) Field of Classification Search ................ 700/286, 700/291; 363/41, 132, 37
See application file for complete search history.

(56) References Cited

U.S. PATENT DOCUMENTS

| | | | |
|---|---|---|---|
| 3,967,173 A * | 6/1976 | Stich | ........................ 318/811 |
| 4,296,462 A | 10/1981 | Gurr | |
| 4,494,010 A | 1/1985 | Donnelly | |
| 4,680,695 A | 7/1987 | Kerkman et al. | |
| 4,742,444 A | 5/1988 | Gose et al. | |
| 4,994,950 A | 2/1991 | Gritter | |
| 5,001,411 A | 3/1991 | Heinle | |
| 5,097,193 A | 3/1992 | Neis et al. | |
| 5,187,454 A | 2/1993 | Collins et al. | |

(Continued)

FOREIGN PATENT DOCUMENTS

| | | |
|---|---|---|
| EP | 0 351 783 A2 | 1/1990 |
| EP | 0 469 873 A2 | 2/1992 |
| JP | 6351271 | 12/1994 |
| JP | 7337099 | 12/1995 |

OTHER PUBLICATIONS

Baader, Uwe, et al., "Direct Self Control (DSC) of Inverter-Fed Induction Machine: A Basis for Speed Control Without Speed Measurement", IEEE Transactions on Industry Applications, vol. 28, No. 3, May/Jun. 1992, pp. 581-588.

(Continued)

Primary Examiner—Leo Picard
Assistant Examiner—Steven R. Garland
(74) Attorney, Agent, or Firm—Bereskin & Parr

(57) ABSTRACT

A control system and method selects a switch configuration for a power circuit having N binary switches, based in part on a finite state machine. The control system includes an embedded simulator, and present and next state contemplators. The various switch states of the power circuit are modeled by the finite state machine such that at any time, the power circuit switches are in a Present State and there are a plurality of Next States which are one or more switch transitions away from the Present State. The embedded simulator estimates the operating conditions of the load based on measured operational characteristics and the Present State. The present state contemplator determines, based on the operating conditions, whether a switch state transition should be contemplated. If so, the next state contemplator determines the optimal next state based on performance criteria and sends a state switch command to the power circuit.

1 Claim, 34 Drawing Sheets

U.S. PATENT DOCUMENTS

| | | | |
|---|---|---|---|
| 5,294,876 | A | 3/1994 | Jonsson |
| 5,319,295 | A | 6/1994 | Van Patten et al. |
| 5,334,923 | A | 8/1994 | Lorenz et al. |
| 5,394,068 | A | 2/1995 | Severson et al. |
| 5,394,331 | A | 2/1995 | Dudek et al. |
| 5,421,302 | A | 6/1995 | Livshits et al. |
| 5,426,732 | A | 6/1995 | Boies et al. |
| 5,452,210 | A | 9/1995 | Rozanski |
| 5,486,747 | A | 1/1996 | Welch |
| 5,519,618 | A | 5/1996 | Kastner et al. |
| 5,572,420 | A | 11/1996 | Lu |
| 5,630,417 | A | 5/1997 | Petersen et al. |
| 5,650,705 | A | 7/1997 | Hart |
| 5,734,249 | A | 3/1998 | Pohjalainen et al. |
| 5,734,278 | A | 3/1998 | Lenihan, III |
| 5,806,011 | A | 9/1998 | Azzaro et al. |
| 5,854,922 | A | 12/1998 | Gravenstein et al. |
| 5,892,673 | A | 4/1999 | Delgado et al. |
| 5,907,228 | A | 5/1999 | Thomas et al. |
| 6,069,808 | A | 5/2000 | Panahi et al. |
| 6,087,801 | A | 7/2000 | Bethoux et al. |
| 6,094,364 | A | 7/2000 | Heikkila |
| 6,124,696 | A | 9/2000 | Rademacher et al. |
| 6,198,248 | B1 | 3/2001 | Thomas et al. |
| 6,198,590 | B1 | 3/2001 | Codilian et al. |
| 6,215,261 | B1 | 4/2001 | Becerra |
| 6,242,873 | B1 | 6/2001 | Drozdz et al. |
| 6,262,904 | B1 | 7/2001 | Meynard et al. |
| 6,288,517 | B1 | 9/2001 | Parker et al. |
| 6,316,896 | B1 | 11/2001 | Tikkanen et al. |
| 6,316,918 | B1 | 11/2001 | Underwood et al. |
| 6,317,638 | B1 | 11/2001 | Schreder et al. |
| 6,321,143 | B1 | 11/2001 | Phillips et al. |
| 6,335,607 | B1 | 1/2002 | Niemela |
| 6,380,719 | B2 | 4/2002 | Underwood et al. |
| 6,747,884 | B2 * | 6/2004 | Nishizawa et al. ......... 363/132 |
| 6,804,127 | B2 * | 10/2004 | Zhou ........................ 363/37 |
| 2002/0030365 | A1 | 3/2002 | Underwood et al. |

OTHER PUBLICATIONS

Cabrera, Luis A. et al., "Learning Techniques to Train Neural Networks as a State Selector for Inverter-Fed Induction Machines Using Direct Torque Control", IEEE Transactions on Power Electronics, vol. 12, No. 5, Sep. 1997, pp. 788-799.

Cabrera, Luis A., et al., "Tuning the Stator Resistance of Induction Motors Using Artificial Neural Network", IEEE Transactions On Power Electronics, vol. 12, No. 5, Sep. 1997, pp. 779-787.

Casadei et al., "Implementation of a Direct Torque Control Algorithm for Induction Motors Based on Discrete Space Vector Modulation", IEEE Transactions on Power Electronics, vol. 15, No. 4, 2000, pp. 769-777.

Casadei, Professor Domenico, Professor Giuseppe Buja and Professor Giovanni Sera, ISIE conference 1998 in Pretoria, South Africa Tutorial: Direct Torque and Stator Flux Control of an Induction Motor Theoretical Analysis and Experimental Results.

Kang, Jun-Koo and Seung-Ki Sul, "Analysis and Prediction of Inverter Switching Frequency in Direct Torque Control of Induction Machine Based on Hysteresis Bands and Machine Parameters", IEEE Transactions on Industrial Electronics, vol. 48, No. 3, Jun. 2001, pp. 545-553.

Kang, Jun-Koo and Seung-Ki Sul, "New Direct Torque Control of Induction Motor for Minimum Torque Ripple and Constant Switching Frequency", IEEE Transactions on Industry Applications, vol. 35, No. 5, Sep./Oct. 1999, pp. 1076-1082.

Lai, Yen-Shin et al., "A New Approach to Direct Torque Control of Induction Motor Drives for Constant Inverter Switching Frequency and Torque Ripple Reduction", IEEE Transactions on Energy Conversion, vol. 16, No. 3, Sep. 2001, pp. 220-227.

Lai, Yen-Shin et al., "Direct Torque Control Induction Motor Drives with Self-Commissioning Based on Taguchi Methodology", IEEE Transactions on Power Electronics, vol. 15, No. 6, Nov. 2000, pp. 1065-1071.

Maes, Jehudi et al., "Speed-Sensorless Direct Torque Control of Induction Motors Using an Adaptive Flux Observer", IEEE Transactions On Industry Applications, vol. 36, No. 3, May/Jun. 2000, pp. 778-785.

Martins, C.A. et al., "A predictive sampling scale model for direct torque control of the induction machine fed by multilevel voltage-source inverters", Eur. Phys. J. AP 5, 51-61 (1999).

Mir, Sayeed et al., "PI and Fuzzy Estimators for Tuning the Stator Resistance in Direct Torque Control of Induction Machines", IEEE Transactions on Power Electronics, vol. 13, No. 2, Mar. 1998, pp. 279-287.

Moynihan, J.F., et al., "High Performance Control of AC Servomotors Using An Integrated DSP", Intelligent Motion, May 1998, Proceedings, pp. 213-222.

Nash, James N., "Direct Torque Control, Induction Motor Vector Control Without an Encoder", IEEE Transactions On Industry Applications, vol. 33, No. 2, Mar./Apr. 1997, pp. 333-341.

Purcell et al., "Enhanced Inverter Switching for Fast Response Direct Torque Control", IEEE Transactions on Power Electronics, vol. 16, No. 3, 2001, pp. 382-389.

Richards, M.J., "Future trends in total digital control of variable speed drive industrial applications", Pulp & Paper Industry Technical Conference, Jun. 3-7, 1991, Montreal, Quebec, Canada, pp. 164-176.

Sullivan, Charles R. et al., "Control Systems for Induction Machines with Magnetic Saturation", IEEE Transactions on Industrial Electronics, vol. 43, No. 1, Feb. 1996, pp. 142-152.

Tiitinen, Pekka et al., "The Next Generation Motor Control Method—Direct Torque Control, DTC", originally published in the proceedings EPE Chapter Symposium On Electric Drive Design and Applications, Lausanne, Oct. 1994, pp. 1-7.

Zhong, L. et al., "A Direct Torque Controller For Permanent Magnet Synchronous Motor Drives", IEEE Transactions on Energy Conversion, vol. 14, No. 3, Sep. 1999, pp. 637-642.

Zhong, L. et al., "Analysis of Direct Torque Control in Permanent Magnet Synchronous Motor Drives", IEEE Transactions on Power Electronics, vol. 12, No. 3, May 1997, pp. 528-536.

1997 advertisement from ABB in Canadian Process Equipment and Control News, Feb. 1997.

\* cited by examiner $S = \{abc\} = \{001\} = 1$ $\begin{bmatrix} vds \\ vqs \end{bmatrix} = VDC \begin{bmatrix} a & -0.5b & -0.5c \\ 0 & -0.866b & -0.866c \end{bmatrix} = VDC \begin{bmatrix} -0.5 \\ -0.866 \end{bmatrix}$ Vab=VDC(a-b)
Vbc=VDC(b-c)
Vca=VDC(c-a)

Van=(VDC/3)(2a-b-c)
Vbn=(VDC/3)(2b-c-a)
Vcn=(VDC/3)(2c-a-b)

All possible Voltage Vectors 0 0 0 = V0 = VDC(0) (zero vector)
0 0 1 = V1 = VDC(-0.5 - 0.866j)
0 1 0 = V2 = VDC(-0.5 + 0.866j)
0 1 1 = V3 = VDC(-1 + 0j)
1 0 0 = V4 = VDC(1 + 0j)
1 0 1 = V5 = VDC(0.5 - 0.866j)
1 1 0 = V6 = VDC(0.5 + 0.866j)
1 1 1 = V7 = VDC(0) (zero vector)

The D-Q Space Plane

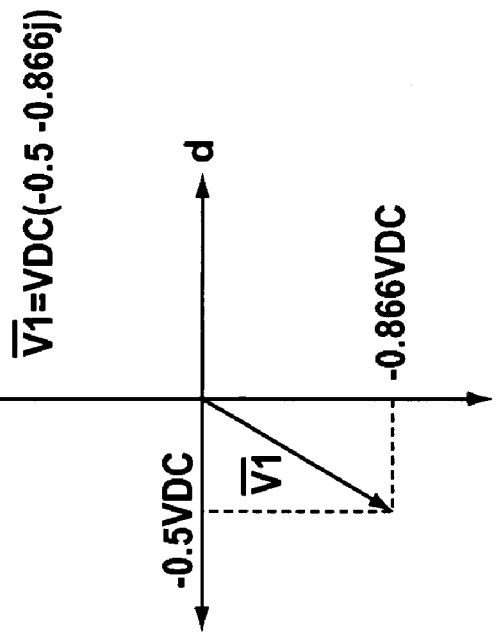

$\overline{V1}$=VDC(-0.5 -0.866j)

FIG. 7B

V1 to V0, SWc   switch opens, ic < 0, Vintlk = V1
V1 to V0, SWc   switch opens, ic > 0, Vintlk = V0
V2 to V0, SWb   switch opens, ic < 0, Vintlk = V2
V2 to V0, SWb   switch opens, ic > 0, Vintlk = V0
V4 to V0, SWa   switch opens, ic < 0, Vintlk = V4
V4 to V0, SWa   switch opens, ic > 0, Vintlk = V0
V3 to V1, SWb   switch opens, ib < 0, Vintlk = V3
V3 to V1, SWb   switch opens, ib > 0, Vintlk = V1
V0 to V1, SWc'  switch opens, ic > 0, Vintlk = V0
V0 to V1, SWc'  switch opens, ic < 0, Vintlk = V1
V5 to V1, SWa   switch opens, ia < 0, Vintlk = V5
V5 to V1, SWa   switch opens, ia > 0, Vintlk = V1
V3 to V2, SWc   switch opens, ic < 0, Vintlk = V3
V3 to V2, SWc   switch opens, ic > 0, Vintlk = V2
V0 to V2, SWb'  switch opens, ib > 0, Vintlk = V0
V0 to V2, SWb'  switch opens, ib < 0, Vintlk = V2
V6 to V2, SWa   switch opens, ia < 0, Vintlk = V6
V6 to V2, SWa   switch opens, ia > 0, Vintlk = V2
V2 to V3, SWc'  switch opens, ic > 0, Vintlk = V2
V2 to V3, SWc'  switch opens, ic < 0, Vintlk = V3
V7 to V3, SWa   switch opens, ia < 0, Vintlk = V7
V7 to V3, SWa   switch opens, ia > 0, Vintlk = V3
V1 to V3, SWb'  switch opens, ib > 0, Vintlk = V1
V1 to V3, SWb'  switch opens, ib < 0, Vintlk = V3
V6 to V4, SWb   switch opens, ib < 0, Vintlk = V6
V6 to V4, SWb   switch opens, ib > 0, Vintlk = V4
V0 to V4, SWa'  switch opens, ia > 0, Vintlk = V0
V0 to V4, SWa'  switch opens, ia < 0, Vintlk = V4
V5 to V4, SWc   switch opens, ic < 0, Vintlk = V5
V5 to V4, SWc   switch opens, ic > 0, Vintlk = V4
V1 to V5, SWa'  switch opens, ia > 0, Vintlk = V1
V1 to V5, SWa'  switch opens, ia < 0, Vintlk = V5
V7 to V5, SWb   switch opens, ib < 0, Vintlk = V7
V7 to V5, SWb   switch opens, ib > 0, Vintlk = V5
V4 to V5, SWc'  switch opens, ic > 0, Vintlk = V4
V4 to V5, SWc'  switch opens, ic < 0, Vintlk = V5
V2 to V6, SWa'  switch opens, ia > 0, Vintlk = V2
V2 to V6, SWa'  switch opens, ia < 0, Vintlk = V6
V7 to V6, SWc   switch opens, ic < 0, Vintlk = V7
V7 to V6, SWc   switch opens, ic > 0, Vintlk = V6
V4 to V6, SWb'  switch opens, ib > 0, Vintlk = V4
V4 to V6, SWb'  switch opens, ib < 0, Vintlk = V6
V3 to V7, SWa'  switch opens, ia > 0, Vintlk = V3
V3 to V7, SWa'  switch opens, ia < 0, Vintlk = V7
V6 to V7, SWc'  switch opens, ic > 0, Vintlk = V6
V6 to V7, SWc'  switch opens, ic < 0, Vintlk = V7
V5 to V7, SWb'  switch opens, ib > 0, Vintlk = V5
V5 to V7, SWb'  switch opens, ib < 0, Vintlk = V7

FIG. 13D

Time in the past t=x ; No change
$y_{n+1} = K1*y_n - K2*y_{n-1} + K3*y_{n-2} + K4*h*p_{n+1}$ ; Here, $p_{n+1}$ is as per Figure 2
$y_{n-2} = y_{n-1}$ ; $y_{n-1} = y_n$, $y_n = y_{n+1}$ T=x+h ; No change
$y_{n+1} = K1*y_n - K2*y_{n-1} + K3*y_{n-2} + K4*h*p_{n+1}$ ; Here, $p_{n+1}$ is as per Figure 2
$y_{n-2} = y_{n-1}$ ; $y_{n-1} = y_n$, $y_n = y_{n+1}$ T=x+2h ; No change
$y_{n+1} = K1*y_n - K2*y_{n-1} + K3*y_{n-2} + K4*h*p_{n+1}$ ; Here, $p_{n+1}$ is as per Figure 2
$y_{n-2} = y_{n-1}$ ; $y_{n-1} = y_n$, $y_n = y_{n+1}$ T=x+3h ; Change required
$y_{n+1} = K1*y_n - K2*y_{n-1} + K3*y_{n-2} + K4*hint*p_{n+1}$ ; Here, $p_{n+1}$ is as per interlock rules shown in Figure 13D
$y_{n-2} = y_{n-1}$ ; $y_{n-1} = y_n$, $y_n = y_{n+1}$ $y_{n+1} = K1*y_n - K2*y_{n-1} + K3*y_{n-2} + K4*(h-hint)*p_{n+1}$ ; Here, $p_{n+1}$ is as per the rules of Figure 7B
$y_{n-2} = y_{n-1}$ ; $y_{n-1} = y_n$, $y_n = y_{n+1}$ T=x+4h ; No change
$y_{n+1} = K1*y_n - K2*y_{n-1} + K3*y_{n-2} + K4*h*p_{n+1}$ ; Here, $p_{n+1}$ is as per Figure 2
$y_{n-2} = y_{n-1}$ ; $y_{n-1} = y_n$, $y_n = y_{n+1}$ T=x+5h ; No change
$y_{n+1} = K1*y_n - K2*y_{n-1} + K3*y_{n-2} + K4*h*p_{n+1}$ ; Here, $p_{n+1}$ is as per Figure 2
$y_{n-2} = y_{n-1}$ ; $y_{n-1} = y_n$, $y_n = y_{n+1}$ T=x+6h ; No change
$y_{n+1} = K1*y_n - K2*y_{n-1} + K3*y_{n-2} + K4*h*p_{n+1}$ ; Here, $p_{n+1}$ is as per Figure 2
$y_{n-2} = y_{n-1}$ ; $y_{n-1} = y_n$, $y_n = y_{n+1}$ Time in the future

FIG. 14B

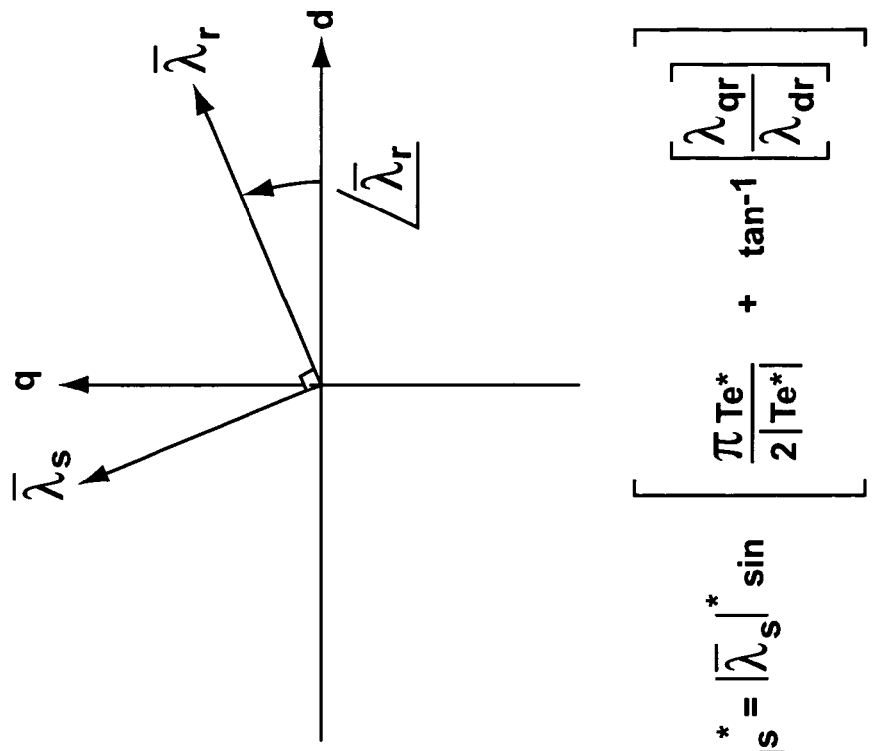

METHOD II - Deriving the Ideal Stator Flux Vector $|\bar{\lambda}_s|^* =$ Not Constant, grows with torque command $\phi =$ Constant 90 degrees $|\bar{\lambda}_s|^* = \left| \dfrac{3\, L_m\, \sigma\, T_e^*}{P\,(1-\sigma)} \right|$ $\sigma = 1 - \dfrac{L_m^2}{L_S L_R}$ $L_S = Lls + Lm$ $L_R = Llr + Lm$ $\lambda_{ds}^* = |\bar{\lambda}_s|^* \cos\left[ \left[ \dfrac{\pi\, T_e^*}{2\,|T_e^*|} \right] + \tan^{-1}\left[ \dfrac{\lambda_{qr}}{\lambda_{dr}} \right] \right]$ $\lambda_{qs}^* = |\bar{\lambda}_s|^* \sin\left[ \left[ \dfrac{\pi\, T_e^*}{2\,|T_e^*|} \right] + \tan^{-1}\left[ \dfrac{\lambda_{qr}}{\lambda_{dr}} \right] \right]$

FIG. 17B

$$\sigma = 1 - \frac{Lm^2}{LsLr}$$

$$Ls = L\ell s + Lm$$

$$Lr = L\ell r + Lm$$

$$\sigma = \frac{(L\ell s + Lm)(L\ell r + Lm) - Lm^2}{(L\ell s + Lm)(L\ell r + Lm)}$$

$$\sigma = \frac{L\ell s L\ell r + LmL\ell s + LmL\ell r + Lm^2 - Lm^2}{(L\ell s + Lm)(L\ell r + Lm)}$$

$$\frac{\sigma}{1-\sigma} = \frac{L\ell s L\ell r + LmL\ell r + L\ell s Lm}{L\ell s L\ell r + LmL\ell s + LmL\ell r + Lm^2 - L\ell s L\ell r - LmL\ell r - L\ell s Lm}$$

$$= \frac{Lm(\frac{L\ell s L\ell r}{Lm} + L\ell r + L\ell s)}{Lm^2}$$

$$\frac{\sigma}{1-\sigma} = \frac{1}{Lm}(\frac{L\ell s L\ell r}{Lm} + L\ell r + L\ell s)$$

$$\frac{3Lm\sigma}{P(1-\sigma)} = \frac{3}{P}[\frac{L\ell s L\ell r}{Lm} + L\ell r + L\ell s]$$

PREDICTIVE CONTROL SYSTEM AND METHOD

CROSS-REFERENCE TO RELATED APPLICATION

This application is a divisional of U.S. patent application Ser. No. 10/370,476, filed on Feb. 24, 2003.

FIELD OF THE INVENTION

This invention relates to a control system and method and more particularly to a control system and method that incorporates predictive techniques for application to a digital switching system.

BACKGROUND OF THE INVENTION

Traditional power electronic control systems using switch-mode principles are typically structured to accommodate the needs of an overall system that include a power circuit (actuator), a power load (plant), and a controller that controls the operation of the power circuit. Many of the overall system elements are non-linear, and possess numerous energy storage elements. Conventional simulation software allows designers to simulate the operation of the overall system so that a particular control system can be verified for proper function prior to construction. However, commercially available simulation software does not take into account all real life effects (e.g. switching delays, and/or interlock delays). Ignoring these effects can substantially affect simulation results.

Further, controllers that are verified using such software cannot be easily modified to take proper account of real life effects. For this reason, standardization of power electronic designs has been difficult to achieve. Systems controller design has evolved to include pre-design capture and simulation which validates the quality of the design before it is built. However, post production revisions to a controller designed using these kinds of pre-design simulation techniques, is generally costly, time consuming and unmanageable, leading to early design obsolescence.

SUMMARY OF THE INVENTION

The present invention in one aspect provides a control system for controlling the operation of a power circuit, the power circuit having N binary switches for one of providing power to and receiving power from a load circuit, the various configurations of the N switches being represented by a finite state machine having up to $2^N$ switch states, the present configuration of the N binary switches being associated with a present switch state and having a plurality of next switch states according to state transition constraints of the finite state machine, the control system comprising:
  (a) an acquisition module for acquiring a set of operational signals related to the load circuit associated with the present switch state;
  (b) an embedded simulator coupled to the acquisition module for estimating a set of estimated operational characteristics of the load circuit based on the set of operational signals and the present switch state;
  (c) a next state contemplator coupled to the embedded simulator for estimating a set of estimated operational characteristics of the load circuit for each of the plurality of next switch states, for comparing and selecting the next switch state having estimated operational characteristics that best meet a first set of criteria, and for actuating the power circuit to change the switch configuration of the N binary switches therein to the switch configuration associated with the next selected switch state of the plurality of next states.

The present invention in another aspect provides a method for controlling the operation of a power circuit, the power circuit having N binary switches for one of providing power to and receiving power from a load circuit, the various configurations of the N switches being represented by a finite state machine having up to $2^N$ switch states, the present configuration of the N binary switches being associated with a present switch state and having a plurality of next switch states according to state transition constraints of the finite state machine, the method comprising the steps:
  (a) acquiring a set of operational signals related to the load circuit;
  (b) estimating a set of estimated operational characteristics based on the set of operational signals and on the present switch state;
  (c) comparing and selecting the next switch state having estimated operational characteristics that best meet a first set of criteria,
  (d) changing the configuration of the N binary switches to the switch configuration associated with the selected next switch state of the plurality of next switch states.

The present invention in another aspect provides a method for determining the voltage provided by a power circuit having N switches in a circuit configuration, where each switch includes a unidirectional current element having a connected node that is coupled to a voltage source and an opposite node, each switch having a present current direction, the method comprising:
  (a) for each switch that opens:
    (i) determining the direction of the present current direction with respect to a free-wheeling current path of the unidirectional current element;
    (ii) if the present current direction is positive with respect to the free-wheeling current path, then the voltage at the opposite node is a determined voltage and is equal to the voltage at the connected node;
    (iii) if the present current direction is negative with respect to the free-wheeling current path, then the voltage at the opposite node is an undetermined voltage; and
  (b) combining the values of all determined voltages present at the opposite nodes of each switch in accordance with the circuit configuration of the power circuit to form a vector representing the voltage provided by the power circuit.

BRIEF DESCRIPTION OF THE DRAWINGS

In the accompanying drawings:

FIGS. 5A and 5A-1 show a block diagram of the control system of FIG. 1 adapted for application to an induction motor;

FIG. 7B is a d-q space plane representation and associated equation relations of the voltage of the power circuit of FIG. 7A;

FIG. 13D is a listing of interlock voltage rules for the power circuit switches of FIG. 5A-1 that are derived in the manner illustrated in FIG. 13C;

FIG. 14B is a listing of calculation statements that illustrate how the main flux predictor/corrector of FIG. 14A utilizes the interlock voltages which are determined by the rules of FIG. 13D along with the voltages determined by the rules of FIG. 7B to compensate for interlock delay;

FIGS. 15 and 15-1 show a schematic diagram of the motor characteristic calculator of FIG. 9;

FIGS. 17A, 17B and 17C illustrate a first and second method of deriving an ideal stator flux vector;

FIGS. 20 and 20-1 show a schematic diagram of four next state choice predictor blocks of the Next State Contemplator of FIG. 5A that correspond to four Next States for a particular Present State as defined by the finite state machine of FIG. 2;

DETAILED DESCRIPTION OF THE INVENTION

Figure 1:
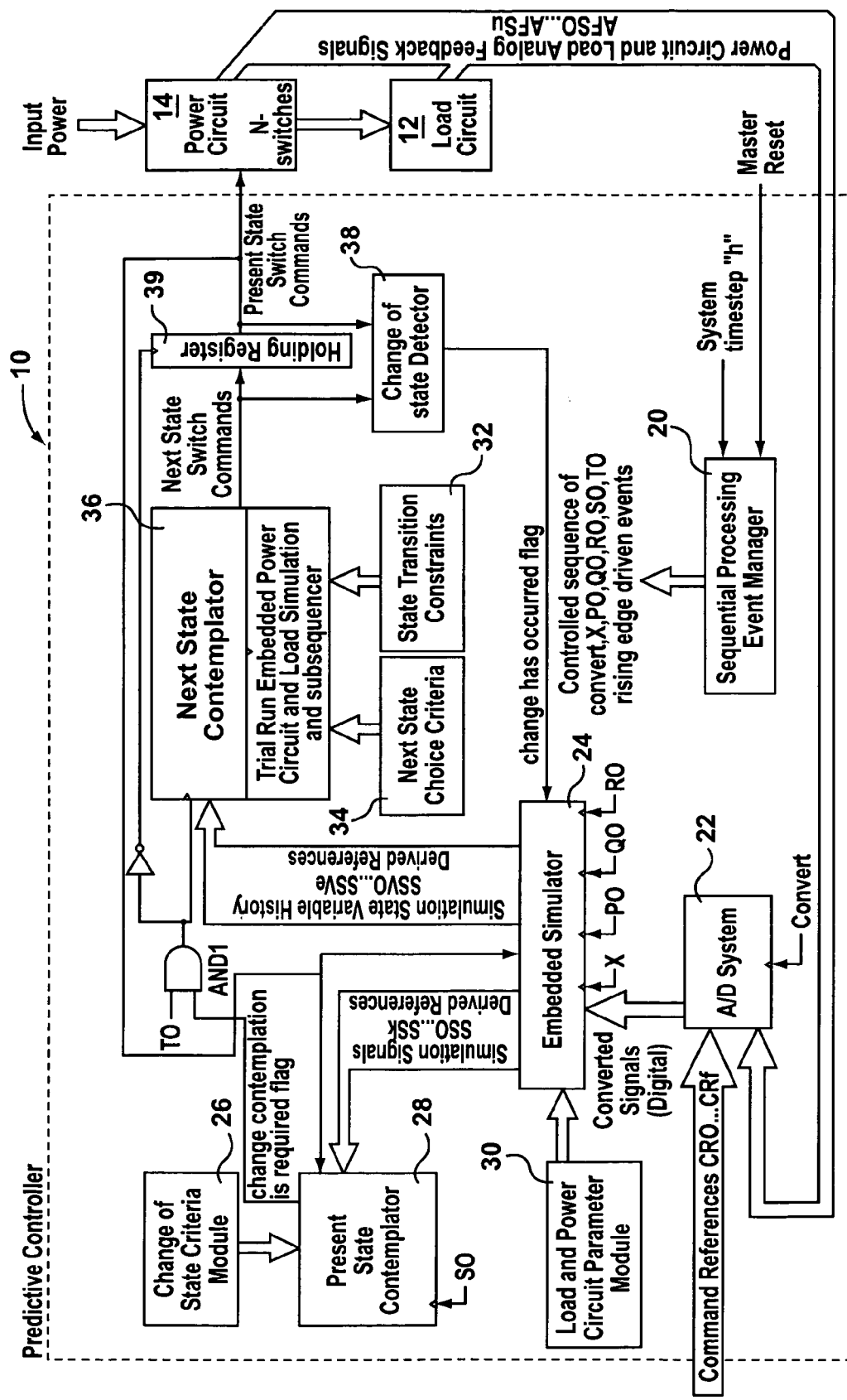
FIG. 1 is a block diagram of a control system according to the present invention.

FIG. 1 is a block diagram illustrating a predictive control system 10, made in accordance with the invention. Control system 10 is designed to control the operation of a switchable power circuit 14 associated with a load circuit 12 using certain analog feedback variables from load circuit 12 as well as the switch configuration of power circuit 14 to achieve real time control on the basis of specified performance criterion. Control system 10 utilizes a finite state machine representation of the various switch states to model and predict the behaviour of load circuit 12 based on various possible switch states of power circuit 14 as switch state transitions are considered. Accordingly, control system 10 simulates real time operation of load circuit 12 in order to predictively select optimal switching states for power circuit 14.

Load circuit 12 can be any device or power process that involves switch-mode power control, such as motor drives, uninterruptible power supplies, corrosion protection systems, DC-DC converters, residential AC inverters, fuel cell power conditioning systems, and plasma controllers.

Power circuit 14 is utilized to affect the operation of load circuit 12 using N binary switches (not shown). These discrete power switches are connected into a power circuit configuration with a unique set of switch states and characteristics (e.g. full bridge inverters, half-bridge inverters, open collector, push-pull topologies etc.) The switches switch between on and off states due to the requirement to control power efficiently (i.e. to minimize losses) while simultaneously achieving some other control function (e.g.

torque control, temperature control, etc.) For each switch, two stable states can be determined (i.e. "on" or "off"). In circuits with multiple (e.g. N) switches, up to $2^N$ states can be defined. Accordingly, the switches of power circuit 14 are switched (i.e. modulated) by control system 10 through a binary data instruction that can consist of up to N-bits, or up to $2^N$ states.

Figure 2:
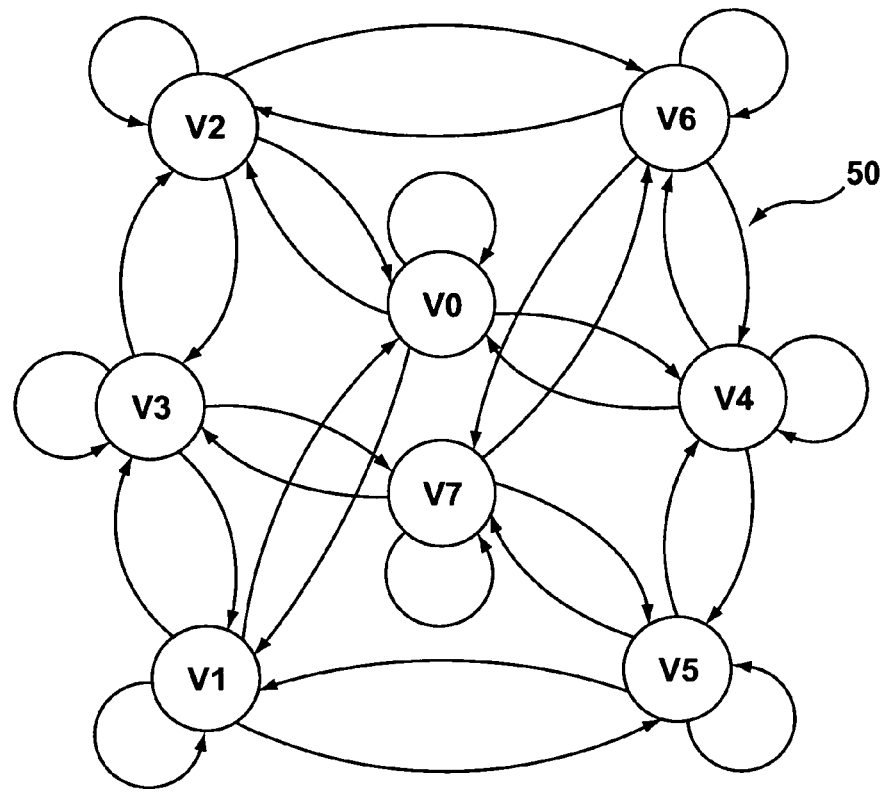
FIG. 2 is an example of a finite state transition diagram that can be utilized by the control system of FIG. 1.

Referring to FIGS. 1 and 2, an example finite state machine 50 and an associated set of transition constraints that is utilized by control system 10 to model the configuration of the switches of power circuit 14 is shown in FIG. 2. Finite state machine 50 represents an exemplary hypothetical power circuit 14 with three binary switches and accordingly with eight possible stable switch states (i.e. states V0 to V7). States in which two complementary switches are closed are not allowed because they constitute a short circuit of the DC bus in this particular example. The states where two complementary switches are open, are allowed but only briefly during the "interlock time". These states are not stable states and are handled and accounted for by the interlock delay compensation technique to be described. Each state of finite state machine 50 represents a "switch state" that can be adopted by power circuit 14 and has a series of associated state variables (i.e. operational characteristics of load circuit 12). The specific set of transition constraints embodied within the exemplary finite state machine 50 ensures that each state has four possible transitions (including the transition of remaining in the same state).

At any time during the course of operation, power circuit 14 (i.e. it's switches) will be in one specific switch state called "Present State". Finite state machine 50 defines a number of states into which power circuit 14 could transition to with one switch transition (i.e. a change of a single binary switch), or possible "Next States". Control system 10 determines the optimal Next State for power circuit 14 on the basis of a number of constraints and sends power circuit 14 a binary instruction to cause power circuit 14 to enter into that optimal Next State.

It should be understood that control system 10 could utilize any type of finite state machine and transition constraints to model a particular set of switch states for a particular power circuit 14. For example, one approach would be to allow any change to occur in which case every state would have a transition to every other state. However, such a rule would involve added complexity and computational expense. Also, such a complex model may result in potentially higher EMI due to an increase in switching events (i.e. since the average switching frequency would have to be increased to achieve similar performance levels as a more discriminating model). However, in certain applications where the criterion for determining a change of state is specialized, these additional switch choices may be advantageous. For example, if complex magnetic saturation characteristics are prevalent in a particular machine design and they are modeled accurately, one possible criterion could be to minimize the di/dt in an effort to minimize magnetic and attendant audible noise and/or hysteresis/eddy current losses. In such a case, in limiting the transitions to one-of-four choices it may still be possible to satisfy this new criterion, but may result in the need for a "higher" effective switching frequency (i.e. average frequency at which the switch state S(x) changes) to accomplish the same task as compared to a rule which allowed "all-of-eight" states to be chosen. The decision to allow all of eight states or only one of four states is contingent on the specific application requirements for control system 10.

Referring back to FIG. 1, control system 10 includes a Sequential Processing Event Manager 20, an optional A/D System 22 (explained further below), an Embedded Simulator 24, a Change of State Criteria Module 26, a Present State Contemplator 28, a Parameter Module 30, a State Transition Constraint Module 32, a Next State Choice Criteria Module 34, a Next State Contemplator 36, and a Change of State Detector 38.

Sequential Processing Event Manager 20 is coupled to all of the functional blocks of control system 10 and coordinates the operation of each block using a set of triggers (i.e. with convert, X, P0, Q0, R0, S0, and T0 triggers as will be described). Control system 10 sequentially executes a number of distinct processes over the course of a system time step "h". Each distinct process involves the operation of one or more of the functional blocks of control system 10. Specifically, on each system time step h, Sequential Processing Event Manager 20 instructs: (1) A/D system 22 to acquire real data from load circuit 12, (2) Embedded Simulator 24 to determine operational characteristics of load circuit 12 based on measured characteristics of load circuit 12 and the switch state of power circuit 14, (3) Present State Contemplator 28 to consider whether the switch state should be changed (according to predefined change of state criteria) and if so, then (4) Next State Contemplator 36 to consider which Next State (i.e. of those switch states reachable from the Present State) would be the optimal one (according to predefined next state choice criteria stored in Next State Choice Criteria Module 34).

A/D system 22 is a conventional A/D sampling converter that samples and simultaneously converts analog real-world variables from the load circuit 12 to discrete-time representation. Conversion of analog real-world variables associated with load circuit 12 into discrete-time form is achieved at a sample rate of 1/h. A/D system 22 is provided with a convert trigger that causes A/D system 22 to perform conversion of incoming variables related to the load circuit 12. It should be understood that any number of analog power circuit and load feedback variables may be acquired and utilized within control system 10 for sampling and conversion by A/D system 22 at sampling interval h.

Figure 5A:
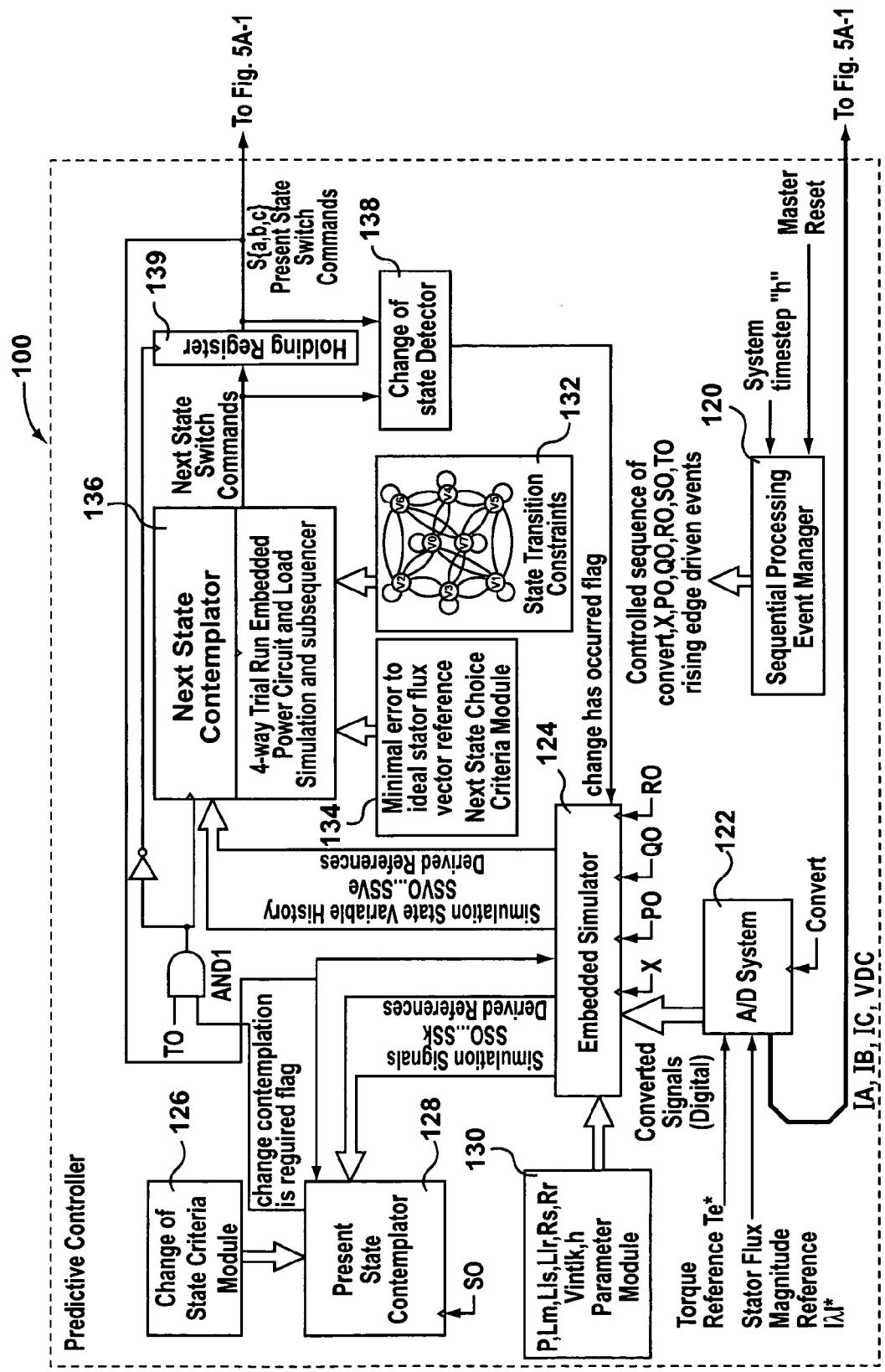
Figures 1, 5A:
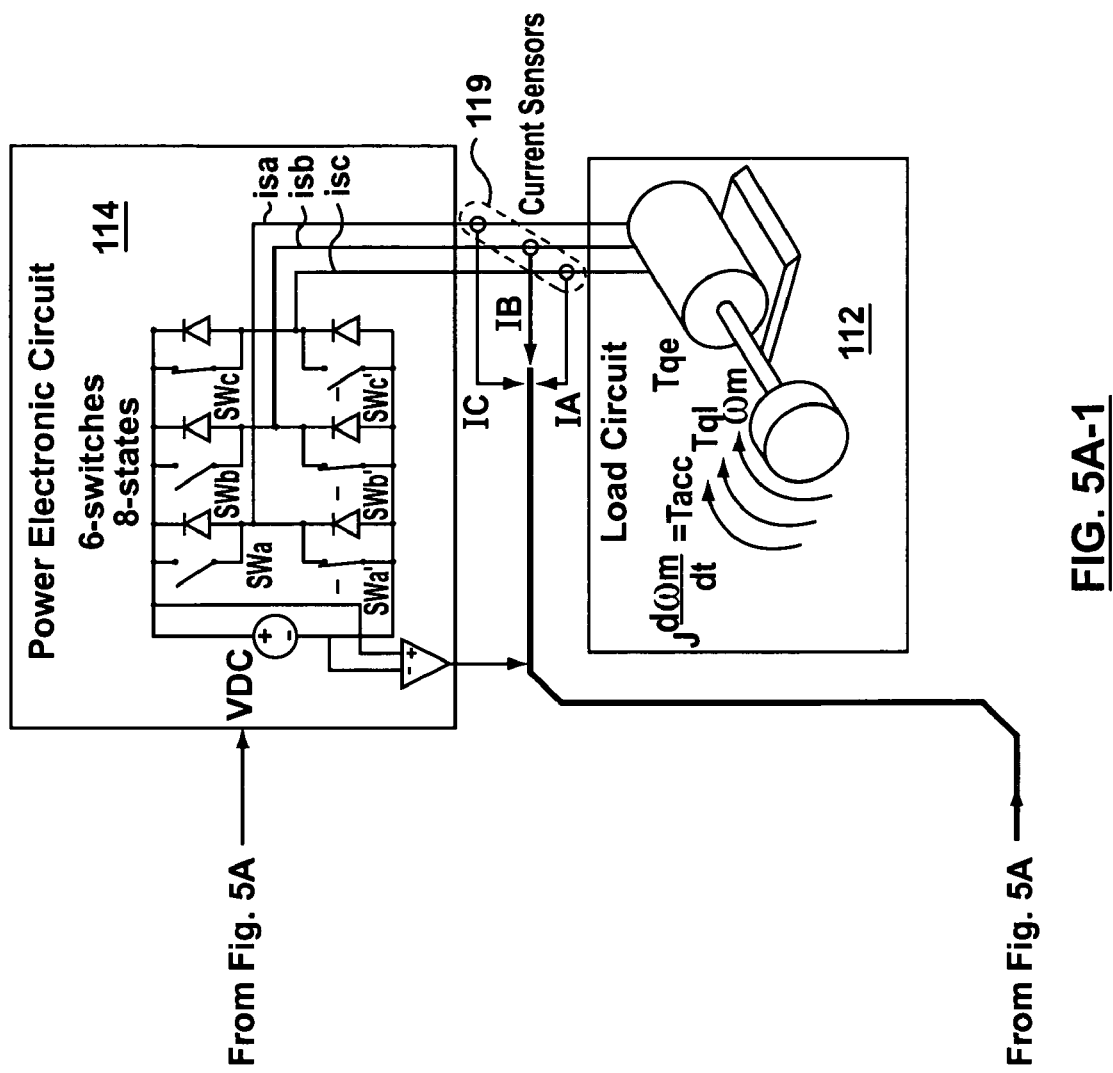
Figure 5B:
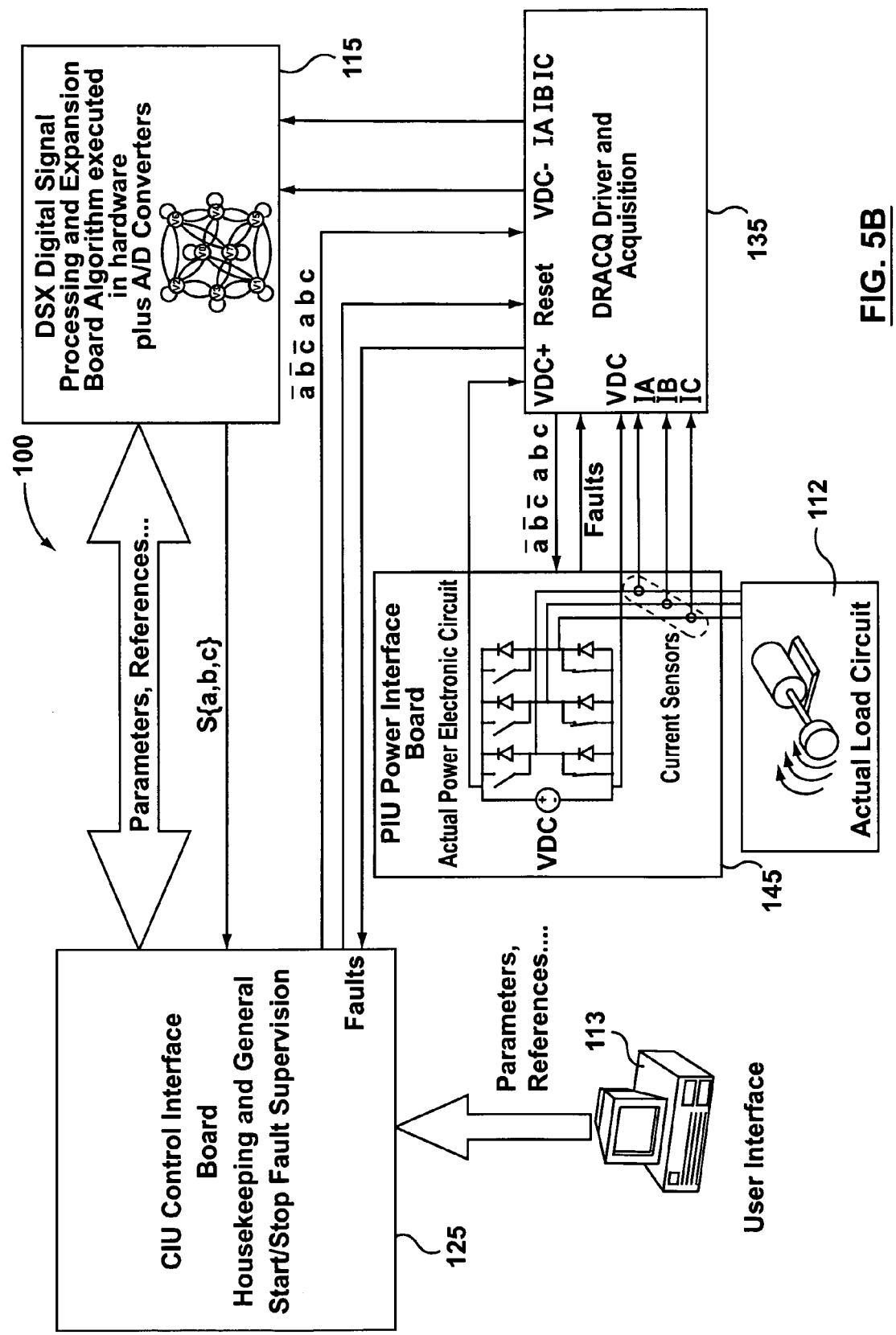
FIG. 5B is a block diagram of the hardware platform that is used to implement the control system of FIG. 1.

In an alternative embodiment, the acquisition module or A/D system 22 does not contain an A/D converter but rather comprises an estimation module with a similar purpose to the A/D converter. In this case, the real-world variables related to the load circuit 12 are estimated accurately enough to preclude the need for physical interface of real-world signals from the load circuit as shown in FIGS. 1, 5A and 5B. With an estimation module, the A/D system 22 no longer requires an external connection to the load circuit 12, but can produce the necessary estimated operational signals related to the load circuit by accurately modeling the load circuit 12 and utilizing mathematical signal processing with appropriate initial conditions. This capability offers significant advantage compared to other prior art closed loop control systems in that it allows the elimination of the A/D converter hardware typically required and produces the benefit of reduced cost and circuit complexity.

Embedded Simulator 24 receives discrete-time representations of analog "real-world" variables associated with load circuit 12 from A/D System 22 as well as load and power circuit parameters and structural details (e.g. component values and interconnections) from Parameter Module 30. Embedded Simulator 24 also maintains a record of the switch configuration of power circuit 14 (i.e. the present switch state). Using all of this information, Embedded Simulator 24 estimates essential operational characteristics of load circuit 12 using discrete time simulation techniques.

Embedded Simulator 24 is triggered by Sequential Processing Event Manager 20 (i.e. with X, P0, Q0, and R0 triggers as will be described) to execute various processing steps within every h-cycle. Embedded Simulator 24 provides simulation signals and other derived references to Present State Contemplator 28 and simulation signals and other derived references to Next State Contemplator 36.

Change of State Criteria Module 26 stores and provides a set of rules that determine the conditions under which a change of state is contemplated (i.e. a change in switch configuration of power circuit 14 to transition from Present State to a particular Next State which in the case of the example shown in FIG. 2 is one switch transition away from the Present State but which is generally, not necessarily, one switch transition away from the Present State). It is important to note that Change of State Criteria Module 26 only determines if a switch change should be considered, not that it will actually occur.

Present State Contemplator 28 receives simulated and derived motor model values from Embedded Simulator 24 and generates a binary change of contemplation is required flag (i.e. "YES" or "NO") which is forwarded back to Embedded Simulator 24 and to Next State Contemplator 36 every h-cycle. When suitably triggered by Sequential Processing Event Manager 20 (i.e. by S0 trigger as will be described), Present State Contemplator 28 uses the rules as stored in Change of State Criteria Module 26 along with the real-time and/or derived information from Embedded Simulator 24 to determine whether a change of switch state should be contemplated for a particular Present State. If so then Present State Contemplator 28 provides a positive (i.e. "YES") change of contemplation is required flag to Next State Contemplator 36.

Parameter Module 30 is utilized to provide Embedded Simulator 24 with the specific load circuit 12 and power circuit 14 parameters and structural details that define the specific components of load circuit 12 and power circuit 14 (e.g. inductor, capacitors, resistors and their values, as well as details on their interconnections and performance functionality). This information is necessary for Embedded Simulator 24 to properly model load circuit 12 and power circuit 14.

State Transition Constraints Module 32 contains data that specifies the available transition vectors between the various switch states (e.g. the structure of finite state machine 50 of FIG. 2) adopted by the switches of power circuit 14.

Next State Choice Criterion Module 34 contains Next State Choice Criteria that constitutes a set of acceptance criteria and analysis methods that are used to select an optimal Next State for transition from a particular Present State. This information allows Next State Contemplator 36 to evaluate the expected performance of power circuit 14 and load circuit 12, for each of the proposed Next States from a particular Present State.

Next State Contemplator 36 receives motor model simulation and derived results from Embedded Simulator 24 and the change contemplation is required flag from Present State Contemplator 28 and provides a next state switch command to a holding register 39 which in turn forwards the next state switch commands to power circuit 14. Next State Contemplator 36 also provides the next state switch command to Change of State Detector 38 which will then forward Next State information to Embedded Simulator 24. When suitably triggered by Sequential Processing Event Manager 20 (i.e. by T0 trigger as will be described), Next State Contemplator 36 determines the Next State that best meets the Next State Choice Criteria as stored in the Next State Choice Criteria Module 34. This is achieved by, based on the Present State, determining the available Next State as defined by State Transition Constraints Module 32 (e.g. the finite state machine 50), simulating the result of adopting each possible Next State, and calculating which result is the best result in view of the Next State Choice Criteria.

For each possible Next State, Next State Contemplator 36 conducts a number of "trial run" simulations with system time step "h" for each possible Next State to produce a prediction of the conditions associated with each. As previously mentioned, it is possible that one possible state transition action is to simply remain in the same state. Accordingly, a "trial run" simulation with system time step "h" is also conducted for the Present State. Using the Next State Choice Criteria contained in Next State Criteria Module 34, the results of each "trial run" is compared to determine the "best" choice transition, which is then actuated in real time as the new Present State switch commands provided to power circuit 14 through holding register 39.

As mentioned, Change of State Detector 38 is utilized to detect when a change of state has occurred (i.e. when the Next State is determined to be different from the Present State) and to send a positive (i.e. "YES") change has occurred flag to Embedded Simulator 24 when it has. This allows Embedded Simulator 24 to execute subsequent internal process steps to maintain proper simulation of the operational characteristics of load circuit 12 (e.g. compensation of switch interlock delays etc.)

Accordingly, control system 10 utilizes a simulation model (i.e. constructed by Embedded Simulator 24) of power circuit 14 and load circuit 12 to select an optimal Next State for the discrete switches of power circuit 14 based on the Present State and on certain Change of State criterion (i.e. maintained in Change of State Criteria Module 26) used in conjunction with Next State Choice criterion (i.e. maintained in Next State Choice Criteria Module 34). The finite state machine 50 stored within State Transition Constraints Module 32 defines a series of Next States for each Present State that are evaluated by control system 10 to ensure optimal switch changes are selected.

Specifically, Present State Contemplator 28 determines based on the Present State and the Change of State Criteria Module 26 whether Next State Contemplator 36 should consider a change of state. If so, then the change contemplation is required flag is provided to Next State Contemplator 36 that then in turn runs a series of "trial-runs" for the various potential Next States. Based on the Present State, Next State Choice Criteria 34 and real time analog feedback of variables in the power circuit 14 and load circuit 12, Next State Contemplator 36 determines an optimal Next State. Finally, control system 10 provides power circuit 14 with a binary present state switch command that can consist of up to N-bits, or $2^N$ states. The minimum time for a Present State to enter a Next State (i.e. a change of state) is a system time step "h", which depends on the performance of the implementation technology (i.e. the processing speed of the implanted hardware). It should be understood that since control system 10 is based on the above-noted "h-step" implementation, control system 10 is scalable and transportable between various implementation platforms. For example, in a first implementation environment, h may be limited to 60 microseconds. However, in a second implementation environment which is able to support 30 microsecond processing, control system 10 could operate at a higher level of performance, or alternately two simultaneous implementations of control system 10 could be supported, each with acceptable performance (i.e. equivalent to that of the control system 10 operating within the first implementation environment). It should be understood that the second implementation may have attendant cost savings as a result of combining two systems on one hardware platform.

Figure 3:
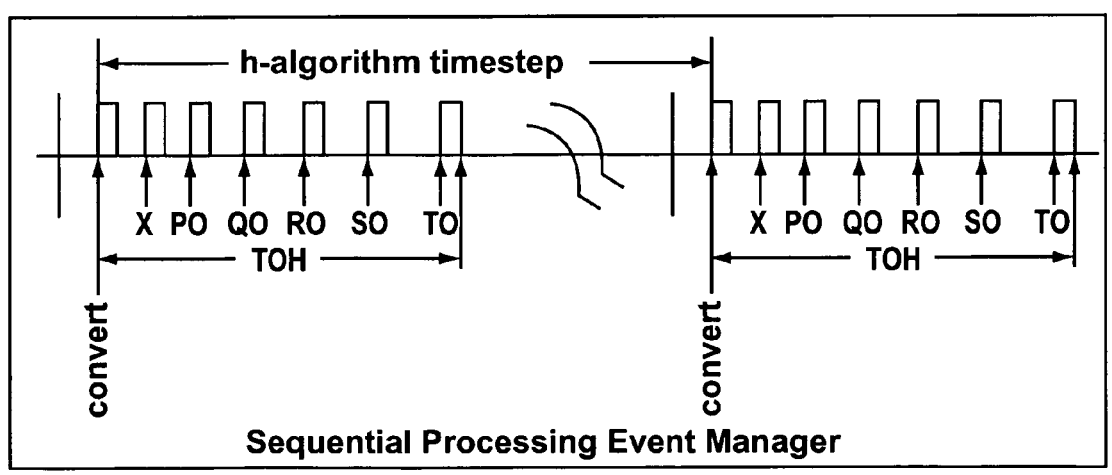
FIG. 3 is a time event diagram illustrating the steps executed by the sequential processing event manager of the control system of FIG. 1.

FIG. 3 is a timing diagram which illustrates the specific sequence of events that are driven by Sequential Processing Event Manager 20 and executed by A/D system 22, Embedded Simulator 24, Present State Contemplator 28 and Next State Contemplator 36 during each time interval h. Specifically, the events are convert, X, P0, Q0, R0, S0, and T0 and are each triggered upon the rising edge of the corresponding trigger. When an event is triggered, a set of sequences within the various functional blocks of control system 10 is executed. The time TOH (FIG. 3) represents the processing time overhead of the event sequence and is preferably small relative to the time step h.

Figure 4:
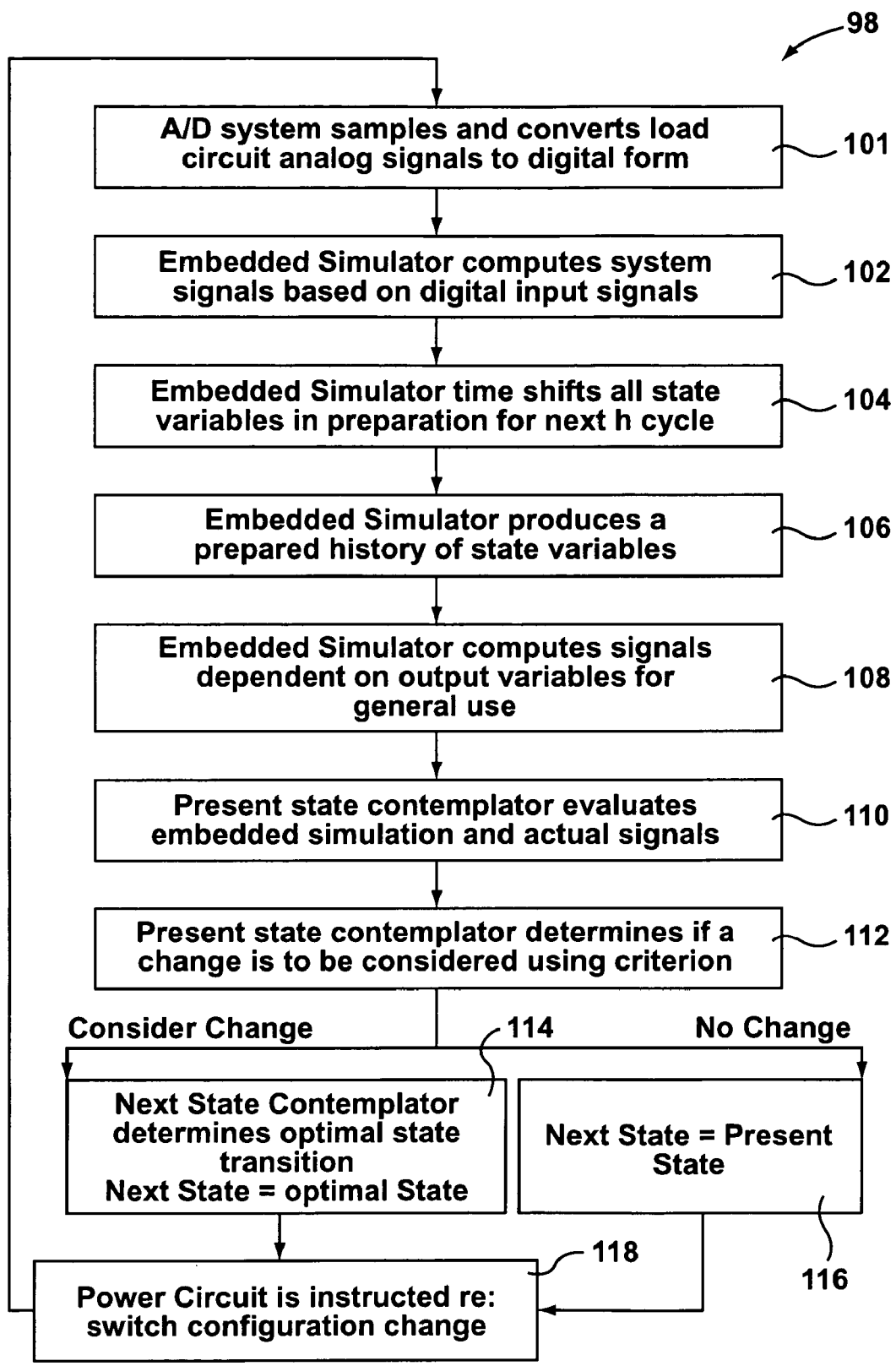
FIG. 4 is a flowchart illustrating the steps taken by the control system when controlling the load circuit of FIG. 1.

FIG. 4 is a flowchart illustrating the steps 98 taken by control system 10 when controlling the load circuit 12 of FIG. 1, according to the present invention.

At step 101, A/D System 22 is initiated by the rising edge of convert trigger (see FIG. 3) to sample and convert the input analog feedback signals received from load circuit 12. The converted discrete-time variables are then provided to Embedded Simulator 24. At step 102, the X trigger (see FIG. 3) causes Embedded Simulator 24 to calculate all related variables that depend on the converted discrete-time variables so that various state variables (i.e. variables associated with the various switch states) are estimated for the Present State switch configuration of power circuit 14.

At step 104, the P0 trigger causes Embedded Simulator 24 to time shift all state variables in preparation for the next time step h-cycle. The convert, X, and P0 triggers repeated at the beginning of every system time step "h", effectively produces an internal free-running simulation of power circuit 14 and load circuit 12 so that their real world operation can be tracked. Judicious choice of analog feedback variables and the simulation engine structure ensure that the internal model remains in step with the external "actual" system.

At step 106, the Q0 trigger causes Embedded Simulator 24 to generate a history of the state variables for use by Next State Contemplator 36. This history is effectively a pre-load of registers whose history is utilized by the main flux predictor/corrector module of Next State Contemplator 36 to estimate the main flux of load circuit 12 as will be described in more detail. At step 108, the R0 trigger causes Embedded Simulator 24 to compute system variables that are dependent on output variables for general use by Present State Contemplator 28 and Next State Contemplator 36.

At step 110, the S0 trigger causes Present State Contemplator 28 to evaluate the embedded simulation and actual variable conditions according to a specific set of criterion stored in Change of State Criteria Module 26. At step 112, Present State Contemplator 28 decides whether or not a change of switch state should be contemplated. If a change is not to be contemplated then at step 116, Next State is simply equated to the Present State.

However, if a change of switch state is to be contemplated then at step 114, Present State Contemplator 28 outputs a change of state contemplation required flag. Once the T0 trigger occurs, the presence of an active change of state contemplation required flag and the T0 flag causes AND gate AND1 to trigger Next State Contemplator 36. Once triggered, Next State Contemplator Module 36 utilizes the Next State choice criterion stored in Next State Choice Criteria Module 34 to select an optimal Next State. It should be understood that Next State Contemplator 36 may also elect to stay in the same switch state (which is considered one of the Next States for evaluation purposes). This approach is especially important to efficient operation of load circuit 12 since it is entirely possible that the best choice among other available choices is to make no change at all.

At step 118, the present state switch command is sent to power circuit 14 to activate power circuit 14 to cause the power circuit switches to switch as necessary to assume the necessary switch configuration for the selected Next State.

The Next State choice criterion is designed to minimize or optimize some aspect of operation. Next State Choice Criterion Module 34 and Change of State Criterion Module 26 are often related, but do not have to be the same. Also, the Next State choice criterion can be the same or different for every switch state. Typically, Next State choice criterion is the same for every state as most power circuits are intended to operate symmetrically with all switches being utilized equally, but this is not necessarily the case. While in the most general case, when any Present State is active, the Next State could be any one of the various states, Next State Contemplator 36 preferably accepts a set of State Transition Constraints 32. In this situation, the set of state transition constraints is defined as a finite state machine (i.e. 50 in FIG. 2) where all states can be reached from any Present State within several h-cycles.

A properly chosen set of state transition constraints can be advantageous, especially if several sequences are more desirable than others (for example to minimize EMI), or if there is statistical knowledge that suggests that certain state transitions are less probable than others. State transition constraints also provide a way to use probability to favor certain sequences of operation in the presence of noise or other uncertainty. When Next State Contemplator 36 makes a decision to "change" from the Present State to a Next State, Change of State Detector 38 communicates this information back to the Embedded Simulator 24 using the change has occurred flag. The change has occurred flag includes an indication of the Next State and Embedded Simulator 24 uses this to update its motor model and associated state variables.

FIG. 5A is a block diagram of a predictive control system 100 based on the control system 10 of FIG. 1, applied to control an induction motor 112 through a conventional power circuit 114. Control system 100 provides torque control over a wide range including zero shaft speed by directly controlling the stator flux and torque of induction motor 112. Finite state machine 50 of FIG. 2 is utilized within control system 100 as will be described. Common elements between control system 100 and control system 10 will be denoted by the same numerals but with one hundred added thereto.

Induction motor 112 is implemented using a Marathon Black Max 10 HP, 575 Volt Model number 6E215THTL7736BBL unit (Marathon Electric Corporation of Wisconsin) with National Electrical Manufacturers Association (NEMA) standard industry parameters as follows:

Xm=54.6 ohms, Xls=Xm=54.6 ohm, Xlr=3.56 ohm, based on rated frequency

Rr=0.528 ohm, Rs=0.577 ohm; rated rpm=1774 rpm@ rated frequency=60 Hz, rated voltage=575 Vrms and Full load Amps=10.8

A torque cell, namely a Model T36-1000 inch-pound torque sensor SensorData Model T360 (manufactured by SensorData Technologies Inc. of Michigan) was mounted on the shaft of induction motor 112 to measure motoring and regenerative torques. A Daytronic Model 3170 strain gauge amplifier (manufactured by Daytronic Corporation of Ohio) was used to produce actual torque signals. It should be understood that any type of motor could be controlled within control system 100 (e.g. permanent magnet type).

Power circuit 114 is a conventional three-phase inverter, namely Part No. SkiiP83AC12i (manufactured by Semikron Corporation of Germany) based on the standard six-switch inverter configuration (also known as a three-phase H bridge configuration). The particular types of power switches used were mini-SkiiP™ insulated gate bipolar transistors (IGBT) (manufactured by Semikron Corporation of Germany). However, it should be understood that any kind of switch type could be used within power circuit 114 as long as the switch operational characteristics are suitable to allow appropriate interface and control of induction motor 112. Each switch transistor is driven with the HP 316J integrated driver chip and associated circuitry (manufactured by Hewlett Packard of California).

FIG. 5B is a block diagram of the hardware configuration utilized to implement control system 100. As shown control system 100 is implemented using a combination of conventionally known hardware and software components including a Digital Signal Processing and Expansion (DSX) board 115, a Control interface Unit (CIU) board 125, a Driver Acquisition (DRACQ) board 135, and a Power Interface Unit (PIU) board 145. Alternatively, a board or integrated circuit can be used which provides all of the functionality that is provided by the DSX board 115, the CIU 125, the DRACQ 135 and the PIU 145.

Referring to FIGS. 5A and 5B, Digital Signal Processing and Expansion (DSX) board 115 contains the main computing platform for control system 100. DSX board 115 contains a SHARC ADSP-21061K5133 digital signal processor (DSP) integrated circuit (manufactured by Analog Devices of Boston, Mass.) that is used to process all software code associated with control system 100. The software is written in the C++ computer language and was compiled using the GNU compiler for the SHARC (Super Harvard Architecture) processor series. Referring to FIG. 5A, Change of State Criteria Module 126, Present State Contemplator 128, Next State Contemplator 136, Change of State Detector 138, State Transition Constraints 132, Sequential Processing Event Manager 120, Next State Choice Criteria 134, and Embedded Simulator 124 are all implemented in software to execute every 60 µs (i.e. system time step h-60 µs), using a programmed interrupt method. The DSP has a benchmark processing rating of 150 Million Floating Point Operations per second (MFLOPs). DSX 115 also includes A/D System 122 implementation hardware.

Control interface Unit (CIU) board 125 contains an Intel 80C196KC micro-controller that is used as a host processor to allow for housekeeping and protective functions and to facilitate communication with the DSP of DSX 115. This host processor also manages power supplies and other functions required for power circuit 114. CIU 125 also provides a low level fixed parameter interface capability such as is required to implement Parameter Module 130, through which the floating point parameter variables can be specified. Other system variables (e.g. torque and stator flux reference signals) are also inputted into various system blocks through the host processor.

The Driver Acquisition (DRACQ) 135 board includes current sensors circuitry and a DC bus voltage sensing circuit assembled on it, and the signals are scaled and sent through to the DSX board for analog-to digital conversion.

Each on/off switch logic command a, b, c, $\bar{a}$, $\bar{b}$, $\bar{c}$ (see FIG. 5B) for switches of power circuit 114 (Swa,SWb,SWc,Swa', SWb',SWc') is produced by the DSP of DSX 115. Phase A is comprised of switches SWa, and SWa' respectively. Phase B is comprised of switches SWb, and SWb' respectively. Phase C is comprised of switches SWc, and SWc' respectively. The switch command signals are fed through a digital field programmable gate array (FPGA) state machine and interlock logic circuitry is used to generate a hardware based 4 µs interlock delay for each gate command for phases A, B, C in the gating train. Accordingly, six actual gating commands represented by a, b, c, $\bar{a}$, $\bar{b}$, $\bar{c}$, are produced and fed to the six switches SWa, SWb, SWc, SWa', SWb', SWc'. These six commands are passed on to the DRACQ driver board that houses the HP 316J driver chips. This separation is necessary for noise and high voltage management. The 4 µs interlock delay is the time that is incorporated within the operational steps to compensate for the actual physical effect of the hardware interlock delay, as will be further described.

The Power Interface Unit (PIU) board 145 includes an industry standard six-diode bridge front-end using a SkiiP83AHB15 component (manufactured by Semikron Corporation of Germany). The PIU 145 also contains the insulated gate bipolar transistors (IGBT) power switches and DC bus components namely an LC circuit with 1200 uF capacitor and 2 mH inductors and provides all interconnections necessary to produce a working three-phase six-switch H-bridge voltage source inverter. Current sensors for detection of each phase current are implemented using two (or optionally three) Hall-effect sensors LA-100P (manufactured by LEM Corporation of Switzerland). Accurate current sensors are important (especially at low speed) because all system signal computation is solely derived from these signals and the DC bus voltage (VDC).

It is also important to note that compared to typical prior art systems which need to directly measure the inverter output voltage, control system 100 does not need to measure the actual high voltage, high frequency excursions that exist in the output phases of power circuit 114 to acquire the information necessary to produce the main flux information. In contrast, the real world pulse-width modulation signals are effectively re-constructed by control system 100 using the switch state commands, VDC, and the h-step process. In this way, control system 100 does not require expensive high performance, high bandwidth, and high DC precision voltage measurement devices for proper operation. This benefit is particularly important at very low speed where the number of switching excursions per second is high and the average voltage produced by the switching is very low, and where the low speed flux must be determined with maximum precision. Finally, it should be noted that since the DC bus voltage VDC is a relatively stable signal, the accuracy of the voltage VDC is not as important as the accuracy of measurements for the phase currents. Communication between the host processor and the DSP communication is achieved through a memory mapped Direct Memory Access (DMA) bus structure which is a typical and common implementation for systems such as this.

It should be noted that the above-discussed implementation of A/D System 122 in this first implementation is relatively slow (20 µs) and has low resolution (10-bit). In spite of these technical limitations, the inventors have determined that control system 100 performs favourably in spite of the shortcomings (e.g. low speed and low resolution) of A/D System 122. Technological developments in digital signal processing (DSP) currently provide for 600 Million Floating Point Operations per second (MFLOP) capability (vs. the 150 MFLOP used by the above implementation of control system 100). Additional internal computational improvements increase computational throughput eight times over the current 60 µs system. This can result in an overall reduction from 40 µs to 5 µs, allowing next generation implementation of control system 100 to operate at an overall processing rate of 20 µs. Recent developments in A/D technology also suggest that 10 µs conversion rates can also be achieved with 14-bit resolution. Conventional state-of-the art motor drives using DSP and A/D systems currently require 12-bit resolution, and 20 µs processing time. Finally, it should be understood that despite the extensive use of Digital Signal Processing (DSP) techniques, control system 100 does not have to be implemented using DSP style processing. Analog techniques using multipliers, adders, integrators and switched capacitor structures could be utilized with a dedicated state-driven sequencer used to perform the step-by-step computation of control system 100.

Figure 6A:
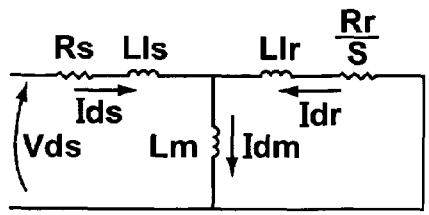
FIGS. 6A and 6B are schematic diagrams of the d and q axis equivalent circuit representation of the induction motor of FIG. 5A-1.
Figure 6B:
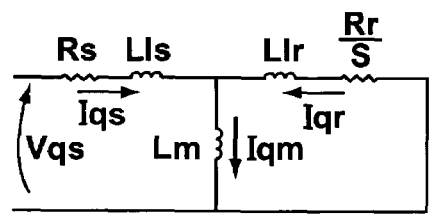

FIGS. 6A and 6B illustrate the conventionally accepted direct and quadrature axis representation of a per-phase equivalent circuit induction motor model for induction motor 112, respectively. As is conventionally known, the direct and quadrature model (d-q model) can be utilized to represent the internal characteristics for any type of motor according to the principles of general electric machine theory. During operation of induction motor 112, these variables vary simultaneously in space and time within the confines of the structure of the machine, and can be represented as vectors consisting of direct and quadrature components (i.e. in d-q space), defined relative to any arbitrary spatial frame of reference.

The reference frame can be fixed, or rotating as desired. In the case of rotating, the datum reference of FIG. 7B would be rotating attached to some vectorial variable of interest (the variables a, b, c, $\bar{a}$, $\bar{b}$, $\bar{c}$ represent whether the switches SWa, SWb, SWc, SWa', SWb' and SWc' are opened or closed). Since any vector in the d-q space can be represented as a direct vector and a quadrature vector sum, all calculations within this control system are based on this d-q relationship. It should be understood that for induction motor 112, the frame of reference to which the d-q frame of FIG. 7B is attached, is the stationary frame, which is physically stationary with respect to the motor's physical body. It should also be understood however, that any other frame of reference could be chosen and the principles of control system 100 would remain intact, ensuring applicability of control system 100 to any and all machines obeying the basic rules of general machine theory.

Control system 100 utilizes the motor characteristics $I_A$, $I_B$, $I_C$, and $V_{DC}$, where $I_A$, $I_B$, $I_C$ are the currents detected by current sensor 119 (FIG. 5A-1) that represent the actual phase A, B, and C currents $I_{sa}$, $I_{sb}$, $I_{sc}$ being sensed within induction motor 112 and where VDC is the DC bus voltage of power circuit 114. Fluxes in the machine are represented as the outputs of four integrators in the form of state variables. The induction motor model utilized by control system 100 can be described as a fourth order, non-linear, cross-coupled set of relations. Control system 100 is designed to control the torque and flux of induction motor 112 without the use of a shaft sensor (i.e. using sensorless control techniques). Also, control system 100 is designed to maintain de-coupled control of flux and torque of induction motor 112. Secondary goals are to achieve this control with the lowest switching activity possible, while meeting an "adjustable" criterion of torque and stator flux ripple, and doing so using a system time step "h" that is less than or equal to $h_{min}$, the smallest step-size that is practical for implementing the processing and data acquisition within available control technology.

Figure 7A:
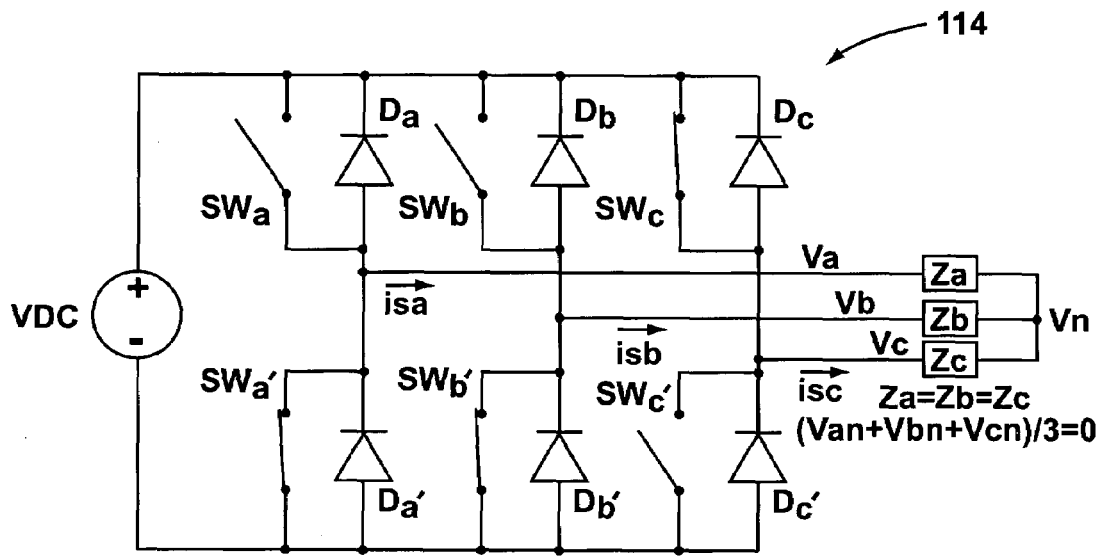
FIG. 7A is a schematic diagram of a standard three-phase voltage source inverter power circuit utilized within the control system of FIG. 5.

FIG. 7A is a schematic diagram of a conventional motor drive power circuit 114 that consists of a voltage source inverter circuit having a DC link energy source $V_{DC}$. Power circuit 114 has three-power poles (i.e. a pole is two complementary switches). The three phase output wires carrying voltages $V_a$, $V_b$, $V_c$ are connected to three phase induction motor 112 as is conventionally known. Power circuit 114 is comprised of six power switches SWa, SWb, SWc, SWa', SWb', and SWc'. It is customary to convert the three phase system of power circuit 114 into a d-q axis representation as shown in FIG. 7B. The allowable voltage state vectors which may be produced by switches SWa, SWb, SWc, SWa', SWb', and SWc' produce the associated d-q axis model voltages shown. These are the voltages that are effectively applied to the line-neutral winding of induction motor 112 for any state. Control system 100 is responsible for switching the six switches SWa, SWb, SWc, SWa', SWb', and SWc' to achieve torque and/or speed control of induction motor 112. It should be understood that control system 100 can be altered to accommodate motors with non-standard floating neutral connections (or other types of connections) by using a different model of the motor and by appropriately modifying d-q voltage relations.

Figure 8:
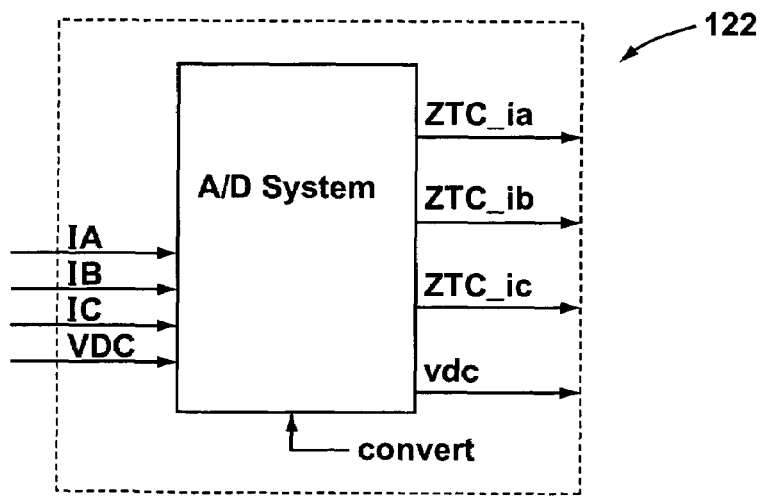
FIG. 8 is a block diagram of the A/D system of the control system of FIG. 5A.

FIG. 8 is a block diagram of the A/D System 122 of control system 100 of FIG. 5A. When A/D system 122 receives the convert trigger from Sequential Processing Event Manager 120, A/D System 122 samples and converts analog real-world variables $I_A$, $I_B$, $I_C$, and $V_{DC}$ obtained from induction motor 112 to discrete-time representation ZTC_$i_a$, ZTC_$i_b$, ZTC_$i_c$ and $v_{dc}$ as shown at a sample rate of 1/h. It should be understood that it is possible for control system 100 to operate only with two of the three real-world current variables, as will be described. A/D System 122 is implemented using a dedicated 10-bit A/D converter hardware based system built using a combination of field programmable gate array (FPGA) based sequential digital electronics, as well as an analog-to-digital converter HCPL-0870, HP-7860 integrated circuit set (manufactured by Hewlett Packard of California). Analog signals IA, IB, and IC (provision of signal IB is optional) as well as VDC are sampled and converted to discrete-time form every 60 µs using a 60 µs interrupt that is generated internally from the DSP chip. The inventor has determined that when such an A/D system 122 is used, Sequential Processing Event Manager 120 completes an event sequence (i.e. sends out convert to T0 triggers) with a processing bottleneck of at least 20 µs. Since the minimum algorithm execution speed is 60 µs (including A/D conversion time), the overall processing is accomplished in approximately 40 µs.

Figure 9:
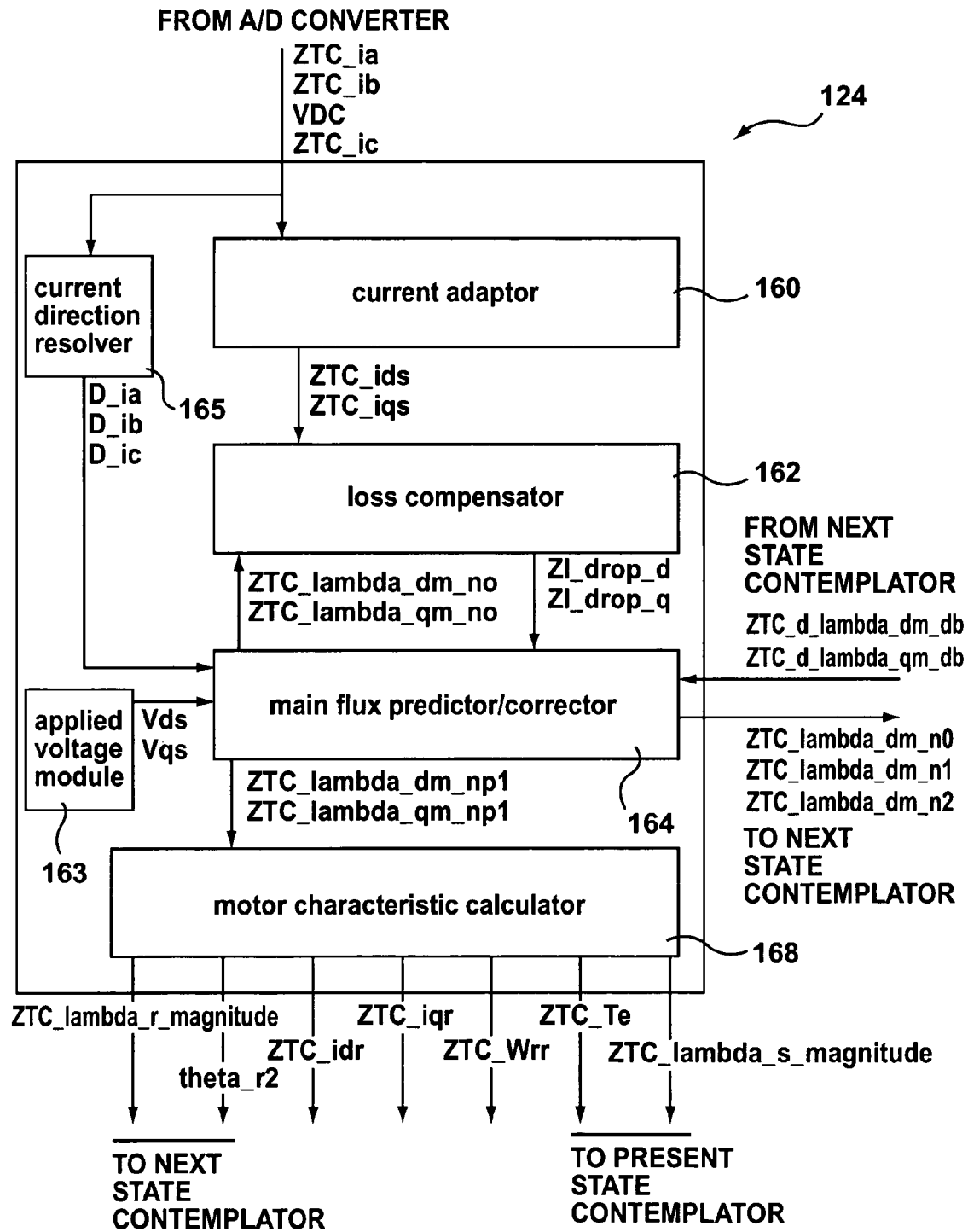
FIG. 9 is a block diagram of the embedded simulator of FIG. 5A showing a number of individual functional blocks.

FIG. 9 is a block diagram showing a number of the functional blocks of Embedded Simulator 124, namely, current adaptor 160, loss compensator 162, main flux predictor/corrector 164, and motor characteristic calculator 168. Current adaptor 160 is provided with the discrete-time variables ZTC_ia ZTC_ib and ZTC_ic as well as VDC from A/D System 122 and provides loss compensator 162 with variables ZTC_ids and ZTC_iqs that represent the d-q axis values of stator current. Loss compensator 162 also receives the variables ZTC_lambda_dm_n0 and ZTC_lambda_qm_n0 which represent the d and q axis values of estimated stator flux from main flux predictor/corrector 164. Loss compensator 162 as shown in FIG. 11B, integrates the d and q axis values of stator current (i.e. ZTC_ids and ZTC_iqs) and then introduces a multiplier (Kloss) to adjust the d and q axis values of stator current in the presence of magnetic and other losses to generate variables ZI_drop_d and ZI_drop_q that represent the d and q axis values of the combined effect of stator leakage voltage drop and resistive voltage drop associated with other losses within induction motor 112, as will be described. Loss compensator 162 as shown in FIG. 11B also calculates the magnitude of the stator current ZTC_is_magnitude which is a scalable motor characteristics that is conventionally used to detect overload of motor. Control system 100 may use variable ZTC_is_ magnitude for such a purpose, while many other uses are possible as well.

Main flux predictor/corrector 164 receives variables ZI_drop_d and ZI_drop_q from loss compensator 162 and variables ZTC_lambda_dm_db and ZTC_lambda_qm_db (which represent the d and q axis stator voltage during the interlock period, as will be described) from Next State Contemplator 136. Main flux predictor/corrector 164 also receives variables vds and vqs from applied voltage module 163 which generates the d and q component of stator voltage (i.e. the voltage applied to the line neutral) based on the switch configuration of power circuit 114 (see FIGS. 7A and 7B). Main flux predictor/corrector 164 generates the variables ZTC_lambda_dm_n0 and ZTC_lambda_qm_n0 for use by loss compensator 162, as discussed above. Finally, main flux predictor/corrector 164 also generates variables ZTC_lambda_dm_np1 and ZTC_lambda_qm_np1 which represents a d and q axis representation of main flux linkage $\lambda m$. Note that variables with the suffix np1 are next h-step predicted values. Variables with suffix n0 are the present time values. Variables with the suffix n1 are values of samples determined one h-step in the past. Variables with the suffix n2 are values of samples determined two h-steps in the past. The np1,n0,n1,n2 nomenclature corresponds to the yn+1,yn,yn−1,yn−2 nomenclature of FIG. 14B which describes the predictor/corrector process. In particular ZTC_lambda_dm_n0 and ZTC_lambda_dm_np1 are related samples in time according to this nomenclature as are ZTC_lambda_qm_n0 and ZTC_lambda_qm_np1 and provides them to motor characteristic calculator 168. Main flux predictor/corrector 164 also stores a history of variables that represent present, last, and last last estimated samples of main flux linkage $\lambda m$ and these variables are provided to Next State Contemplator 136. Finally, motor characteristic calculator 168 uses well known relations between main flux linkage $\lambda m$ and various motor model characteristics to calculate a number of motor model representative variables, namely, ZTC_idr, ZTC_iqr (represents d and q axis rotor current), ZTC_Wrr (represents an estimate of the rotor mechanical instantaneous angular velocity or speed), ZTC_Te (represents the estimated electrical torque at Present State), theta_r2 (represents the present estimated sample of rotor flux angle), ZTC_lambda_magnitude, ZTC_lambda_s_magnitude (represents the present estimated sample of the rotor and stator flux length, respectively). Certain of these representative motor model variables are provided to Next State Contemplator 136 and certain others are provided to Present State Contemplator 128, as will be discussed.

Figure 10:
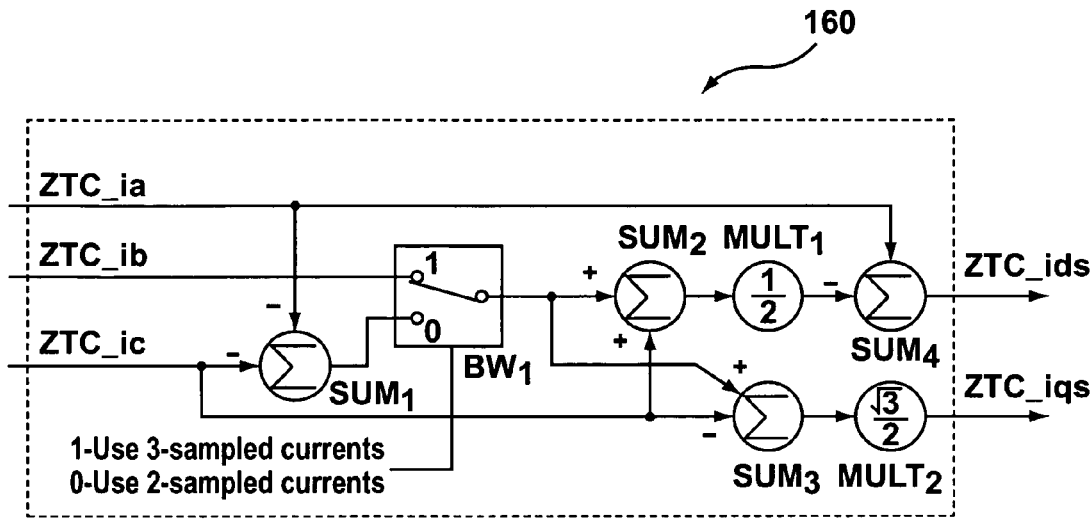
FIG. 10 is a schematic diagram of a 3:2 current converter that is used by the embedded simulator of FIG. 9.

FIG. 10 is a schematic representation of current adaptor 160 which converts variables ZTC_$i_a$, ZTC_$i_b$, ZTC_$i_c$ obtained from current sensor 119 into the internal system variables ZTC_ids, and ZTC_iqs which represent the estimated d and q axis stator current. When only two current sensors are available within induction motor 112, current adaptor 160 reconstitutes the absent phase using the conventionally known process of three-to-two-phase transformation as shown in FIG. 10 and referenced in FIG. 9. Specifically, as shown, binary logic switch BW1 is programmed to selectively couple the variable ZTC_$i_b$, to the logic summers SUM2 and SUM3 through contact "1" if there are three sampled currents available or the variable ZTC_$i_c$ to the logic summers SUM2 and SUM3 through contact "0" if there are only two sampled currents available. The output variables are ZTC_ids and ZTC_iqs which are commonly referred to as d-q quadrature equivalents of the stator current commonly found in state-space representation of induction motor control systems.

In the case of two available sample currents, the output variable ZTC_ids is calculated by summing variable ZTC_ia through summer SUM4 to the negative value of one half of the sum (through multiplier MULT1) of the combined sum (through summer SUM2) of the positive value of variable ZTC_ic and the negative value of the variable formed by the sum of ZTC_ia and ZTC_ic through summer SUM1. Also, the output variable ZTC_iqs is calculated by multiplying by one half of the square root of 3 (through multiplier MULT2), by the sum of the negative value of variable ZTC_ic and the negative value of the variable formed by the sum of ZTC_ia and ZTC_ic. The net result is that the output variable ZTC_ids is ZTC_ia times 3 divided by 2 and that the output variable ZTC_iqs is minus ZTC_ia times the square root of 3 divided by 2 minus ZTC_ic times the square root of 3.

In the case of three available sample currents, the output variable ZTC_ids is calculated by summing variable ZTC_ia (through summer SUM4) to one half of the sum (through multiplier MULT1) of the negative value of the combined sum of variable ZTC_ib and ZTC_ic (through summer SUM2). Also, the output variable ZTC_iqs is calculated by summing the negative value of the variable ZTC_ic (through summer SUM3) with the variable ZTC_ib and multiplying the result by one half of the square root of 3 (through multiplier MULT2). The net result is that output variable ZTC_ids is ZTC_ia minus one half of ZTC_ib minus one half of ZTC_ic and that the output variable ZTC_iqs is ZTC_ib times one half of the square root of 3 minus ZTC_ic times one half the square root of 3.

Figure 11A:
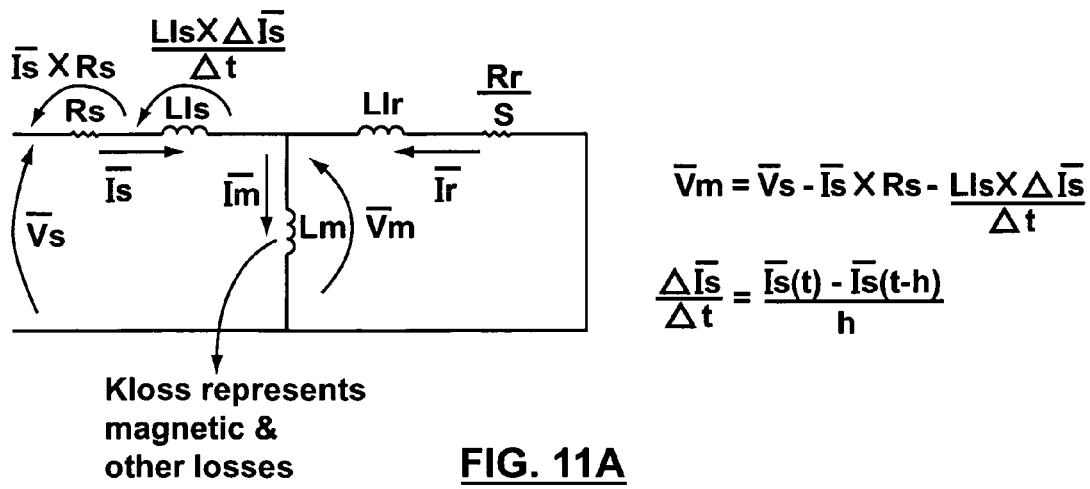
FIG. 11A is a schematic diagram of an equivalent circuit representation of the induction motor of FIG. 5A-1 that illustrates the magnetic and other losses that occur during operation.
Figure 11B:
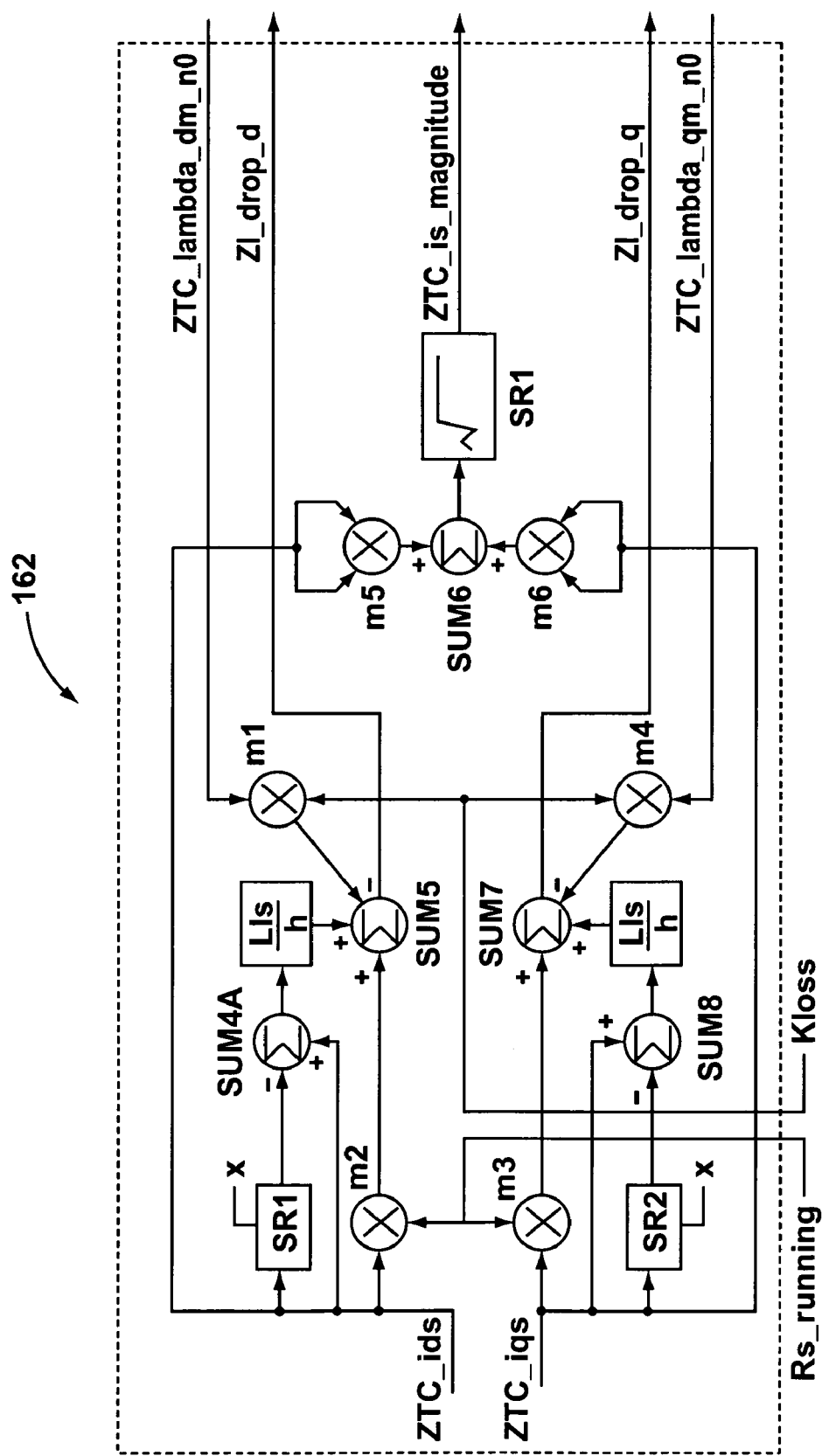
FIG. 11B is a schematic diagram of the loss compensator of FIG. 9.

FIG. 11A illustrates another conventional equivalent circuit representation of induction motor 112 illustrating the air-gap voltage Vm and showing real world magnetic and other losses. Loss compensator 162 calculates the direct and quadrature components of the main flux (i.e. main flux linkage $\lambda m$) of induction motor 112 by using a predictor/corrector algorithm to estimate the integral of the air-gap voltage Vm as will be described. The calculation of air-gap voltage Vm consists of taking the applied stator voltage Vs and subtracting the Is*Rs voltage drop as well as the stator leakage inductance Lls*dIs/dt voltage drop (see FIG. 11A).

The equivalent circuit for the motor shown in FIG. 11A shows only loss bearing elements Rr/S and Rs. However, it should be understood that the process of producing time varying flux in induction motor 112 brings with it attendant magnetic losses which are typically modeled as a resistor Rc in parallel with Lm to account for magnetization losses. However, other additional losses also occur and are typically attributed to various other loss mechanisms including hysteresis losses, eddy current losses, skin effect losses, vibrational losses, bearing losses, capacitive coupling losses among others. Each of these loss mechanisms are generally complex non-linear functions of several variables and can also vary with operational speed and temperature. Many of the important losses affecting sensorless control systems occur in a narrow operating region (i.e. typically around zero speed and below 15% of rated speed), this region of operation is also where high quality sensorless control of torque is desired. In order for the integral of the air-gap voltage Vm to be estimated to the degree necessary for proper operation of control system 100, Embedded Simulator 124 must take into account the magnetic and other losses associated with induction motor 112. Without taking into account the presence of magnetic and other loses, it is not possible to magnetize induction motor 112 at zero speed.

Accordingly, control system 100 uses a compensating parameter, Kloss, which is used to compensate for all unaccounted, unmodeled for magnetic losses and other losses by producing a decay in the stator flux, the dominant electrical energy storage element in induction motor 112. These losses are represented by the arrow labeled Kloss in FIG. 11A. The parameter Kloss can be determined empirically and adjusted thereafter during operation of the control system 100 if desired. Stator resistance and rotor resistance losses are not modeled into Kloss, as they are already explicitly modeled as shown in FIG. 11A. The parameter Kloss can be chosen as a fixed parameter, or it can be varied during operation according to an appropriate desired modeling scheme. Generally, it has been determined that the use of a value of Kloss that is too low does not allow for magnetization of the machine at stall. A value of Kloss that is too high produces rotation and acceleration from zero speed with an undriven shaft (i.e torque is produced when there should not be any). At zero speed with an unloaded shaft, too large a value of Kloss can produce rotation even when the torque command is zero.

FIG. 11B illustrates the logic configuration of loss compensator 162 of Embedded Simulator 124 that is designed to calculate the voltage drop portion associated with the air-gap voltage relation in FIG. 11A (i.e. the Is*Rs-Ldls/dt term). The inputs to loss compensator 162 include ZTC_ids and ZTC_iqs (discrete time versions of the d and q axis stator current) provided by current adaptor 160 and ZTC_lambda_dm_n0 and ZTC_lambda_qm_n0 (i.e. the d and q axis representations of the main flux of induction motor 112) provided by main flux predictor/corrector 164. These variables are used with parameter Kloss to model losses in induction motor 112 by generating the variables ZI_drop_d and ZI_drop_q, which are used to correct stator voltage (vds and vqs).

Loss compensator 162 utilizes input parameter gains Kloss and Rs_running in the feedback path of the stator flux calculation to account for the presence of other losses and stator resistance within induction motor 112. For illustrative purposes, Rs_running is considered to approximate the value of the stator resistance Rs. The shift registers SR1 and SR2 in FIG. 11B have the present value of the variable applied (both d and q versions) at their inputs. The output of shift registers SR1 and SR2 is the last value of the variable applied. Shift registers SR1 and SR2 are triggered by the variable x, which has the effect of transferring the variable from the inputs to the outputs of shift registers SR1 and SR2. Variable x is provided by Sequential Processing Event Manager 120 that as previously discussed, coordinates the step-by-step computation activity within control system 100.

Loss compensator 162 computes the derivative of motor stator current Is (i.e. the dIs/dt term) by computing the difference of present and past inputs (i.e. using shift registers SR1 and SR2 and summers SUM4A and SUM8, respectively for d and q variables) and then dividing by the step-time h using blocks Lls/h, respectively for d and q variables, as shown in FIG. 11B. Normally derivatives are avoided in control operations, however, owing to the strong linear nature of the currents especially when h is small, the derivative term is reliable and allows maximum information about the current to be utilized by control system 100.

Once the derivatives of variables ZTC_ids and ZTC_iqs are calculated, they are summed (through summers SUM5 and SUM7, respectively) to the multiple (through multipliers M2 and M3) of the respective current variables ZTC_ids and ZTC_iqs with the model constant value Rs_running (which is assumed to be the value of the stator resistance Rs for purposes of calculation) as well as to the multiple (through multipliers M1 and M4) of the respective stator flux variables ZTC_lambda_dm_n0 and ZTC_lambda_qm_n0 with the model constant value magnetic loss resistance Kloss. The final result of these calculations is the simulated d-q axis ZI_drop_d, ZI_drop_q which represents the combined effect of stator leakage voltage drop and resistive voltage drop associated with other losses.

Without taking parameter Kloss into account within the stator flux calculation, real magnetization of the motor cannot be achieved at zero speed. It has been observed, that if parameter Kloss is not taken into account, regulation of stator flux will occur with only a few switch transitions, at which point control system 100 will stop modulating unless a large torque reference is applied. This is because, when stator current goes to zero, the flux in the motor model would not really decay, unless there is a loss mechanism to model loss in the real world. If there is no such loss mechanism, then the embedded motor model presumes that zero vector can be maintained indefinitely, without the real flux in the machine ever decaying (which is of course completely inaccurate).

FIG. 11B also illustrates how loss compensator 162 generates the variable ZTC_is_magnitude which represents the magnitude of the stator current vector ZTC_ids+jZTC_iqs. This variable is produced by the basic geometric relation where the resultant length of the vector formed by the sum of two quadrature stator current vectors is determined by the square root of the sum of the squares of those same quadrature vectors. This is implemented within loss compensator 162 using multipliers M5 and M6 (to generate the square of each of ZTC_ids and ZTC_iqs), summer SUM6 (to sum the squares) and the square root operator SR1 to complete the calculation of the magnitude value. As discussed above, it is contemplated that control system 100 could use variable ZTC_is_magnitude for conventional motor indications such as to detect motor overload, or many other possible uses such as for example loss modeling schemes directed at prescribing the value of Kloss.

Accordingly, the output of loss compensator 162 consists of the variable ZI_drop_d which is a discrete time variable representing the present inferred sample of d axis combined effect of the stator leakage voltage drop, un-modeled losses and the resistive voltage drop. The variable ZI_drop_q which is a discrete time variable representing the present inferred sample of q axis combined effect of the stator leakage voltage drop, un-modelled losses and the resistive voltage drop. The total voltage drop vector for induction motor 112 is ZI_drop_d and ZI_drop_q. Loss compensator 162 also generates ZTC_is_magnitude, which is a discrete time variable that represents the present inferred sample of the "length" of the stator current vector Is.

Kloss is a positive-only algorithm parameter that represents a non-ideal feedback loss factor that contributes to the decay of magnetization flux. The presence of a non-zero Kloss renders the integration of flux from Vm non-ideal to the extent that instead of the flux being derived from a pure integrator, it is derived from a "leaky" integrator. Kloss and the multiplier feedback construct allow the amount of leakage to be controlled to model for unaccounted losses in the magnetization of the motor. Prior art current regulated controllers do not require this construct because they automatically regulate-out the non-modeled losses in the motor. However, in sensor-less control, especially at zero speed these losses play a large role in the behavior of the motor.

The loss parameter Kloss can have a constant value or be dependent on other circuit characteristics (e.g. lookup table as a function of speed, etc.) In some applications, it is desirable to use a variable parameter Kloss. For example, if losses are not modeled accurately, the linearity of actual torque produced, compared to the torque command may be less than ideal (especially in the vicinity of zero speed operation) and cause problematic motor operation. By using loss parameter Kloss from a lookup table (or other automated means), it is possible to ensure an improvement in the linearity of the actual torque produced. This kind of improved performance is especially critical in torque sensitive applications such as those involving sensitive paper machines or similar equipment. While the above compensation mechanisms are available to this algorithm, the simple fixed Kloss gain is normally more than adequate to produce a very high performance drive, compared to most other drives today.

The Kloss mechanism embodied within loss compensator 162 allows the insertion of a loss producing feedback into the main flux equation. Similar constructs to this postulated by Cassadei [ISIE conference 1998 in Pretoria South Africa "Tutorial: Direct Torque and Stator Flux Control of an Induction Motor Theoretical Analysis and Experimental Results: Professor Domenico Casadei, Professor Giuseppe Buja, Professor Giovanni Serra, pages 71-81] have been shown to desensitize control systems to variation in stator resistance, and lab tests have confirmed this is true with the Kloss construct of this invention. Typically very small values of Kloss are required to cause the machine to regulate actual flux at stall. Most importantly, when the parameter Kloss is adjusted properly at zero speed, the inventor has determined that control system 100 (using sensor-less control techniques) is able to detect externally applied torque disturbances (i.e. hand rotation) around zero speed such that a zero torque command is faithfully reproduced at the shaft. That is, control system 100 enables the shaft to comply with, and accommodate, the disturbance in order to carry out the zero torque command, thus exhibiting an important capability of true sensor-less control. Ideally, the parameter Kloss is tuned to take on a set of values that can be determined during an auto-tune run with an unloaded induction motor 112, and played back appropriately during operation of induction motor 112. Self-commissioning schemes are common in prior art sensorless control schemes and these approaches can be used with parameter Kloss as well. Such systems may strive to set parameter Kloss to the "correct" value for a given speed and torque, or current. A set of values, or a set of parameters which drive equations that produce an adaptive Kloss are then produced to explicitly model out the un-modeled losses of the practical machine, inverter and mechanical load combination. Control system 100 has been designed to incorporate a constant parameter Kloss, although it is contemplated that auto-tuning and dynamic control of parameter Kloss could be incorporated within control system 100 to further improve performance.

Figure 12A:
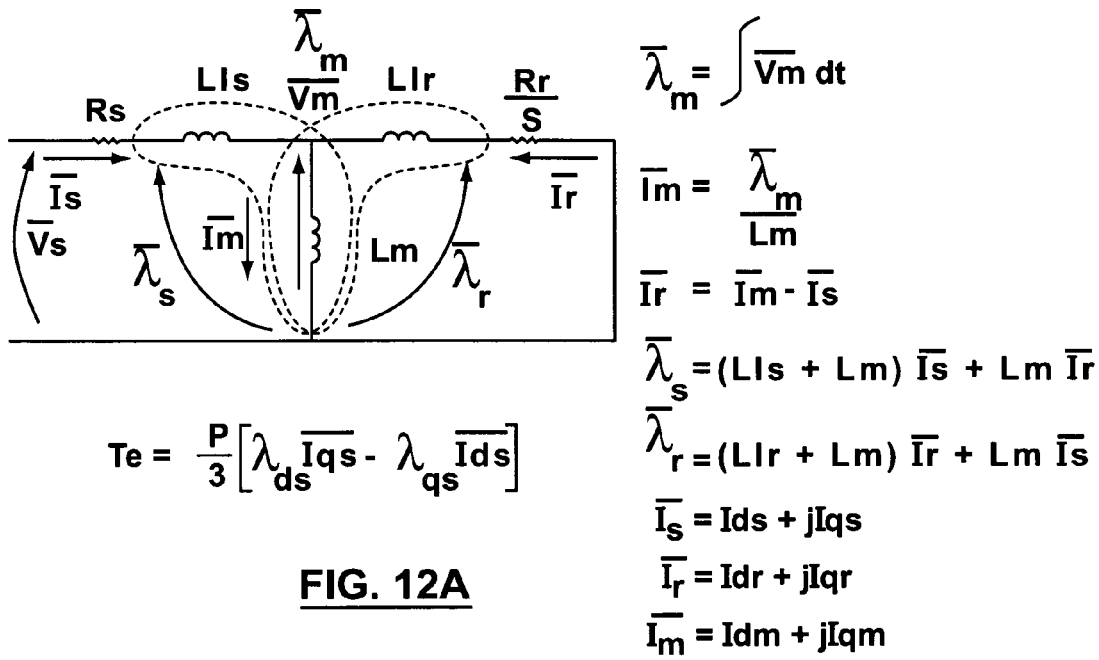
FIG. 12A is a schematic diagram of an equivalent circuit representation of the induction motor of FIG. 5A-1 that illustrates the relationships between motor model components.
Figure 12B:
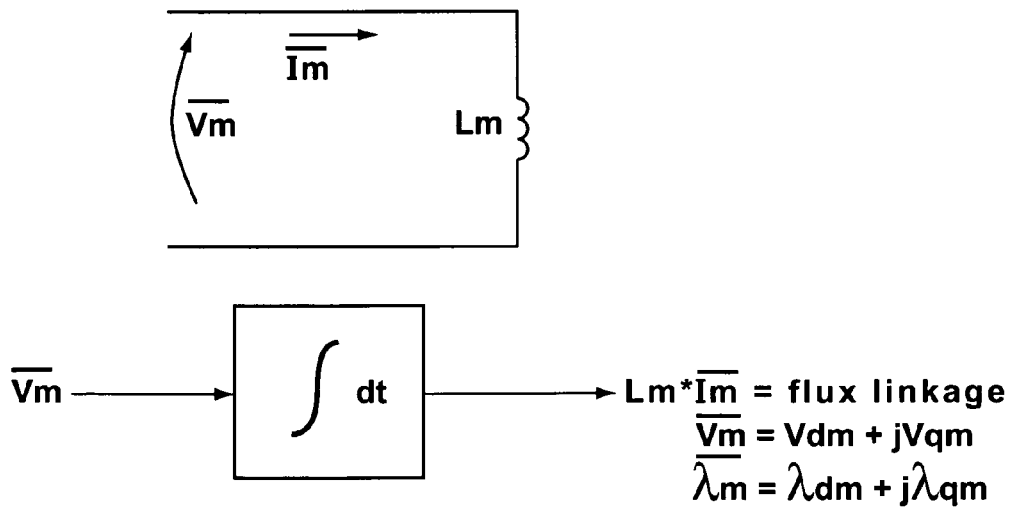
FIG. 12B is a schematic diagram showing the relationship of the main voltage, current and inductance of the induction motor of FIG. 5A-1 as well as illustrating the principle of the integration calculation that is traditionally required to obtain a value for the main flux linkage.

FIGS. 12A and 12B illustrate the principle by which the main flux linkage µm is calculated for motor circuit 112. Specifically, the main flux linkage µm is equal to the integral of the air-gap voltage Vm as shown in FIG. 12B. Once the main flux µm is determined, it is possible to determine the values of the entire motor model as shown in FIG. 12A.

Various well-known integration methods are used to model high order systems (e.g. Trapezoid rule, Runge-Kutta, Simpson's rule, Rectangular Rule, etc.) In the case of both off-line and real-time solution of high order, complex, non-linear, cross-coupled differential equations, different algorithms possess a different ability to converge with a bounded and valid solution. The challenge of this task is particularly apparent if the systems are stiff and/or the real time data contain harmonic components that are substantially higher than the sampling rate of the solution algorithm.

These conditions are associated with pulse width modulated high voltage pulses in the field of power electronics because the typical high rates of change of voltage stress the numerical stability of the solution algorithm. As is conventionally known, the term stiffness refers to a numerical condition that occurs when the matrix formed by the states in the system is sparse or has very large differences in the size of numerical elements. This stresses the numerical system solvability to determine the next state to the point where the simulation numerically explodes, and no longer functions properly. When any variable in such simulation changes quickly, the numerical spread of the simulation variables experience a temporary spread in the extremes of their magnitude with respect to each other.

This stresses the numerical precision of the computational entity (i.e. microprocessor) because of the inherent finite ability to precisely represent numbers. The practical effect of such "stiffness" is most obvious to circuit designers who use computer software to simulate and validate their designs. It becomes even more obvious in power electronics because so much switching is taking place on a regular basis. When a power design simulated within a desktop computer simulation has the switches turn-on or turn-off, this stresses the simulation. Offline simulation software typically must engage in very fine h-step size to negotiate the simulation without losing convergence, to even make them useable. Those experienced in the art of simulation of power electronic circuits will recognize that this convergence failure effect makes simulation of power electronic switching systems difficult, unreliable and an inefficient and a time intensive engineering design task.

Control system 100 completely avoids these limitations. All voltage states in the invention consist of h-size blocks of time, with a level determined by VDC. However, edge time steepness has no effect because by nature of the structure, the steps are synchronized with the predictor corrector integration numerical method, so there is effectively no high rate of change seen in the embedded simulation and so there is no stiffness, even though the high dv/dt events actually occur in the outside world. This results in stability and precision and reliability.

Referring back to FIG. 7A, switches SWa, SWb, SWc, SWa', SWb', and SWc' are ideally complementary in state to each other in each leg of the inverter (i.e. when one upper switch SWa, SWb, or SWc, is on, the corresponding lower switch SWa', SWb', or SWc' is off). However, since each power switch is unable to switch instantly, an "interlock" delay ($h_{int}$) is conventionally inserted when one device is commanded off before the complementary device is commanded on. This is necessary to prevent the event commonly referred to as "shoot through" which produces high current flow through two of the switches in the same leg, leading to possible destruction of the devices. Interlock delay $h_{int}$ can vary from sub-microseconds for very small inverters to hundreds of microseconds for very large inverters, and is chosen to accommodate the finite turn-off times of real power switches. In some systems interlock delay $h_{int}$ is a constant, but it can also be variable (i.e adapted while running) for other systems.

Figure 13A:
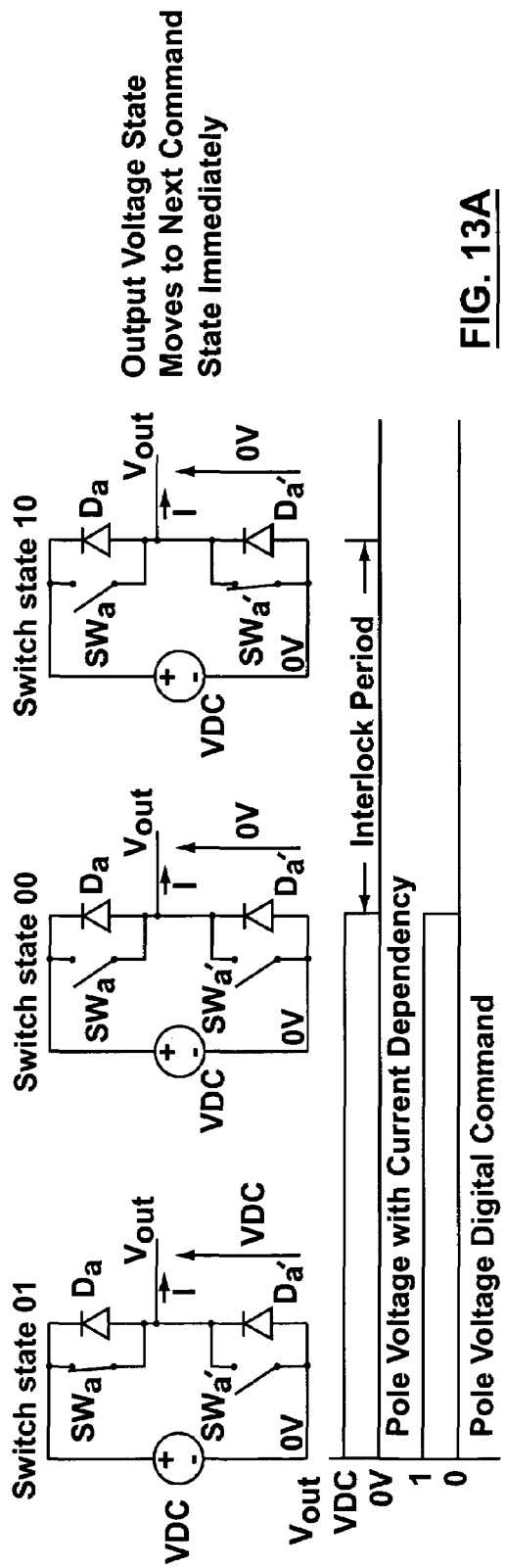
FIGS. 13A and 13B are schematic diagrams showing the switching state transitions adopted by a single totem-pole configuration having a variable direction of current i.
Figure 13B:
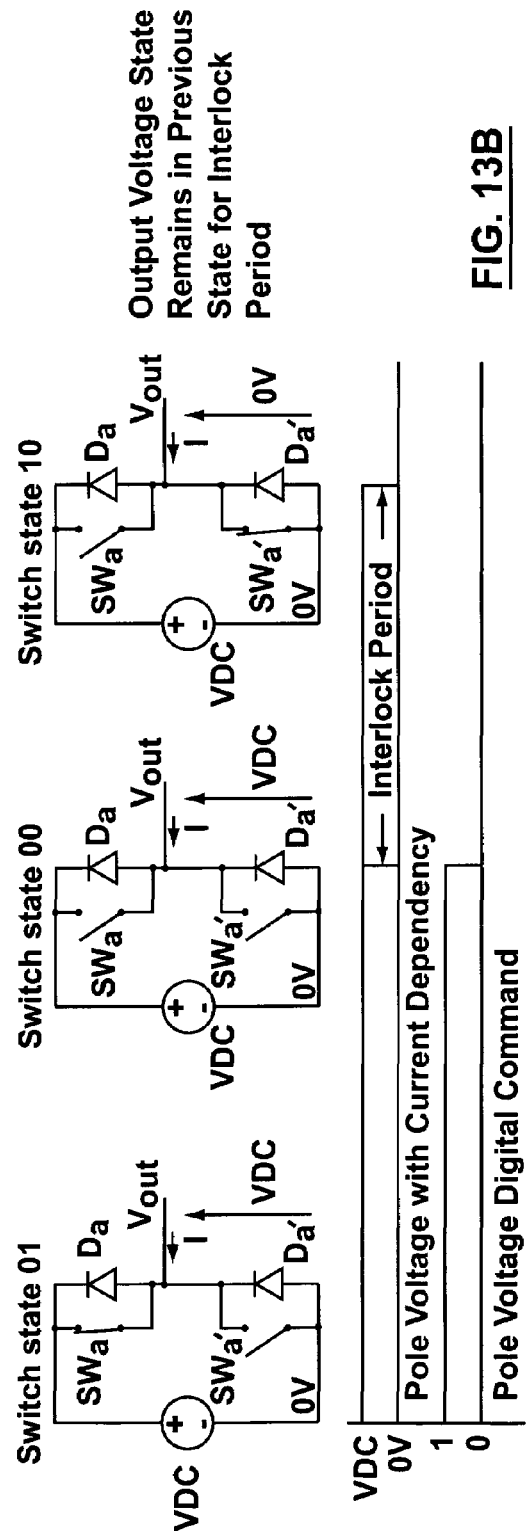

FIGS. 13A and 13B show a single totem-pole configuration in various switch states and having a variable direction of current i. These figures illustrate the output voltage/current dependence that occurs during the interlock state. The voltage at the output of power circuit 114 (i.e. in reference to the negative DC source) is shown as VOUT alongside the pole voltage command variable for the switches as they enter and leave the interlock (transition) state. The switch states shown are the states {SWa', SWa}={01}, {00}, and {10}, where 1 denotes a closed switch, and 0 denotes an open switch. The voltage command variable is the ideal voltage command, 1 or 0, which would ideally produce VDC or 0V. An ideal totem pole would switch in zero time, so that the output voltage VOUT would be entirely independent of current i. That is, if power switches SWa, SWb, SWc, SWa', SWb', and SWc' in FIG. 7A were able to switch in zero time, there would be no need for the use of an interlock delay, the ideal voltage command variables per phase would correspond to 01 and 10 switch commands only, and the delay between commands would be zero. The need for an interlock delay is apparent when the simple command from the switch state 01 to 10 is broken down into the three states 01, 00 (i.e. the transition state) and 10 and the output voltage VOUT observed. It can be seen that in the 00 state, the output voltage VOUT is determined by the direction of current i.

Specifically, as shown in FIG. 13A, output voltage VOUT is equivalent to VDC times the voltage command variable since current i is positive. That is, when the switch state changes from 01 to 00, output voltage VOUT drops to 0V since current i flows through diode Da'. When the switch state changes to 10, VOUT is maintained at 0V since current i continues to conduct through diode Da'. That is, the output voltage VOUT moves to the next command state (i.e. 00 state) immediately.

However, in FIG. 13B, the output voltage VOUT is not equivalent to VDC times the voltage command variable since current i is negative in this case. That is, when the switch state changes from 01 to 00, output voltage VOUT stays at VDC (instead of falling with voltage command variable) since current i flows through diode Da. As a result, the output voltage VOUT remains in the Previous State (i.e. at VDC) for the interlock period (i.e. until switch SWa' closes). Here, there are two values of output voltage VOUT that can exist depending on current direction during the interlock time, the Present State voltage, and the Next State voltage. This current dependency renders the concept of a "voltage source inverter" invalid, because with interlock delay present, the system voltage is no longer independent of current. Accordingly, systems like motor drives at very low speed can suffer severe performance degradation if the control system is based on the assumption of an ideal true voltage source inverter. It is of interest that current regulated voltage source inverters do not suffer from interlock delay effects.

FIGS. 13A and 13B illustrate that depending on the direction of current I, the Present State switch commands is either extended or not. In order to properly compensate the effect of interlock delay it is necessary to know the direction of current during the transition, the Present State switch commands existing before the transition, and the Next State switch commands that will exist after the transition. As long as the length of the transition (interlock delay, also known as dead-band time) is known, and the rise and fall times of the switches in making the transition between on and off conditions is small compared to the interlock time (or these rise and fall times are symmetrical with each other) the interlock voltage can be compensated by the approach of the present invention, as long as the current direction (not the current) is constant during the transition time. Also, the DC link voltage must be known and must not change rapidly during the transition. However, even if these conditions are not all present, the interlock delay effects can be reduced dramatically.

Figure 13C:
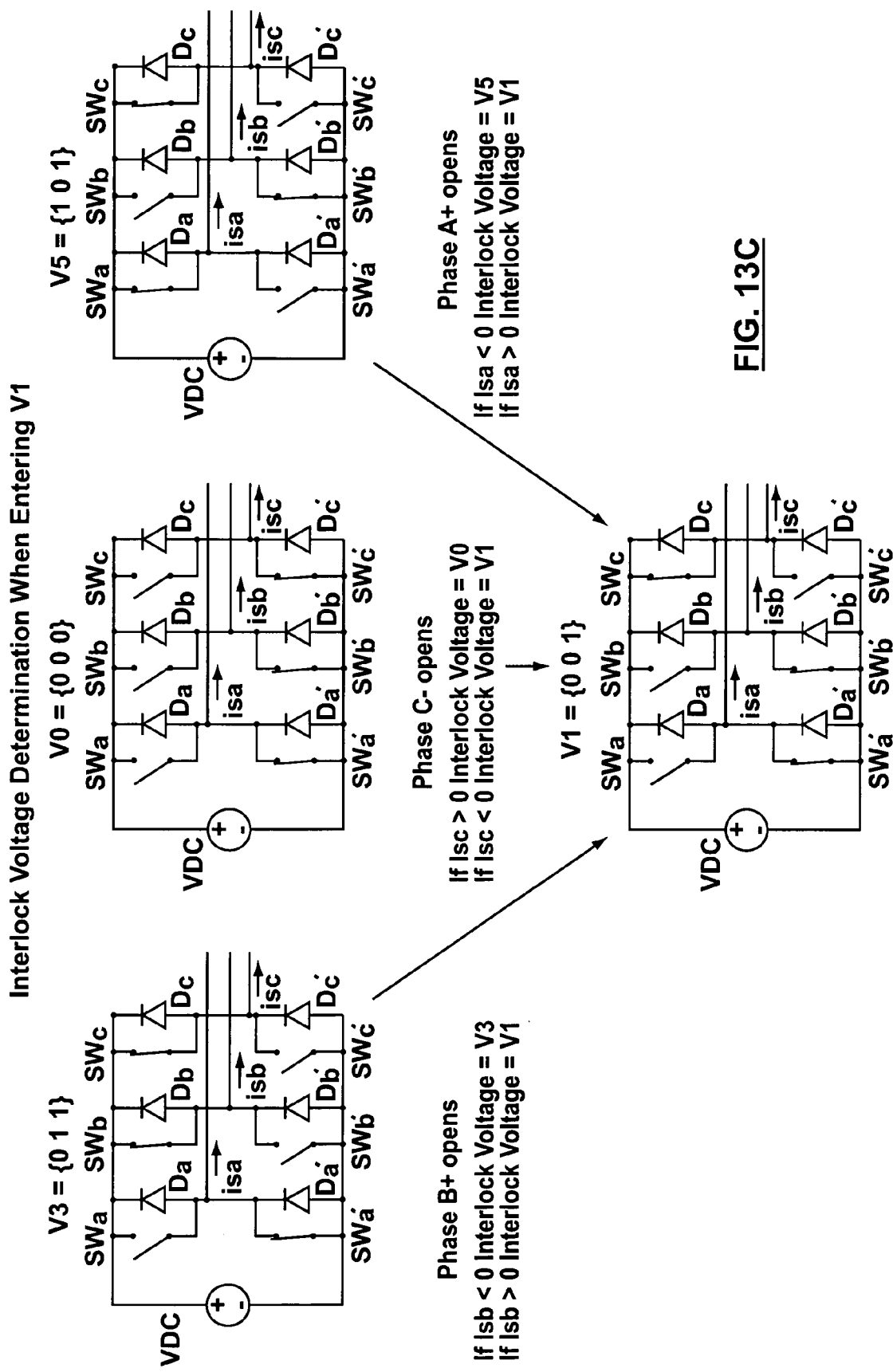
FIG. 13C is a schematic diagram showing the power circuit switches of FIG. 5A-1 in various configurations to illustrate how interlock voltage rules can be derived based on various transitions between switch states.

Referring back to FIG. 7A, during the period of interlock delay $h_{int}$, one or more upper switches SWa, SWb, or SWc, and lower switches SWa', SWb', or SWc' are commanded off. The output of a changing pole (i.e. pair of top and bottom switches) is not asserted but is effectively in a quasi-tri-state condition as shown in FIG. 13C. The output is not a voltage source but a quasi-voltage source. A true voltage source will maintain its voltage regardless of the current flowing, but during the interlock interval the current can change and the voltage can change beyond the control of the system. For current to flow it must flow through one of two diodes (e.g. Da or Da') and in so doing the voltage can assume two values. The actual voltage that the output terminal is connected (i.e flies back) to is either the +bus, or the −bus and solely depends on the direction of current flow. Accordingly, the actual voltage is predominately determined by the external circuit, not by the controller.

This uncertainty is particularly destructive when switching action is in effect at low speed. Here, the controller is chopping from a high voltage bus to produce a low voltage. In this mode, pulse widths are small, and are of the same order as the interlock time. When the interlock is present, the actual voltage applied to the motor at low speed is different from that commanded, and the result is that the flux (i.e. the integral of the voltage) computation can be severely degraded. Since the flux calculation is of substantial importance in the sensor-less control of the present invention, interlock delay must be taken into account by control system 100.

Control system 100 accomplishes determination of the actual voltage during the interlock interval by taking the effect of interlock delay $h_{int}$ into account. This is accomplished by using the current directions to determine which side of the inverter the pole voltages fly back to. During the interlock interval, the voltage state that power circuit 114 flies back to is a strong function of the external circuit. Since motor flux is essentially the integral of voltage, motor flux estimation during the interlock interval is strongly dependent on the shaft and rotating conditions. Control system 100 drives the load with voltage, and then it measures the load voltage during the interlock time, while continuously measuring current. This method provides the ability to measure both current and voltage simultaneously to compute flux in sharp contrast to some prior art controllers which operate in current mode and estimate flux on the basis of voltage alone.

Referring back to FIGS. 2 and 7B, the ideal representation of the d-q axis representation of the output voltage of power circuit 114 is shown. As shown in FIG. 2, each switch state has four possible transitions. One transition is the act of remaining in the same state, and accordingly, interlock delay does not apply. The other three transitions involve interlock delay and each require correction. The ideal representation of FIG. 2 can be utilized within control system 100 only when there is no interlock delay (i.e. when Present State and Next State are the same state). However, if a transition is made from one state into another distinct state, then the effect of interlock delay on the output voltage of power circuit 114 must be taken into account. Control system 100 utilizes a set of rules to determine the interlock voltage. Since there are eight total states (i.e. possible Present States), each state having three possible Next States, the total number of rules is 24 with each rule having two current dependencies (i.e. positive i and negative i). Accordingly, the state transition constraints of FIG. 2 have the value of simplifying and reducing the number of rules that must be processed, in this case 48.

FIGS. 13C and 13D illustrate how the 48 rules (FIG. 13D) are derived for transition from three possible Present States V3, V0 and V5 to one Next State V1. The Present State and Next State switch commands consist of vectors S{a,b,c} where a, b and c can take on a 0 or 1 value. As previously discussed, the interlock delay voltage rules depend on current direction, the Present State, and the Next State. Specifically, as shown in FIG. 13C, the transition from Present States V3 (i.e. SWa open and SWb and SWc closed), V0 (i.e. SWa, SWb, and SWc all open) and V5 (i.e. SWa and SWc closed and SWb open) to a single Next State V1 (i.e. SWa and SWb open, and SWc closed) is studied.

When phase B+ opens (i.e. when switch SWb opens and switch SWb' closes), then if the current isb is negative (i.e. isb<0) the interlock voltage will be V3 (i.e. current isb will flow through diode Db during the interlock period), but if the current isb is positive (i.e. isb>0) the interlock voltage will be V1 (i.e. current isb will flow through diode Db' during the interlock period). Similarly, when phase C– opens (i.e. when switch SWc closes and switch SWc' opens), then if the current isc is positive (i.e. isc>0) the interlock voltage will be V0 (i.e. current isc will flow through diode Dc' during the interlock period), but if the current isc is negative (i.e. isc<0) the interlock voltage will be V1 (i.e. current isb will flow through diode Dc during the interlock period). Similarly, when phase A+ opens (i.e. when switch SWa opens and switch SWa' closes), then if the current isa is negative (i.e. isa<0) the interlock voltage will be V5 (i.e. current isa will flow through diode Da during the interlock period), but if the current isa is positive (i.e. isa>0) the interlock voltage will be V1 (i.e. current isa will flow through diode Da' during the interlock period).

Current direction resolver 165 of Embedded Simulator 124 (FIG. 9) produces the variables D_ia, D_ib, and D_ic which are used by the logic circuitry that compensates for interlock delay. These variables have the values 1 or 0 depending on the direction of current in the respective phase, and are used to determine the interlock voltage during the interlock delay time. Since this invention already uses current sensors for determining continuous stator currents, the variables D_ia, D_ib and D_ic can be determined by knowing the sign of the current variables ZTC_ia, ZTC_ib and ZTC_ic. Since the current is practically never 0, D_ia is simply determined at the beginning of the algorithm after ZTC_ia is measured.

If ZTC_ia>0 then D_ia=1 and is otherwise zero for all other conditions.

If ZTC_ib>0 then D_ib=1 and is otherwise zero for all other conditions.

If ZTC_ic>0 then D_ic=1 and is otherwise zero for all other conditions.

In the case of systems with only two sensors, for example on Phase A, and Phase C, D_ia and D_ic are computed directly and the D_ib variable can be determined according to the above rules with assumption that ZTC_ib=–ZTC_ia–ZTC_ic, as long as the neutral of the induction motor has no connection to other current flow paths (i.e. such that the relation ZTC_ia+ZTC_ib+ZTC_ic is=0 is true).

FIG. 13D lists each of the 48 rules that can be compiled for the various state transitions as defined by the specific finite state machine shown in FIG. 2. The four rules associated with the transitions shown in FIG. 13C are indicated by the curly bracket. Based on these rules, on a measurement of the DC bus voltage, the switch commands at any time, and the interlock period h_int, it is possible to determine the interlock voltage for all situations, and accordingly a reasonably good estimation of the actual voltages applied to load circuit 112 of FIG. 2. As described earlier, this approach allows control system 100 to determine the three phase pulse width modulated (PWM) voltages with substantially high accuracy without any need to directly attach an analog measurement device to the output of power circuit 114. It should be understood that this method is not limited to systems with fixed interlock delay h_int and an interlock delay of variable length can be accommodated.

It should be noted that two situations can alternatively occur with the control system; the power circuit 114 can provide power to the load circuit 112 and the load circuit 112 can also provide power to the power circuit 114. In fact, the interlock rules allow the control system to calculate the output voltage when the current direction is known which allows the control system to know whether there is any torque (positive or negative) being applied to the shaft of the motor. Regardless of how complex the torque may be as a function of time, disturbances to the torque can be reflected as an accumulation of small volt-second integrals that are taken into account by the control system, during interlock delay compensation, to reflect the effect in stator flux computation and the embedded motor model. In this regard, the interlock delay period can be viewed as a "window" in time in which the power circuit 114 can provide power to the load circuit 112 or the load circuit 112 can provide power to the power circuit 114.

It should be understood that while the above illustration has been provided for power circuit 114 having three binary switches (each binary switch having a complementary set of switches), the general principles of the approach discussed above can be applied to any power switch configuration (i.e. various configurations of single switches etc.) The general principles of the approach discussed above are based on the observation that when a switch closes, the voltage is known (i.e. is "0") but the current going through the switch is uncertain and that reciprocally, when a switch opens, the current is known (i.e. is "0") but the voltage across the switch is unknown. Interlock voltage can be determined in any switch configuration by determining the present and next switch states and their associated voltages (i.e. present state voltage, next state voltage), determining the direction of the current (positive or negative) during the interlock delay period, and then based on the specific circuit topology of the diode paths that carry the current during the interlock period, determining whether the voltage during the interlock period is present voltage or the next voltage.

Figure 13E:
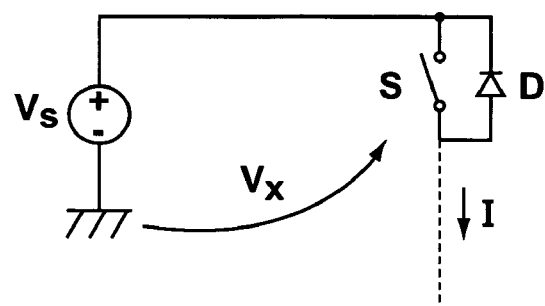
FIG. 13E is a schematic diagram of a switch having a free-wheeling unidirectional current element connected in a first configuration.

A more general approach for determining the rules described to determine the interlock voltage vector that is in effect during the interlock delay period can be understood from the following fundamental concepts. FIG. 13E shows a first switch configuration whereupon the voltage Vx shown is defined (with respect to an arbitrary reference point) and is independent of load when the switch is closed. When the switch opens, the voltage Vx can be determined equal to Vs, but only if the current direction is known to be negative as shown in FIG. 13E.

Figure 13F:
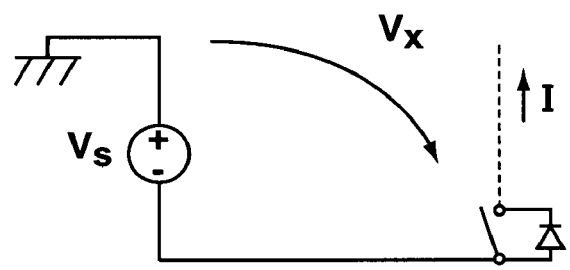
FIG. 13F is a schematic diagram of a switch having a free-wheeling unidirectional current element connected in a second configuration.

In FIG. 13F, a second switch configuration is shown whereupon the voltage Vx is defined (with respect to an arbitrary reference point) and is independent of load when the switch is closed. When the switch opens, the voltage Vx can be determined to be equal to −Vs, but only if the current direction is known to be positive as shown in FIG. 13F.

Given any power circuit, and its configuration with the general elements of FIGS. 13E and 13F, the effect of current direction can be accounted for on an individual switch basis such that the voltage may be defined by knowledge of the current direction in the circuit.

Figure 13G:
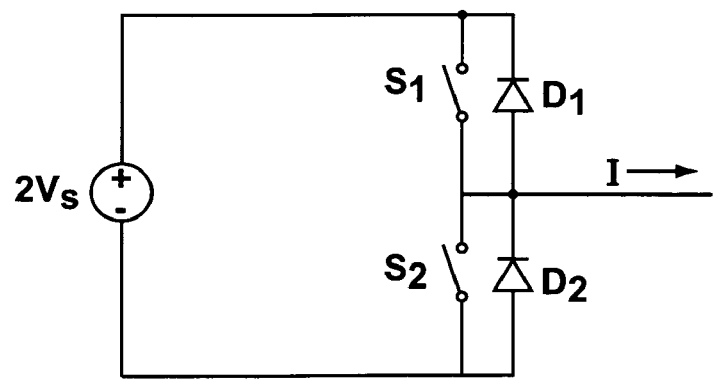
FIG. 13G is a schematic diagram of a combination of the switch elements of FIGS. 13E and 13F.

FIG. 13G shows a specific example of a power circuit comprised of the circuit elements from FIGS. 13E and 13F. This configuration is commonly known as the totem-pole configuration which will be referred hereafter as a binary switch. This power circuit also represents the switching structure used within the specific power circuit of the example embodiment of control system 100. As can be seen, in this configuration, the knowledge of current direction resolves the unknown state of the centre-point as long as the current direction is known.

Specifically, if both switches are open as part of the intermediate (interlock) process of moving safely from a stable Present Switch state condition, to a stable Next switch state condition, the direction of current can be used to determine the voltage of the common node centre-point. If the Present state is defined as S1 on and S2 off, the process of moving to the complementary state of S2 on and S1 off will involve an intermediate step in time (h_int) where both switches are open. The effect of such process results in uncertainty in the voltage for the h_int time. In this particular two-state scenario, the voltage at the centre-point will be equivalent to the Present State voltage, but only if the current is negative. Similarly, the voltage at the centre-point will be equivalent to the Next State voltage, but only if the current is positive.

The approach of deriving the rules as described can be extended to the three-phase inverter of power circuit 114 by establishing the overall vector of voltages that will occur during the time that any complementary set, or sets of switches are open. It should therefore be understood that while control system 100 utilizes a power circuit 114 within which only one switch opens at a time, the above fundamental principles can be used with no loss of generality to power circuit configurations, or state transition constraints defined where more than one binary (complementary) switches are allowed to change at a time. It should be understood that the change of one switch at a time is unique to this invention and that it provides benefits to computational intensity, reduces the number of rules processed, and promotes minimization of EMI. However, it should be understood that changes of more than one switch are also possible. Accordingly, the interlock delay compensation techniques described above are only one particular example of how an unknown voltage or vector of voltages within a power circuit can be identified and modeled. Also, the discussion illustrates the effect of these unknown voltage or vector of voltages when the power circuit ceases to drive the power circuit, and when the load by comparison drives the power circuit. The application of these concepts allow control system 100 to provide a high quality type of sensorless control, and is used in being able to detect a shaft disturbance in a sensorless manner at zero speed.

Figure 14A:
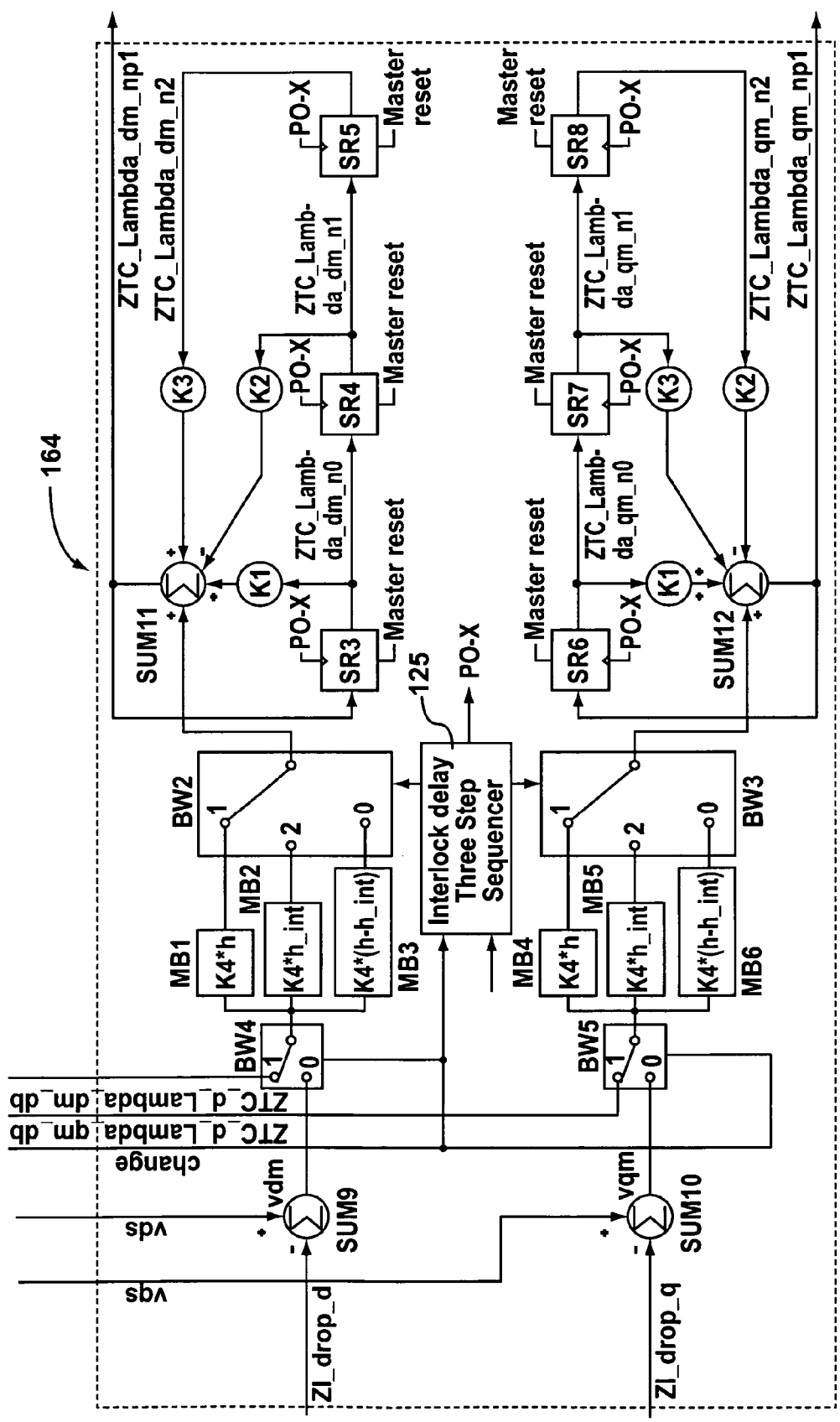
FIG. 14A is a schematic diagram of the main flux predictor/corrector of FIG. 9.

FIG. 14A is a schematic diagram of main flux predictor/corrector 164 that receives the variables ZI_drop_d and Zi_drop_q from loss compensator 162. Applied voltage module 163 calculates the variables v_ds and v_qs according to the equations shown in FIG. 7B and provides them to main flux predictor/corrector 164 as previously discussed.

The variables ZTC_d_lambda_dm_db and ZTC_d_lambda_qm_db are provided by Next State Contemplator 136 and are utilized within main flux predictor/corrector 164 to provide a more accurate estimation of applied voltage during a period of interlock delay. Finally, main flux predictor/corrector 164 generates the variables ZTC_lambda_dm_np1 and ZTC_lambda_qm_np1 which represent the final d-q axis values of the magnetization flux linkage λm=(Lm*Im) of load circuit 112 and provides them to motor characteristic calculator 168.

Main flux predictor/corrector 164 calculates these main flux linkage λm variables using a customized conventional integration method. Specifically, main flux predictor/corrector 164 utilizes a customized form of the well-known Gear Method Predictor Corrector technique. The form of this method is:

$$y_{n+1} = K1*y_n - K2*y_{n-1} + K3*y_{n-2} + K4*h*p_{n+1}$$

where K1=1.636363636, K2=0.818181818, K3=0.181818181 and K4=0.545454545454. The customization involves performing the Gear method at two time steps: at time h-int and h-hint (where h-int represents the interlock delay). The variable h, represents the time step, variable $y_{n+1}$ represents the output of the integrator at the beginning of next interval and variable $p_{n+1}$ represents the voltage input to the integrator at the beginning of the next interval, variables $y_n$, $y_{n-1}$, and $y_{n-2}$ represent the time shifted variables of the integrator output. Variables $y_n$, $y_{n-1}$, and $y_{n-2}$ are normally initialized to 0 for t=−h, t=−2 h and t=−3 h as part of practical real-time running is concerned. Each set of three SR shift registers SR3, SR4, SR5 and SR6, SR7, SR8 are used to contain the history of d-q flux values before the next prediction/correction iteration.

Variables ZI_drop_d and ZI_drop_q are received from loss compensator 162 and are subtracted from variables v_ds and v_qs using summers SUM9 and SUM10 as shown. The resulting variables vdm and vqm are provided as inputs 0 to binary logic switches BW4 and BW5 respectively. The variables ZTC_d_lambda_dm_db and ZTC_d_lambda_qm_db are provided as inputs 1 to binary switches BW4 and BW5 respectively. The outputs of binary switches BW4 and BW5 are connected to the three inputs of three-way logic switches BW2 and BW3, respectively, with interposing selective gain blocks of MB1 and MB4, MB2 and MB5, and, MB3 and MB6 respectively.

When power switches SWa, SWb, SWc, SWa', SWb', and SWc' of power circuit 114 (see FIG. 7A) are stable, the change flag within main flux predictor/corrector 164 stays set at zero. This causes both binary logic switches BW4 and BW5 to maintain connection with their input 1. Accordingly, the variable vdm is provided to input 1 of binary logic switch BW4 and coupled to multipliers blocks MB1, MB2, MB3, and the variable vqm is provided to input 1 of binary logic switch BW5 and coupled to multiplier blocks MB4, MB5, and MB6.

When a change of state is executed by control system 100, the change flag within main flux predictor/corrector 164 is set to one. This causes both binary logic switches BW4 and BW5 to assume connection with their input 1. Accordingly, the variable ZTC_d_lambda_dm_db from Next State Contemplator 136 is provided to input 1 of binary logic switch BW4 and selectively coupled to multipliers blocks MB1, MB2, MB3, and the variable ZTC_d_lambda_qm_db from Next State Contemplator 136 is provided to input 1 of binary logic switch BW5 and selectively coupled to multiplier blocks MB4, MB5, and MB6. ZTC_lambda_qm_db and ZTC_lambda_dm_db are the Next State Contemplators prediction of what the interlock voltage will be, and are setup before the change flag is set to 1. The variables ZTC_d_lambda_dm_db and ZTC_d_lambda_qm_db will be described in more detail.

When the change flag is set to 1, the following steps are taken. First, the main flux linkage λm is predicted/corrected and time shifted but with an artificial time-step of h_int, and with a voltage of ZTC_lambda_dm_db and ZTC_lambda_qm_db, respectively using multipliers MB2 and MB5 and switches BW2 and BW3 in the "2" position (received from Next State Contemplator 136). This represents the change of flux that occurs during the interlock period, and is dependent on the direction of current within power circuit 114. The voltages are referred to as the interlock voltage Vintik. Second, the main flux is predicted/corrected and time shifted again but with an artificial time-step of, (h-h_int i.e. the balance of timestep "h") using multipliers MB3, MB6 and switches BW2 and BW3 in the "0" position, and with the vds, vqs that would exist in the Next State. Third, the change flag is cleared, and the vds and vqs voltages derived according to the relations of FIG. 7B are used again (MB1, MB4 and switches BW2 and BW3 in the "1" position).

Accordingly, the vds and vqs voltages existing in the Present State are used with the Zl_drop_d and Zl_drop_q variables to produce the incremental voltage vdm and vqm. The variables ZTC_d_lambda_dm_db and ZTC_d_lambda_qm_db are also provided to main flux predictor/corrector 164 to produce variables ZTC_lambda_dm_np1 and ZTC_lambda_qm_np1 which are the d-q Present State estimations of main flux linkage λm in the embedded motor model. Interlock delay sequencer 125 is used to select the appropriate calculation block depending on whether there are changes in switch state.

If there is no switch state transition, interlock delay sequencer 125 selects K4*h gain multiplier block, and output P0-X trigger remains inactive. If there is a switch state transition, then interlock delay sequencer 125 selects the (K4*h_int) multiplier block and issues a rising and falling trigger (clock trigger) through P0-X to the predictor/corrector shift registers SR3, SR4, SR5, SR6, SR7 and SR8 to estimate an integration of the artificial time step (h_int) in loss compensator 162. Then interlock delay sequencer 125 selects the K4(h–h_int) multiplier block and the change flag is reset so that blocks BW4 and BW5 select the normal vds and vqs signals. This is followed by a final clock trigger through P0-X which again synthesizes an integration of the artificial time step h–h_int.

The variables ZTC_d_lambda_dm_db and ZTC_d_lambda_qm_db are computed by Next State Contemplator 136 each time a Next State contemplation is executed. Specifically, variables ZTC_d_lambda_dm_db and ZTC_d_lambda_qm_db are calculated according to the following relations:

$$ZTC\_d\_lambda\_dm\_db = Re(Vintlk) - ZI\_drop\_d;$$
and
$$ZTC\_d\_lambda\_qm\_db = Im(Vintlk) - ZI\_drop\_q$$

where the vector Vintlk has direct and quadrature components in the general form of: Vintlk=a+jb; and where a=Re(Vintlk), b=Im(Vintlk) and where Vintlk is determined according to the rules of FIG. 13D, with the attendant considerations of current direction, and the present state and proposed next state Next State Contemplator 136 is considering. When the decision to make a change occurs and the change flag has been set, the variables ZTC_d_lambda_dm_db and ZTC_d_lambda_qm_db have been determined and are ready to be used by loss compensator 162.

Calculation block (K4*h) is used when no switch state is changing and so the algorithm tracks main flux linkage λm with use of the modified Gear Method discussed above applied to the Present State voltage. The calculation block (K4*h_int) is used when a state change has just occurred, and the interlock voltages are chosen. The K4*(h–h_int) is used to complete integration for the remaining time (within the interlock delay period time step h) using the Next State voltage. Interlock delay sequencer 125 provides coordination to binary logic switches BW2 and BW3 such that the variables passing through binary logic switch BW4 and BW5 are each multiplied by the appropriate Gear Method integrator coefficient discussed above. This operation results in the generation of the K4 term of the integrator relation discussed above which is then summed to the other three terms (i.e. K1, K2, and K3) by summer SUM11 and SUM12.

Shift registers SR3, SR4, SR5, SR6, SR7 and SR8 are used to set up and generate the K1, K2, and K3 terms of the Gear Method integrator relation. Specifically, when the trigger PO-X is provided by Interlock Delay Sequencer 125, shift registers SR3, SR4, SR5, SR6, SR7 and SR8 operate to transfer the input value representing d and q values to the input of the next shift register and to time delayed flux value to a block (K1, K2, K3) as appropriate. These K1, K2 and K3 terms are then summed at summer SUM11 or SUM12, respectively along with the appropriate K4 term as described above.

FIG. 14B illustrates the specific calculation steps that are executed by main flux predictor/corrector 164 during a series of switch state transitions as discussed above. The processing of these steps is conducted sequentially, each step being executed in increments of the step size "h" as shown. When operating in one state, main flux predictor/corrector 164 executes the integration process h-step by h-step using the ideal voltage derivations shown in FIG. 7B. When no switch state transitions take place, the integrator simply integrates a series of h-wide pulses. In this mode of operation, changes on the DC link voltage are efficiently integrated, especially if the rate of change of the DC link is relatively slow compared to h (which is typically true). This aspect allows control system 100 to perform exceptionally well in the presence of voltage variation of VDC.

When Next State Contemplator 136 determines that a change of state is necessary, the previously mentioned interlock delay rules are used to establish the interlock voltage which is known to exist for interlock delay h_int which is typically on the order of microseconds. Also, the interlock delay h_int is typically, but not necessarily less than the system time step "h". In the case where a switch state transition is required, an altered sequence of integration is utilized, best illustrated by reference to the process flow representation within FIG. 14B.

Generally, at time x, there is no change in switch state and the power circuit switches remain stable and the applied voltage can be determined as indicated by the relations shown in FIG. 7B. Accordingly the modified Gear Method integration function of control system 10 and 100 is utilized where pn+1, representing the quantity to be integrated, is utilized to produce the necessary estimated integrals of the power circuit 14. Specifically, at time x, there is no change in switch state and the applied voltage can be determined as indicated by the relations shown in FIG. 7B. Accordingly, the modified Gear Method integration function of control system 10 and 100 is utilized where pn+1, represents the quantities to be integrated and vdm and vqm of FIG. 14A are used to produce d and q axis volt-second integrals of magnetization flux ZTC_lambda_dm_np1 and ZTC_lambda_qm_np1 respectively. Generally, at time x+h and x+2 h as demonstrated in FIG. 14B, there is still no change in the switches and the Gear Method is simply evaluated in these cases (pn+1 is still calculated as indicated by the relations shown in FIG. 7B. Finally, at time x+3 h Next State Contemplator 136 determines that a switch state change is required. In response, a multi-step integration is conducted by Interlock Delay Sequencer 125 to emulate the volt-seconds gained (or lost) due to the interlock voltage during the interlock period.

The multi-step integration is illustrated by the two equations that are executed at time x+3 h (marked with a box in FIG. 14B) in order to correct the output voltage of power circuit 114. Specifically, the K4 term of the first equation provides the calculation based on pn+1 being obtained in accordance with the interlock rules of FIG. 13D. The K4 term of the second equation provides the calculation based on pn+1 being obtained in accordance with the relations shown in FIG. 7B for the time remaining in time step "h". For times x+4 h, x+5 h, and x+6 h the pn+1 term is obtained in accordance with the relations shown in FIG. 7B since Next State Contemplator 136 determines that no switch state transition occurs at these times.

Figure 15:
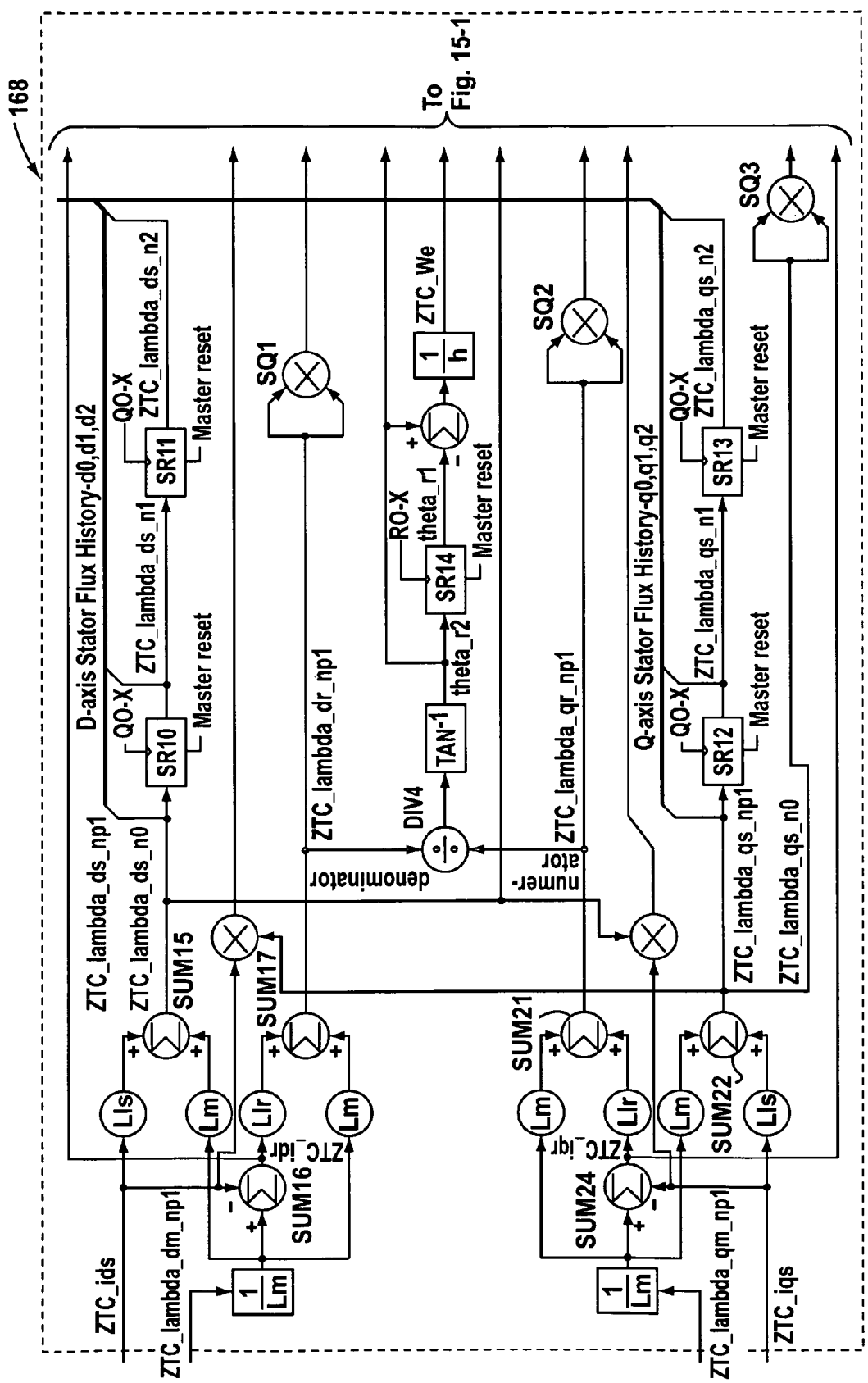
Figures 1, 15:
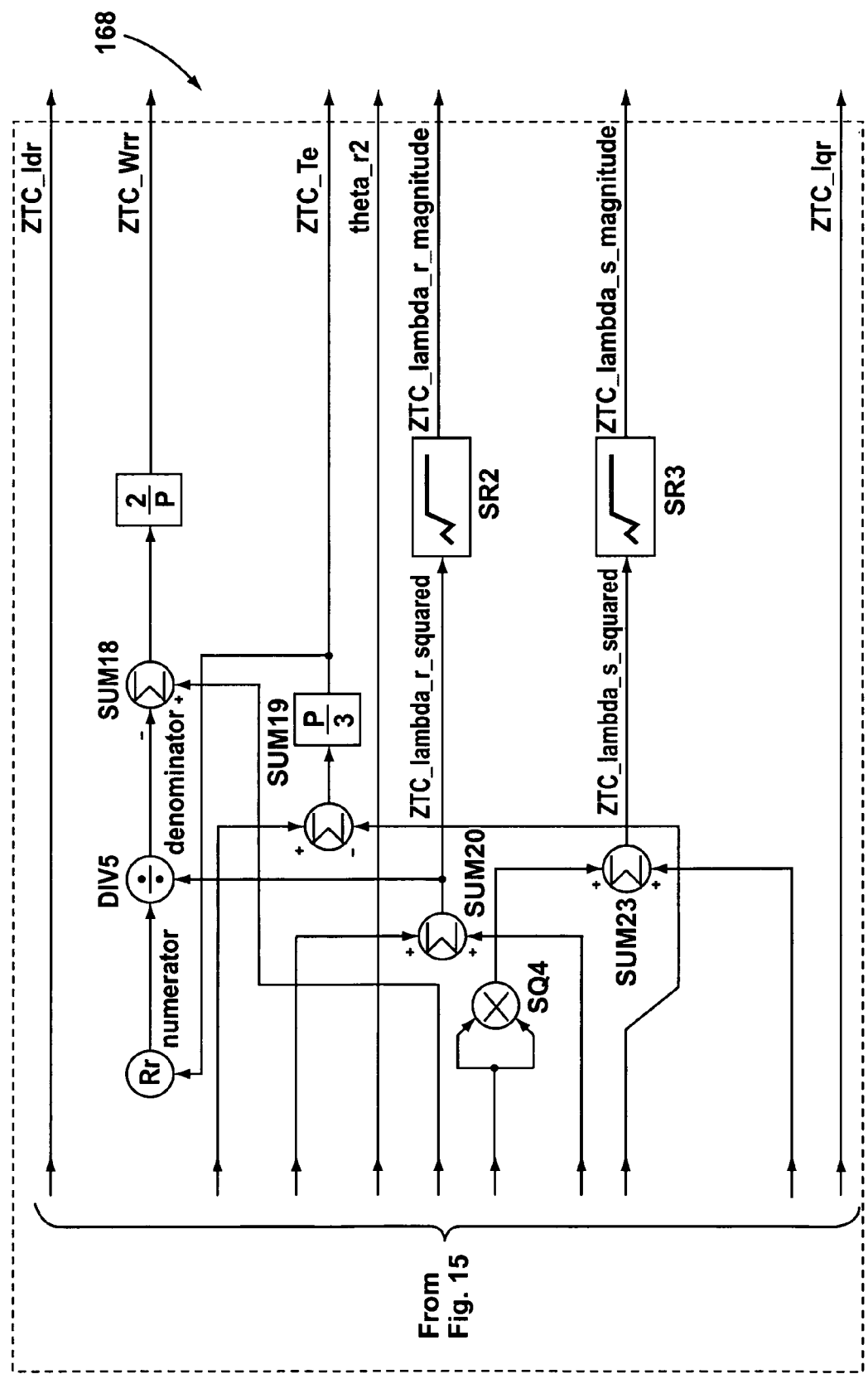

FIG. 15 illustrates the functional workings of Motor Characteristics Calculator 168. Referring also to FIG. 12A, the entire motor model characteristics can be determined by embedded simulator 124 once main flux linkage λm has been determined. Specifically, Im can be calculated since λm=(Lm*Im). Rotor current Ir can be calculated using the relation Ir=Im−Is. Then, λr can be calculated from Ir using the relation λr=(Llr+Lm) Ir+LmIs and λs can be calculated from Is using the relation λs=(Lls+Lm) Is+Lmir. Finally, from Is and λs, the internally developed electrical torque Te can be calculated. The main circuit characteristic of interest for the purposes of control is λs and torque Te. Once Motor Characteristics Calculator 168 determines key motor characteristics (e.g. torque, speed, etc.), the processing devoted to the decisions to change switch state or not to change switch state, when a change is determined necessary, and determining what the switch state should be, then take place.

Shift registers SR10, SR11, SR12 and SR13 are used to maintain the time shifted values of the last three sampled stator flux computations (i.e. ZTC_lambda_ds_n0, ZTC_lambda_ds_n1, ZTC_lambda_ds_n2, ZTC_lambda_qs_n0, ZTC_lambda_qs_n1, and ZTC_lambda_qs_n2). The set of three d-axis, and three q-axis samples of the stator flux are referred to as the stator flux "history". This history is used by Next State Contemplator 136 in conjunction with Main Flux Predictor/Corrector 164 to conduct "trial-run" computations as part of the cognitive process associated with choosing a Next State. The variables ZTC_lambda_ds_np1, and ZTC_lambda_qs_np1 are equivalent to the vector $\lambda_s$ which represents stator flux (i.e. main flux linkage) in FIG. 12A where the vector $\lambda_s$=ZTC_lambda_ds_np1+j ZTC_lambda_qs_np1.

Other motor model characteristics can be derived from the stator flux vector $\lambda_s$=ZTC_lambda_ds_np1+j ZTC_lambda_qs_np1. For example, rotor current, represented by the variables ZTC_idr, ZTC_iqr (the d and q axis representation of the rotor currents Idr and Iqr, respectively) can be calculated from the stator flux vector. Variables ZTC_idr, ZTC_iqr are determined by calculating the vector difference between the magnetization current vector Im, and the stator current vector Is as shown in FIG. 12A. These variables are determined within Motor Characteristic Calculator 168 by passing variable ZTC_lambda_dm_np1 and 1/Lm through block (1/Lm) and subtracting variable ZTC_ids from the result using summer SUM16. The same is done with the variables ZTC_lambda_qm_np1 and ZTC_iqs through summer SUM 24.

The output variable ZTC_Wrr represents the angular shaft velocity (speed) of motor circuit 112, and is an important variable for external systems such as conventional motor drive systems which typically need an outer loop speed control system and require a speed feedback variable upon which to regulate. Since the present invention is a sensorless control algorithm, it is important for the proper operation of control system 100 to determine a speed feedback variable. As shown in FIG. 15, variable ZTC_Wrr is calculated by evaluating the relation: ZTC_Wrr=2/P*(ZTC_We−(Rr*ZTC_Te/ZTC_lambda_r_squared)). Specifically, variable ZTC_Wrr is calculated from variable ZTC_We which is the present inferred sample of the stator electrical instantaneous frequency (i.e. derivative of stator flux angle) by adding it (at summer SUM18) to the negative value of Rr divided by ZTC_lambda_r_squared (at divider DIV5) and then by passing it through multiplier block 2/P. The variable ZTC_We is calculated according to the relation: ZTC_We=(theta_r2−theta_r1)/h where theta_r2 and theta_r1 represent the present and last samples of the rotor flux angles.

As shown in FIG. 12A, the internal electrical torque developed by the machine, Te (i.e. represented by the output variable ZTC_Te) can be determined from the relation: Te=P/3 [Lambdads*Iqs−Lambdaqs*Ids].

Accordingly, the variable ZTC_Te is calculated within motor characteristic calculator 168 (FIG. 15) by taking variable ZTC_ids and multiplying it by ZTC_lambda_qs_n0 and subtracting the result from the variable produced by multiplying ZTC_iqs by ZTC_lambda_ds_n0 and multiplying the final result by P/3. It should be noted that the Te calculation (also known as ZTC_Te) shown in FIG. 12A is ZTC_Te=(P/3)*(ZTC_lambda_ds_n0*ZTC_iqs−ZTC_lambda_qs_n0*ZTC_ids can be replaced with the relation ZTC_Te=(P/3)*Lm*(ZTC_idr*ZTC_iqs−ZTC_iqr*ZTC_ids).

The variable theta_r2 represents the rotor flux angle. The rotor flux angle is used to determine the position of the ideal stator flux vector relative to the rotor flux vector. Variable theta_r2 is calculated according to the relation: theta_r2=arctangent (ZTC_lambda_qr_np1/ZTC_lambda_dr_np1). Specifically, variable ZTC_lambda_qr_np1 (sample q-axis rotor flux) is divided by ZTC_lambda_dr_np1 (sample d-axis rotor flux) at divider DIV4 and then the arctangent is taken of the result at block TAN$^{-1}$.

The variable ZTC_lambda_r_magnitude is the magnitude of the rotor flux vector and is required in subsequent blocks for computation of the ideal stator flux vector. Variable ZTC_lambda_r_magnitude is calculated from the relation: ZTC_lambda_r_magnitude=square root of ((ZTC_lambda_dr_np1*ZTC_lambda_dr_np1)+(ZTC_lambda_qr_np1*ZTC_lambda_qr_np1)). Variable ZTC_lambda_dr_np1 is squared at squared block SQ1 and variable ZTC_lambda_qr_np1 is squared at squared block SQ2 and then summed together at summer SUM20 and then finally the square root is taken of the sum at square root block SR2.

The variable ZTC_lambda_s_magnitude is the magnitude of the stator flux vector, and is required in the Present State Contemplator 128 in conjunction with the ideal stator flux vector reference to determine whether or not a change of switch state should be contemplated. Variable ZTC_lambda_s_magnitude is equal to the square root of ((ZTC_lambda_ds_np1*ZTC_ambda_ds_np1) +(ZTC_ambda_qs_np1* ZTC_lambda_qs_np1)). Specifically, variable ZTC_lambda_ds_np1 is squared at squared block SQ4 and variable ZTC_lambda_qs_np1 is squared at squared block SQ3 and then summed together at summer SUM23 and then finally the square root is taken of the sum at square root block SR3.

Figure 16:
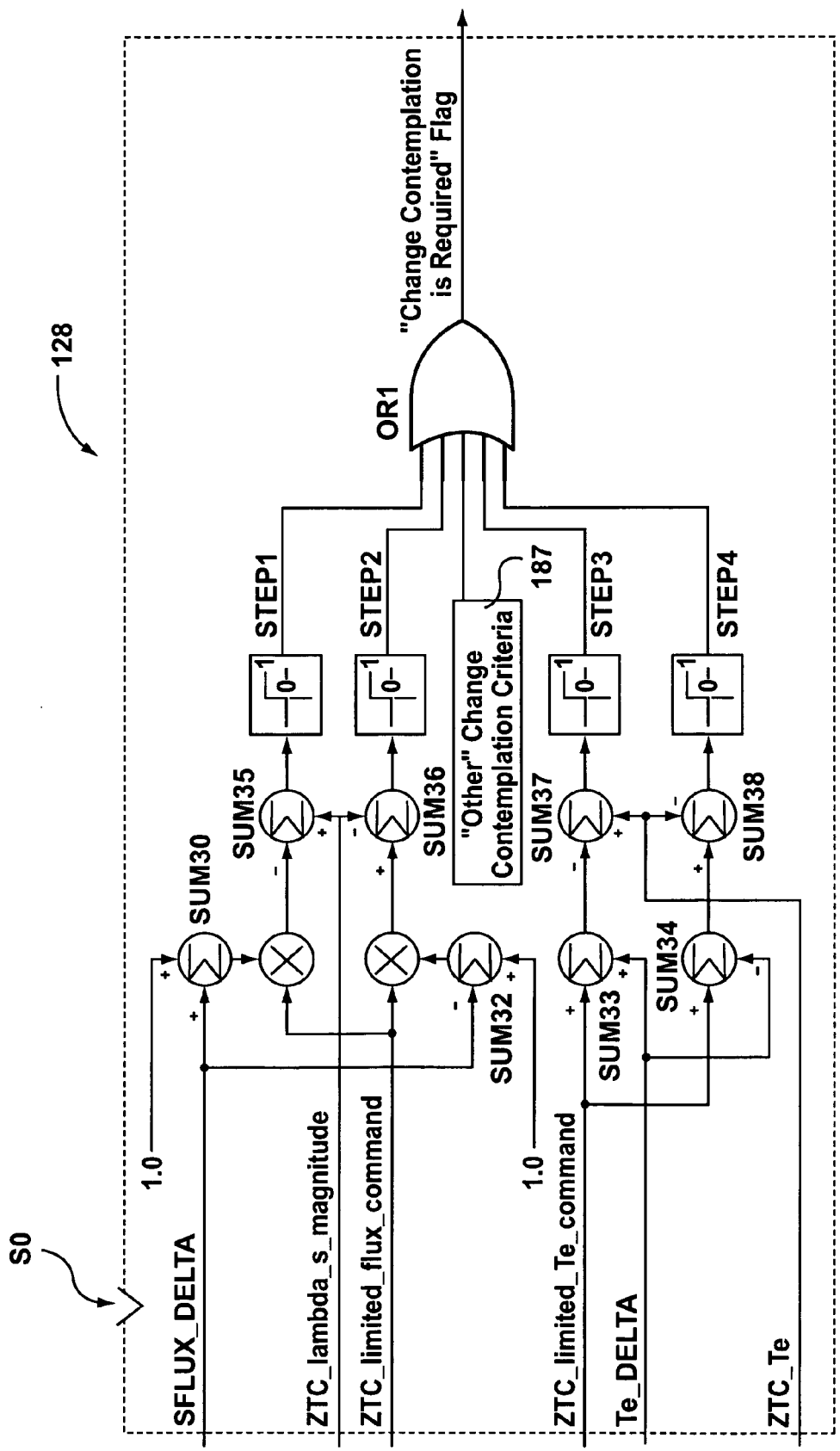
FIG. 16 is a schematic diagram of the Present State Contemplator of FIG. 5A.

FIG. 16 illustrates the logic circuitry of Present State Contemplator 128 which utilizes a set of reference specifications stored in Change of State Criteria Module 126 along with a number of calculated measures relating to the ideal stator flux vector to determine whether or not a change of switch state is to be contemplated.

Specifically, Present State Contemplator 128 receives input variables from Ideal Stator flux Calculator 180 (shown in FIG. 18), namely the ideal stator flux reference magnitude |λ_s|* (i.e. variable ZTC_limited_flux_command), the actual torque Te (i.e. variable ZTC_Te), and the actual flux magnitude |λ_s|, (i.e. variable ZTC_lambda_s_magnitude). The input "ZTC_limited_Te_command" is similar to the variable Te* and is the torque command that is provided to the control system 100. Present State Contemplator 128 also receives a number of input variables from Change of State Criteria Module 126, namely a tolerance measure for the stator flux vector (i.e. variable SFLUX_DELTA) and a tolerance measure for the electrical torque in induction motor 112 (i.e. single Te_DELTA).

Figure 22:
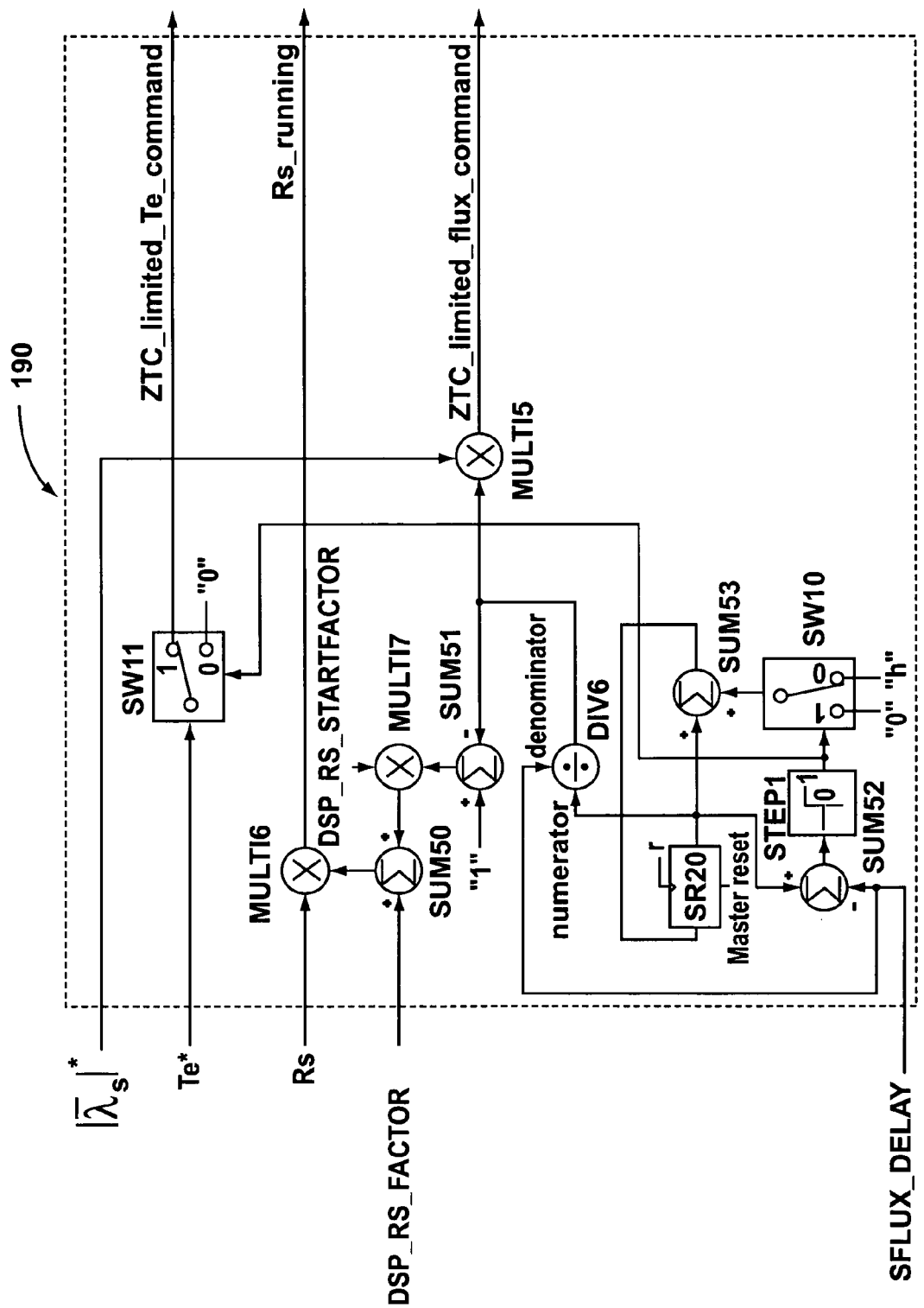
FIG. 22 is a schematic diagram of logic circuitry associated with Embedded Simulator and Sequential Processing Event Manager of FIG. 5A.

The variable SFLUX_DELTA defines a tolerance band about ZTC_limited_flux_command. The variable ZTC_limited_flux_command represents the present inferred sample of the stator flux magnitude reference and is similar to the stator flux magnitude reference |λ_s|*(as shown in FIG. 22), except that during a rotating restart sequence it is ramped over time from 0 to |λ_s|* as synchronization completes, as will be discussed. Accordingly, the variable SELUX_DELTA which represents a tolerance band, consists of two circles centered on the state-space origin, the first with radius: (1−SFLUX_DELTA)* ZTC limited_flux_command, and the second with radius: (1+SFLUX_DELTA)* ZTC_limited_flux_command. These circles define the region within which the stator flux vector magnitude must fall if there is not to be any next state contemplation. If this band is exceeded, next switch state contemplation will be triggered within Present State Contemplator 128. For example, the variable SFLUX_DELTA would allow a 10% variation to occur relative to the flux reference if the variable SFLUX_DELTA were set to 0.10.

The variable Te_DELTA is defined as an absolute torque value and defines a tolerance band about the actual torque, ZTC_Te having one positive and one negative limit. The positive limit is set to Te*+Te_DELTA and the second negative limit set to Te*−Te_DELTA (Te* is the torque reference). If the torque ZTC_Te falls outside the region defined by these limits, a next state contemplation will occur. For example, the variable Te_DELTA would allow a variation of 10 newton-metres of torque if the variable Te_DELTA was set to 10. The torque acceptance band is set up this way to allow the absolute torque quality to be controlled. It should be understood that other methods of acceptance band criterion could be used, even potentially types that vary with some other optimization target criterion.

Present State Contemplator 128 includes logic circuits which take the flux and torque tolerance measures discussed above, SFLUX_DELTA, Te_DELTA and determine whether the various stator flux and torque measures and predicted values fall within the allowable ranges. If so, then no change in switch state is contemplated. If not, then Present State Contemplator 128 indicates that a change in switch state should be contemplated (i.e. by sending the change contemplation is required flag to Next State Contemplator 136).

Specifically, variable SFLUX_DELTA is summed with reference value 1.0 at summer SUM30 and then multiplied with variable ZTC_limited_flux_command and the product is subtracted from the variable ZTC_lambda_s_magnitude (i.e. estimated sample of stator flux vector length) at summer SUM35. The result is then applied to the comparator STEP1 and if the output of comparator STEP1 is one then OR logic circuit OR1 will generate the change contemplation is required flag.

Variable SFLUX_DELTA is also subtracted from reference value 1.0 at summer SUM32 and the result multiplied by the variable ZTC_limited_flux_command (i.e. estimated sample of the stator flux magnitude reference) and the variable ZTC_lambda_s_magnitude is subtracted from the product at summer SUM36. The result is then applied to comparator STEP2 and if the output of comparator STEP2 is one then OR logic circuit OR1 will generate the change contemplation is required flag.

Variable Te_DELTA is summed with variable ZTC_limited_Te_command at summer SUM33 and the sum is subtracted from the variable ZTC_Te at summer SUM37. The result is then applied to the comparator STEP3 and if the output of comparator STEP3 is one then OR logic circuit OR1 will generate the change contemplation is required flag.

Variable Te_DELTA is subtracted from variable ZTC_limited_Te_command at summer SUM34 and from this result, variable ZTC_Te is subtracted at summer SUM38. The result is then applied to the comparator STEP4 and if the output of comparator STEP4 is one then OR logic circuit OR1 will generate the change contemplation is required flag.

Present State Contemplator 128 also includes an Other Change Criteria block 187 which can be used to provide additional next switch state contemplation criterion that can be OR'ed with the main torque and flux criterion through OR gate OR1 as described above. For example, Other Change Criteria block 187 may be configured to force a contemplation of a change of switch state after a certain fixed period of time in one switch state. This additional switch state change contemplation condition is useful in power systems where the gate driver must keep switching as part of its own operating requirement (e.g. in the case of a power system using bootstrapped gate drivers). It should be understood that various other types of switch state contemplation conditions could be used to improve the general operation of induction motor 112 as required.

Present State Contemplator 128 will set the change contemplation is required flag only when one or more of the change of state criterion has been exceeded (i.e. including the Other Change Criteria block 187). Hence, variables SFLUX_DELTA and Te_DELTA represent a user defined performance criterion and accordingly a target level of performance that can be adjusted as required to manage the performance to meet the motor drive application.

Prior art controllers have utilized the concept of hysteresis control for controlling motor torque and flux. The use of variables SFLUX_DELTA and Te_DELTA to determine when a change in switch state should be contemplated, provides a different result than what has been achievable from prior art hysteresis control techniques. This can be observed from the fact that if the variables SFLUX_DELTA and Te_DELTA are set to zero in prior art hysteresis schemes, the necessary switching frequency to achieve control would be infinite. In contrast, if SFLUX_DELTA and Te_DELTA are set to zero within control system 100, then every h-cycle becomes a Next State Contemplation, but the frequency will never burst to high levels, or exceed 1/h. When the variables SFLUX_DELTA and Te_DELTA are set to zero, the optimum control task becomes that of doing the best possible within the criterion established in the Next State Contemplator 136 also in view of the additional constraint of "h". In this case the Next State Contemplator 136 operates with h being the dominant constraint, and torque and flux ripple will be as small as possible given the available control capability of the system.

Figure 17A:
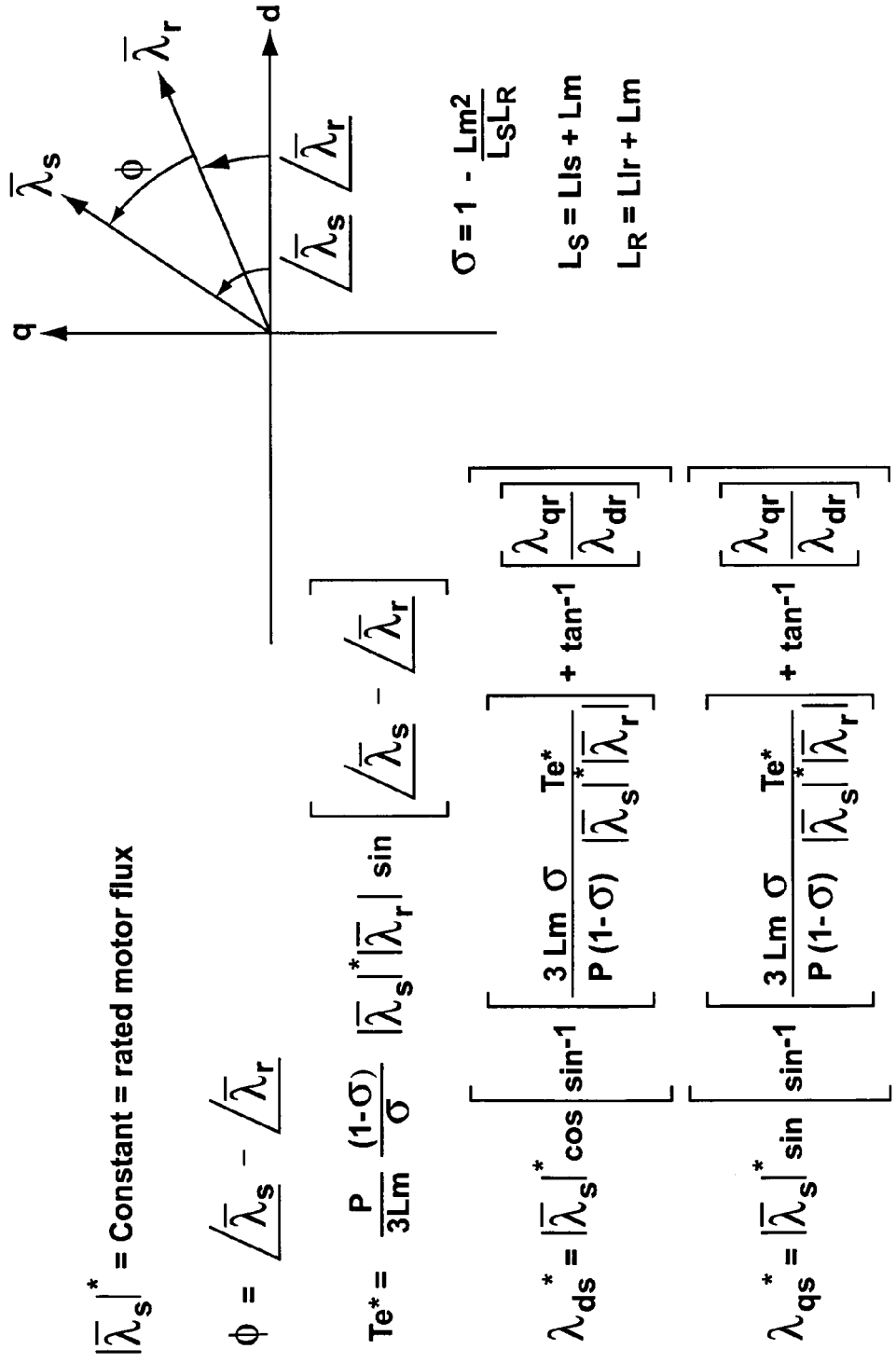

FIGS. 17A and 17B illustrate two well-known methods for determining the idea stator flux vector for an induction motor. In contrast to the well known prior art approach of selecting voltage vectors that "steer" the flux in the general direction of a target reference, control system 100 utilizes the concept of the "ideal" stator flux vector reference to determine when a change in switch state should occur. The ideal stator flux vector is: $\lambda_s^* = \lambda_{ds}^* + j \lambda_{qs}^*$. As previously discussed in respect of FIG. 15, rotor flux vector can be determined by motor characteristic calculator 168 using well-known motor model calculations. Accordingly, it is possible to determine the ideal stator flux vector in FIG. 17A that would exist when the Torque Te and the stator flux are exactly as commanded, with the addition of the rotor flux magnitude being the only variable that is being measured.

In FIG. 17A, Te* represents the torque reference, $|\lambda_s|^*$ represents the stator flux magnitude reference (i.e. typically constant rated motor flux) and the graph geometrically represents the mechanism of torque production within induction motor 112. As is conventionally known, the torque developed within induction motor 112 is proportional to the magnitude of the stator flux, times the magnitude of the rotor flux, times the sine of the angle between the two vectors. The torque equation listed in FIG. 17A can be used to determine the d-q axis components of the ideal stator flux reference that would result if Te* and $|\lambda_s|^*$ are prescribed, and $|\lambda_r|$ is the only real-time variable. The term P in the equations represents the number of poles associated with induction motor 112. The first method determines a reference vector that is used to position the stator flux vector relative to the rotor flux vector such that the desired torque and flux will be achieved. In so doing this, the angle between the stator flux and rotor flux vector varies from (−90) to (0) to (+90) degrees as torque is developed from (-maximum) to (0) to (+maximum). The first method (FIG. 17A) is useful for applications where torque is required quickly, for example load impact applications or where high speed dynamic performance is required such as in punch presses or machine tool drives.

The second method shown in FIG. 17B develops a vector reference to position the stator flux relative to the rotor flux vector such that the desired torque will be achieved, but with a fixed angle (typically 90 degrees since sin (90)=1 is optimal). Accordingly, the angle between the stator flux vector and the rotor flux vector remains fixed, but the magnitude of the stator flux vector changes from minimum to maximum as torque is developed and increases from minimum to maximum. This second method is useful fir energy savings applications such as fans and pumps where high dynamic performance is not the primary goal, rather energy savings are drivers to the application. Since many fans and pumps do not operate the motor at full torque, significant opportunity for savings can be achieved when the motor is operated at reduced or optimal flux levels. This possibility exists because of the fact that a motor operating under a fully magnetized condition and also with low shaft load tends to exhibit lower energy efficiency due to dominance of eddy current and hysteresis magnetic losses in this condition. In either approach, the final result is a d-q set of voltage references vds* and vqs*.

It should be understood that where the stator flux vector magnitude reference $|\lambda_s|^*$ is used to determine the ideal stator flux vector, it is possible to replace $|\lambda_s|^*$ with the actual measured $|\lambda_s|$ (also known as variable ZTC_lambda_s_magnitude). In the first method (FIG. 17A), the $|\lambda_s|^*$ is a DC command and has no ripple in it, and represents an "average" $|\lambda_s|^*$ command which can be of advantage in some situations. In the second method (FIG. 17B), the actual $|\lambda_s|$ value contains ripple but is a more accurate representation compared to when using $|\lambda_s|^*$ and this may be advantageous in some applications.

Figure 18:
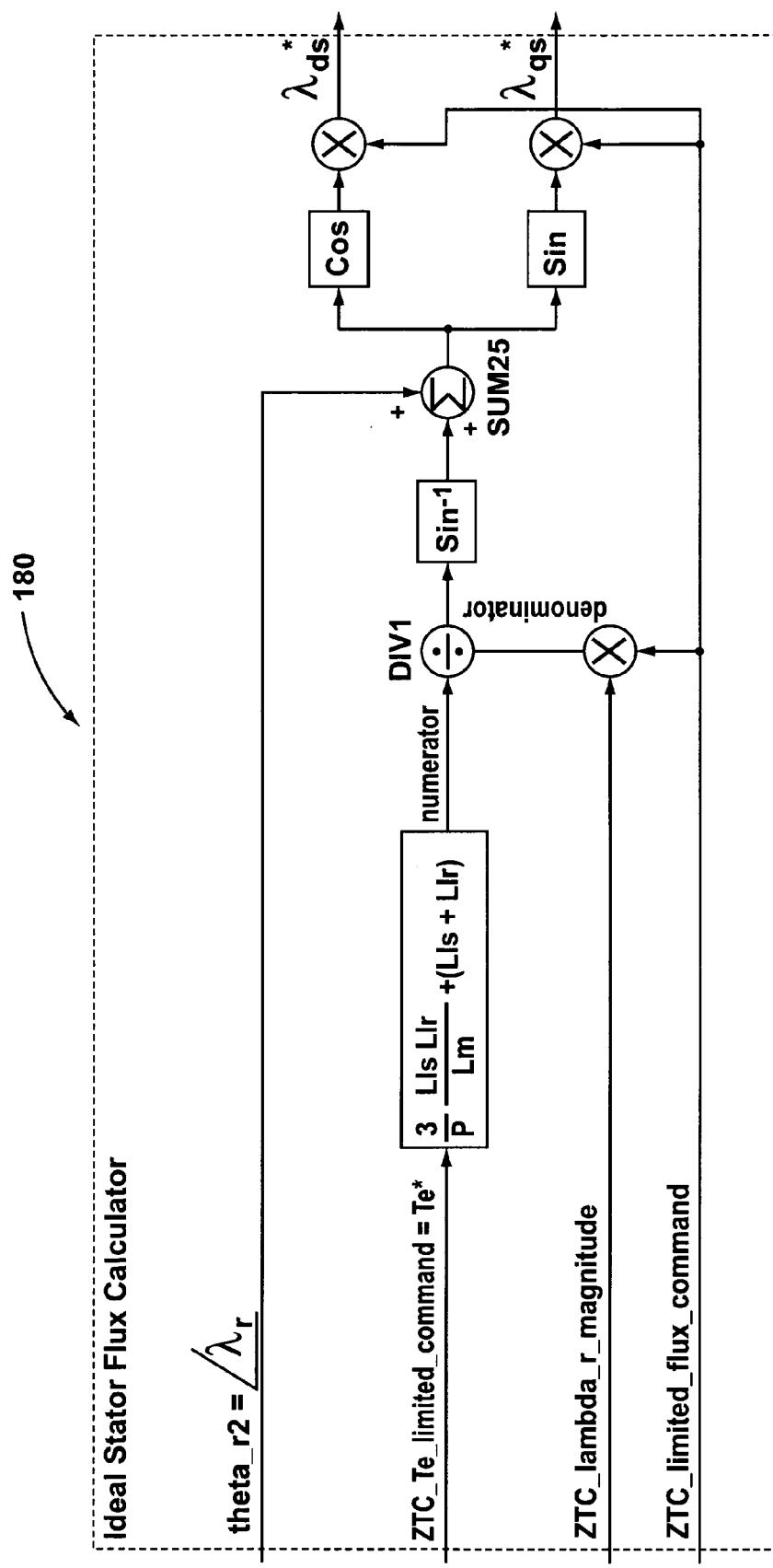
FIG. 18 is a schematic diagram of the ideal stator flux reference calculator block of the Next State Contemplator of FIG. 5A.

FIG. 18 is a schematic diagram of the logic circuitry of ideal stator calculator 180 which implements the first method (FIG. 17A) for determining ideal stator flux. Ideal stator flux reference calculator 180 is located within Next State Contemplator 136 and receives various inputs from Embedded Simulator 124 as well as from Parameter Module 130. Specifically, variable theta_r2 (which represents the present inferred sample of rotor flux angle), the variable ZTC_limited_Te_command (which represents the present inferred sample of the torque reference), the variable ZTC_lambda_r_magnitude (which represents the magnitude of the rotor flux vector), and the variable ZTC_limited_flux_ommand (which represents the present inferred sample of stator flux magnitude reference) are all provided. Ideal stator calculator 180 utilizes these variables to generate variables $\lambda_{ds}^*$ and $\lambda_{qs}^*$ which represent the present stator flux vector d-axis reference and q-axis reference (i.e. the "ideal" stator flux vector), respectively.

Referring to FIGS. 17A and 18, the output variable $\lambda_{ds}^*$ is calculated by first passing variable ZTC_Te_limited_command through the multiplier block 3/P*((Lls*Llr/Lm)+(Lls+Lir)) and then providing the result as a numerator to divider DIV1 for division by the variable ZTC_lambda_r_magnitude multiplied by ZTC_limited_flux_command. The result of divider DIV1 is provided to the inverse SIN block and then summed with the variable theta_r2 by summer SUM25. The output of summer SUM25 is then provided to COS block, the result of which is multiplied by the variable ZTC_limited_flux_command. The output variable $\lambda_{qs}^*$ is calculated in a similar way, but instead of taking the cosine of the result of summer SUM25, the sine of the result is taken (using SIN block) and multiplied by the variable ZTC_limited_flux_command.

The relation 3/P*((Lls*Llr/Lm)+(Lls+Lir)) is based on a derivation from the well-known relations, Te*=P/(3Lm)* [(1−σ)/σ]$|\lambda_s|^*|\lambda_r|$ sin [φ], and σ=1−(Lm²/Ls Lr) as shown in FIG. 17C.

Figure 19:
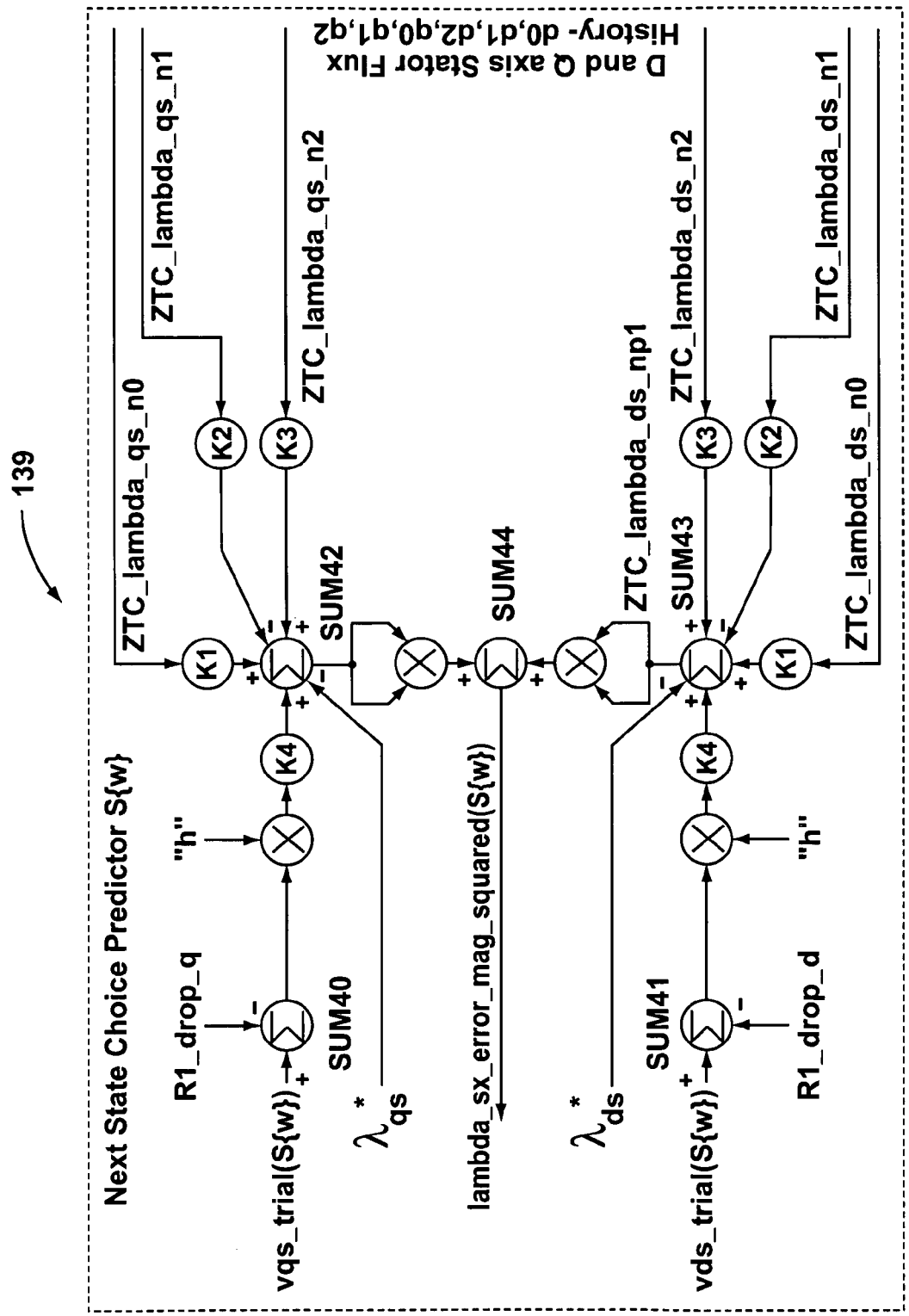
FIG. 19 is a schematic diagram of the next state choice predictor block of the Next State Contemplator of FIG. 5A.

FIG. 19 is a schematic drawing of the logic circuits of next state choice predictor 139 of Next State Contemplator 136 which determines the best available Next State based on a set of performance constraints provided by Next State Choice Criteria Module 134. Four trial runs are conducted of four different fictitious induction motors 112 (i.e. each having the four different operational characteristics associated with four different Next Switch States). When Sequential Processing Event Manager 120 triggers Next State Contemplator 136 (i.e. T0 trigger through AND gate AND1) and when Present State Contemplator 128 sends the change contemplator is required flag, next state choice predictor 139 runs four trial runs of four different possible outcomes for induction motor 112 based on the associated switch states and associated line neutral voltages or stator voltages (i.e.

V0 to V7). It should be understood that the Present State is also considered as one of the four potential Next States that is evaluated in this manner.

Next state choice predictor 139 receives variables vds_trial (S(w)), vqs_trial(S(w)) (which represent the ideal d and q axis of a trial-run voltage for the trial-run simulation, i.e. for S{w} where w={a,b,c}}), $\lambda_{qs}^*$, $\lambda_{ds}^*$ (which represent the d and q axis present stator flux reference voltage), RI_drop_d, RI_drop_q (which represent the d and q axis present inferred sample of the stator resistive voltage drop), time step size "h" (i.e. the net sample, convert and process time step), and ZTC_lambda_qs_n0, ZTC_lambda_qs_n1, ZTC_lambda_qs_n2 (the present (t), last (t-h) and last last (t-2 h) inferred samples of d and q axis stator flux) from main flux predictor/corrector 164. Next state choice predictor 139 outputs variable lambda_sx_error_mag_squared(S(w)) which is utilized within Next State Choice Criteria 134 to chose the state with the minimum squared error (i.e. Next State Choice Criteria 134 will also receive values for the other three potential next switch states).

Referring to FIGS. 2 and 19, each Present State is limited to four possible Next States for the particular finite state machine 50 utilized by control system 100. That is, for each switch state in FIG. 2, it can be viewed as a Generic State (i.e. having a "no change" vector), with three possible "change" vectors (i.e. representing the three other Next States). The "no change" vector is denoted as S{w}, where w={a,b,c} represents the binary command pole command. The change vectors are denoted similarly, as S{x}, S{y} and S{z}. According to the transition constraints illustrated in FIG. 2, any Present State having vector {a,b,c} will have a unique set of possible choice transition vectors, w (i.e the "no change" vector), x, y and z (i.e. the three FIG. 2 "change" vectors).

FIG. 19 illustrates how variable RI_drop_q is subtracted from (ideal stator trial voltage) variable vqs_trial (S(w)) using summer SUM40, the result of which is multiplied by the time step size "h". This is then multiplied by the Gear Method constant K4 using the K4 block. This value along with the sum of the various Gear Method multiplier constants K1, K2 (negative) and K3 with their respective past sampled values of q-axis stator flux (i.e. the q axis stator flux history) is summed by summer SUM42 to the negative value of variable $\lambda_{qs}^*$ (which represents the q axis present stator flux reference voltage). Finally, the output of summer SUM42 is squared in value and added to the corresponding output from the "d" side of the logic circuit.

Specifically, variable RI_drop_d is subtracted from variable vds_trial (S(w)) using summer SUM41, the result of which is multiplied by the time step size "h" and then multiplied by the Gear Method constant K4. This value along with the product of the various Gear Method multiplier constants K1, K2 (negative) and K3 with their respective past sampled values (i.e. the d axis stator flux history) of d-axis stator flux is summed by summer SUM43 to the negative value of variable $\lambda_{ds}^*$. Finally, the output of summer SUM43 is squared in value and added to the corresponding output from the "d" side of the logic circuit by summer SUM44, the result of which is the variable lambda_sx_error_mag_squared(S(w)).

Figure 20:
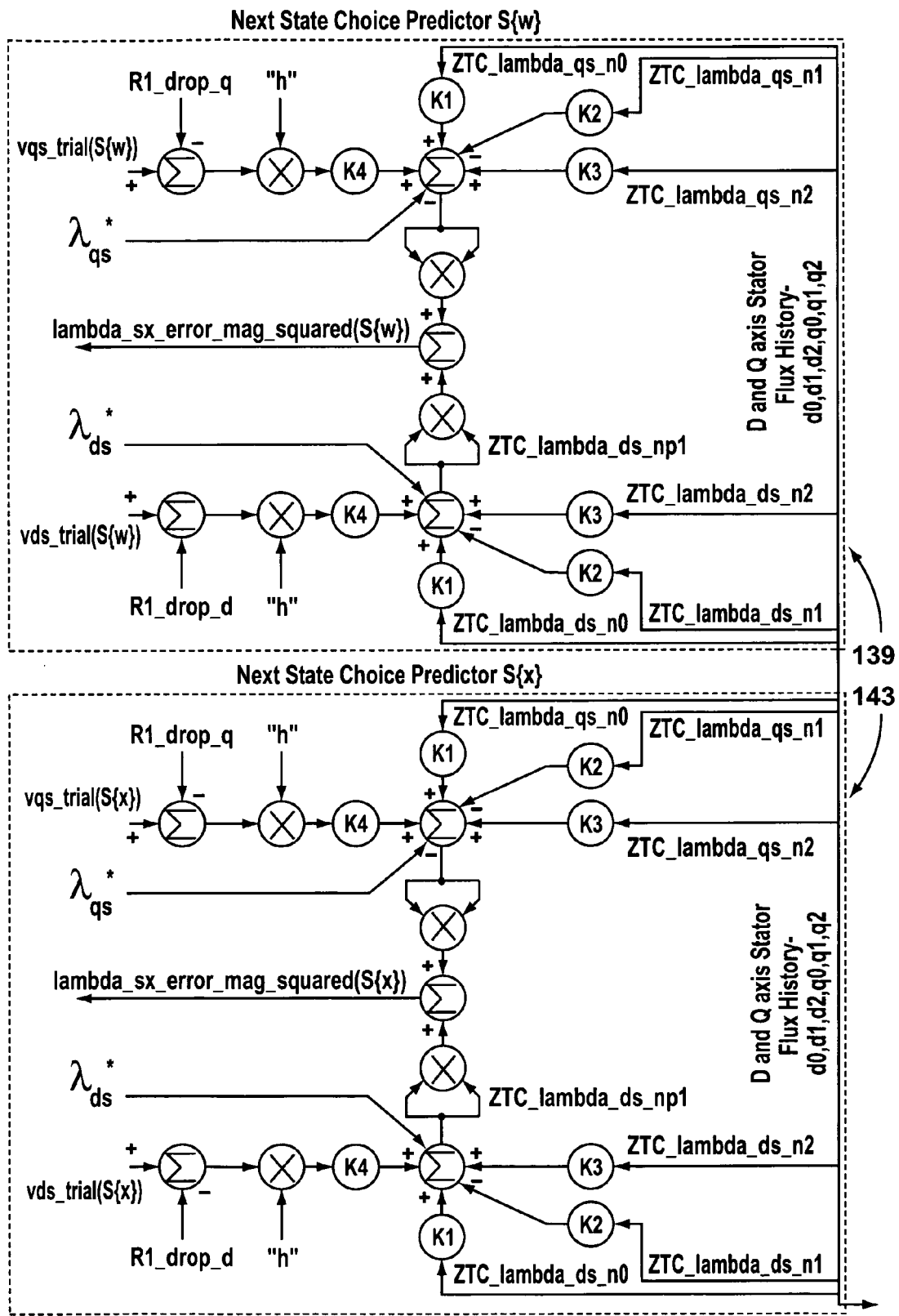
Figures 1, 20:
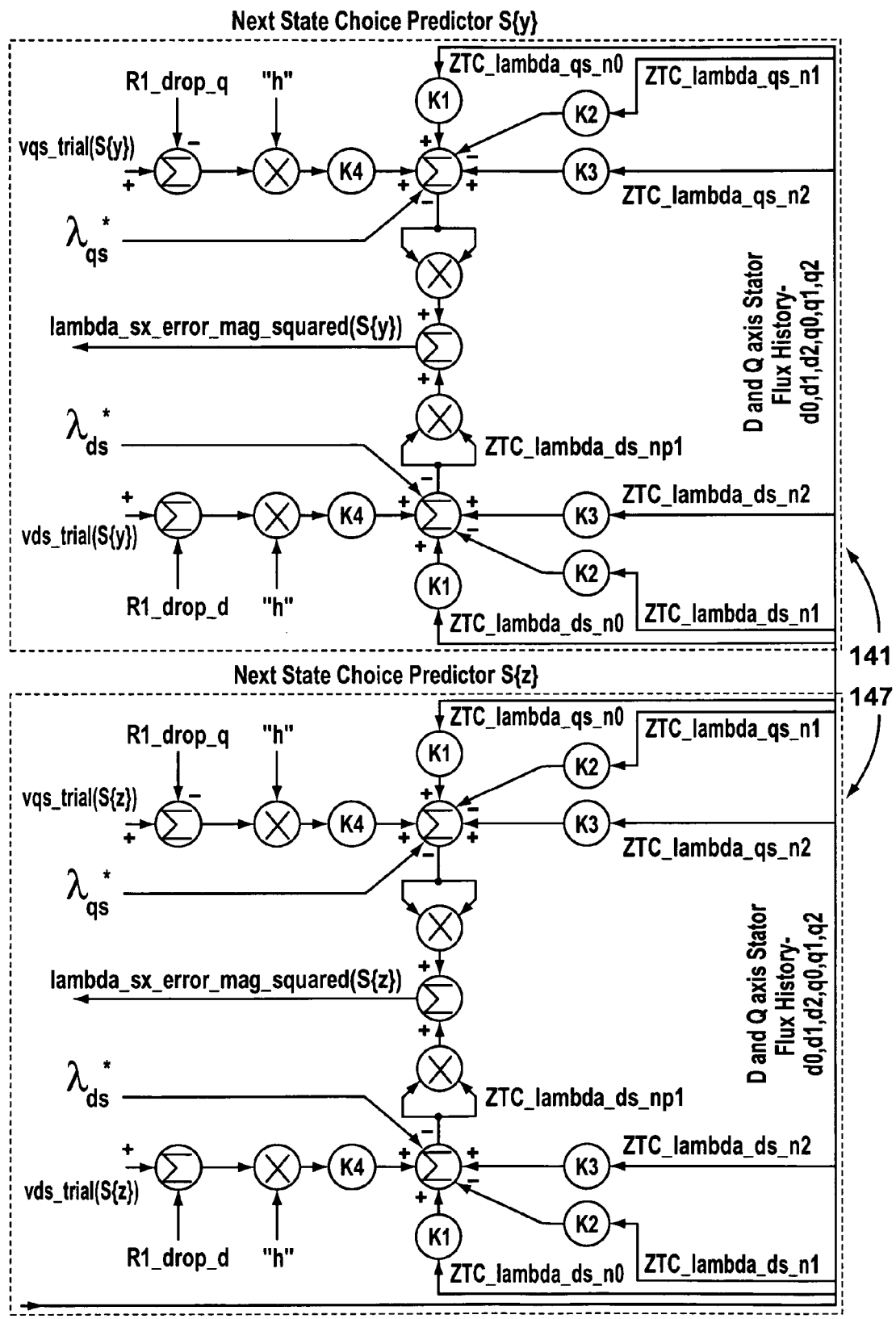

FIGS. 20 and 20-1 taken together show the four next choice predictors 139, 141, 143 and 147 required to carry out the necessary prediction processes for the four potential Next State vectors S{w}, S{x}, S{y}. and S{z}. Next State Contemplator 136 is designed to run four "trial runs" to produce four "lambda_sx_error_mag_squared" values. Hence four logic circuits such as the one shown in FIG. 19 are used, each with different vds_trial_run,vqs_trial_run values. For each trial run, the result is the value lambda_sx_error_mag_squared (S(w, or x, or y, or z as appropriate)) which represents a predicted error for the final stator flux trajectory. Next State Contemplator 136 compares the relative magnitude of the errors generated by next state choice predictors 139, 141, 143, and 147 and selects the Next State that achieves the minimum error magnitude. While the square root of the error could have been taken, it would pose no computational advantage, since the comparison between the size of squared values and non-squared values will be the same in any event. Accordingly, the task of Next State Contemplator 136 is to decide which of the four possible transitions is the best (i.e. which Next State is the best) by minimizing error magnitude.

Figure 21:
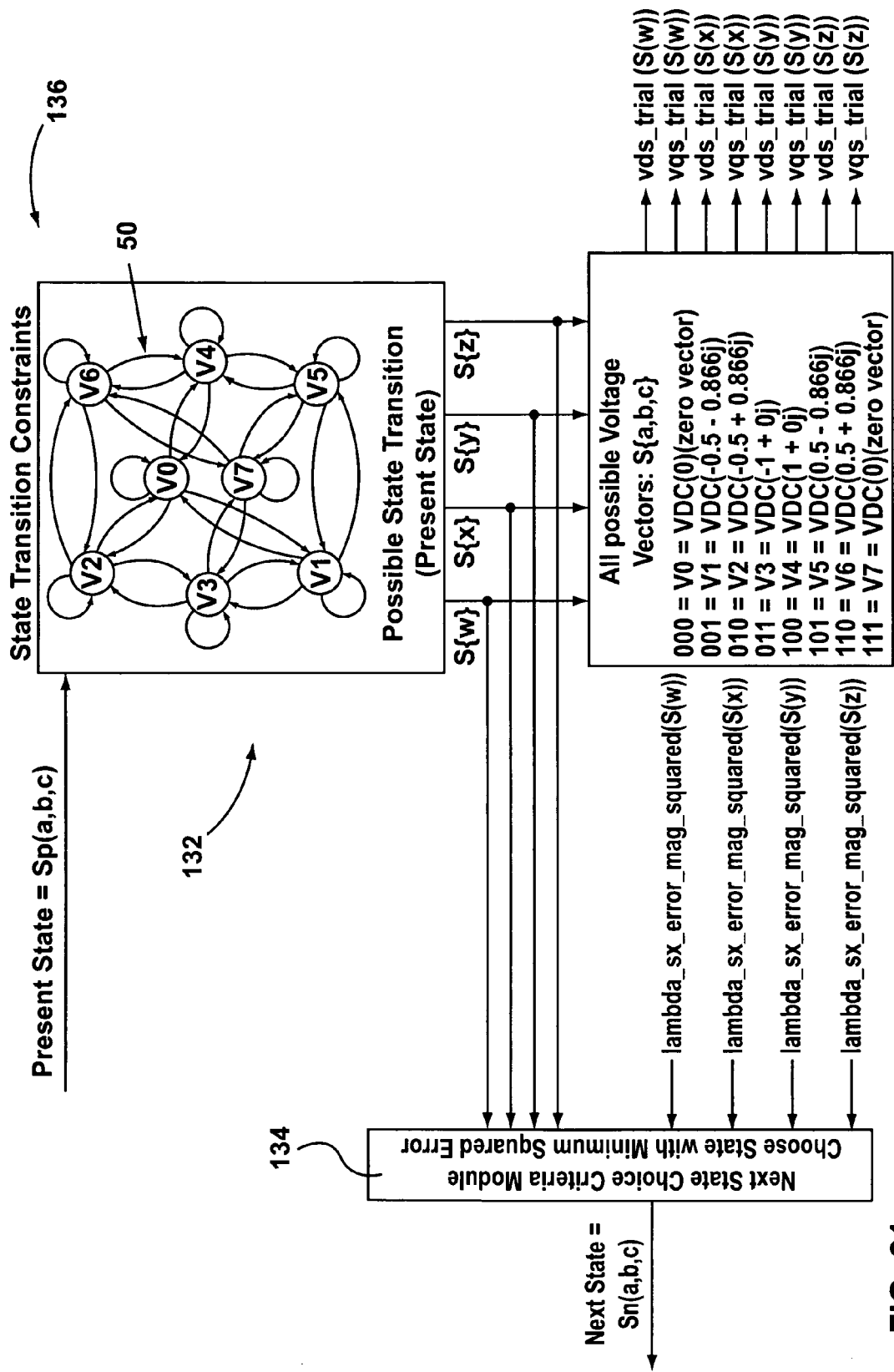
FIG. 21 is a schematic diagram illustrating the processes executed by the State Transition Constraints Module, the Next State Choice Criteria Module, and the Next State Contemplator of FIG. 5A.

FIG. 21 illustrates how the Present State is used to determine the trial voltages according to the present switch configuration of power circuit 114 (also shown in FIG. 7B), the embedded simulator 124 runs the four trial run simulations, and then how Next State Choice Criteria Module 134 chooses the optimal Next State by selecting the state with the minimum squared error. It is important to note that the criterion stored within Next State Choice Criteria Module 134 may also include other criteria (e.g. analogous to the "other criteria" utilized for contemplation of Next State within Present State Contemplator 128). The history of the stator flux trajectory stored within main flux predictor/corrector 164 is loaded into each of the trial run simulation models (i.e. next state choice predictors 139, 141, 143, 147) before a trial run simulation is done. The convergent properties of the Gear Method predictor/corrector associated with the use of past variable history, are harnessed by Next State Contemplator 136.

FIG. 21 illustrates how for a particular Present State, finite state machine 50 stored within State Transition Constraints Module 132 are used to generate the four possible Next States (i.e. S(w), S(x), S(y), and S(z)). Next State Contemplator 136 computes and considers the squared error generated for each of these potential four Next States and determines which Next State has a minimum squared error to arrive at the optimal Next State. It should be understood that this method assumes that the value of RI_drop remains constant during the time step h, which is not completely accurate. However, owing to the fact that the decision to switch between states is based on an identical comparison technique, with identical data, this is still a highly reliable approach. Also, it should be understood that up to eight trial-runs could be conducted for finite state machine 50 (i.e. since there are eight states in total).

Rotating Restart

FIG. 22 is a schematic drawing of Rotating Restart Module 190 of control system 100 that provides rotating restart functionality to induction motor 112 by instituting a sequential set of restart operational procedures every time control system 100 is enabled. Rotating Restart Module 190 is implemented in both Embedded Simulator 124 and Sequential Processing Event Manager 120. Rotating Restart Module 190 is just one of many possible embodiments of the controlled start-up rotating restart sequence that can be adopted by Embedded Simulator 124 and Sequential Processing Event Manager 120 to achieve rotating restart functionality for control system 100.

When control system 100 and power circuit 114 are disengaged from induction motor 112, and none of the power switches are switching, the rotor and stator flux state variables are unknown due to the lack of information flow within control system 100. Prior to a rotating restart, induction motor 112 is spinning with little no current or flux present within. In such a case, it is necessary to provide a reliable means of providing control system 100 with initial motor characteristics (e.g. most importantly the main motor flux), so that the motor model generated by Embedded Simulator 124 becomes congruent with the actual induction motor 112 as quickly as possible.

With zero torque command, the desired synchronization of the motor can only occur with the electrical frequency exactly matching the motor speed (with the appropriate P/2 factor) (i.e. the three phase output voltage being equal in amplitude to the motor terminal voltage and the output voltage rotating at a frequency that corresponds to the shaft angular velocity of induction motor 112). Also, the low flux command will result in a minimal pulse width modulation (PWM) voltage being initially applied to the motor.

In speed regulated systems, a reasonably accurate motor model must be obtained (i.e. sensor-less feedback speed variable ZTC_Wrr must be valid), so that the speed regulator can be released into control of Te*. To achieve rotating restart, the power circuit 114 and control system 100 must engage induction motor 112 to provide Embedded Simulator 124 with enough information to begin tracking the operation of induction motor 112. However, this must be accomplished in a controlled manner so as to not produce high torque and/or current transients.

Variables with memory (i.e state variables) are reset to 0 within control system 100. Typically, after a few seconds, the actual motor fluxes decay to levels approaching zero. Initially when power circuit 114 is enabled, it is enabled with a zero torque command and a zero flux command. That is, switch SW11 is configured to bypass the normal Te* torque command and to replace it with "0" torque command when triggered so that the variable ZTC_limited_Te_command is either equal to the normal Te* torque command or to zero as desired. Switch SW10 is configured to select a value "h", at the start of the rotating restart when ZTC_limited_flux_command is ramping from zero to the final stator flux reference value. The quantity "h" is summed with the output of shift register SR20 through summer SUM53. Shift register SR20 is clocked once every h step, such that the output of SUM53 is fed back into the input of SR20 and becomes an output later for the next h step.

Accordingly, during the rotating restart sequence the output of shift register SR20 counts upwardly from 0 in increments of "h" until the output of summer SUM52 formed by summing the output of shift register SR20 minus a constant SFLUX_DELAY value, just exceeds the SFLUX_DELAY value causing the output of comparator block STEP1 to change from "0" to "1" and activating switch SW10 to select the "0" value instead of the "h" value. Once switch SW10 selects the "0" value, the counter is prevented from incrementing further.

The output of divider DIV6 ranges from 0 to 1, and this result is multiplied into the nominal stator flux magnitude reference $(|\lambda_s|)^*$ at multiplier MULT15 to produce the variable ZTC_limited_flux_command. In this way, the magnitude of the stator flux command (i.e. ZTC_limited_flux_command) is ramped from 0 to 100% of the nominal reference in a time equal to SFLUX_DELAY.

At the same time that the variable ZTC_limited_flux_command is ramping, the output of summer SUM51 ramps from 1 to 0 since it is produced by subtracting the 0 to 1 values from "1" at summer SUM51. The result is multiplied by the variable DSP_RS_STARTFACTOR at MULT17 and the result is summed with variable DSP_RS_FACTOR at summer SUM50. The result is multiplied by nominal Rs (i.e. stator resistance) using MULT16 producing the variable Rs_running. The net effect is to produce an Rs_running value used by Embedded Simulator 124, that starts initially at a higher value than nominal and ramps down to the nominal value. This process occurs simultaneously with the ZTC_limited_flux command varying from 0 to nominal stator flux command value.

As discussed, Sequential Processing Event Manager 120 is programmed to trigger Rotating Restart Module 190 such that variable ZTC_limited_flux_command is assigned a value that is ramped linearly from 0 to $|\lambda_s|^*$ (i.e. the present stator flux vector reference as previously discussed) over a period of time defined as SFLUX_DELAY. Control system 100 then slowly ramps the flux reference from zero to the desired flux command set-point which causes low current to flow initially, sufficiently low so that no overcurrent trip levels occur. The act of ramping the stator flux reference up slowly from zero assists in "pulling" the motor into synchronization smoothly to allow for any potential computation or variable acquisition errors that may exist. This can also be thought of as an initial probe into real induction motor 112. During this initial time, the motor model within control system 100 is attempting to produce zero torque, which can only occur at synchronous speed/frequency. As long as flux and current cross-product is reasonably accurate the algorithm will automatically develop an appropriate final synchronous frequency.

During this operation, because pulse widths are very low, the interlock time is a large percentage of the overall pulses applied. As a result, the internal motor model of control system 100 is excited with the interlock compensated voltage, and the actual measured currents existing in the real world. Without the interlock compensation the initial flux prediction would be incorrect, if it were incorrect the incorrect torque would be computed and would not allow synchronous frequency to be naturally determined. A larger pulse width could be used, but this would stimulate an over-current trip transient. Hence the interlock compensation is critical for rotating restart to work well.

The variable Rs_running is assigned a value that is ramped from DSP_RS_FACTOR times the nominal stator resistance value Rs to DSP_RS_START_FACTOR times the nominal stator resistance value Rs. DSP_RS_FACTOR is normally value 0, and DSP_RS_START_FACTOR is normally within the range of value 2 to 10. The task of ramping Rs_running from a higher value to a nominal value is a means of introducing losses into the algorithm. This has been shown to improve the smoothness of starting.

Sequential Processing Event Manager 120 ensures that power circuit 114 is enabled with an initial PRESENT STATE switch command, and subsequent processing of the embedded motor model, and Present State Contemplator 128 and Next State Contemplator 136 are each enabled with time-step h. These timing events ensure that the gating commands that are initially applied to induction motor 112 are of very low pulse width to produce minimal opportunity for a transient over-current. It should be noted that these low pulse width commands create an even stronger requirement for the interlock delay compensation that is utilized by control system 100 in the determination of stator flux. If the stator flux is not quickly identified in the initial "probing" of the motor, the internal embedded motor model states will differ greatly from the actual motor states, and the typical result is over-current transients causing protective shutdown, a common characteristic of many prior art drive systems.

Once completed, the rotating restart sequence results in the variable ZTC_limited_flux_command being equal to |λ_s|* (the normal running command), whereupon the torque command held at zero, is then reconnected to Te*. The inventor has utilized Rotating Restart Module 190 to achieve a rapid state detection of induction motor 112 over a very wide speed range, namely from rated speed and higher down to zero speed. The methodology has also been shown to be very reliable producing extremely low transient starting of the induction motor in any kind of load. Control system 100 has been observed to achieve motor state acquisition times in the range of 60-600 µs, when h=60 µs.

Torque is calculated by the actual stator current and the estimated stator flux. Hence, if the stator flux is not accurately estimated during the initial low flux command, then the synchronous frequency cannot be determined. The unknown signal of interest in the rotating restart procedure is the speed and/or frequency. However, as mentioned, frequency is not explicitly searched for like it is in other rotating restart schemes; rather the frequency is determined as an indirect result of the torque and flux control that is achieved. This is why within several h cycles, control system 100 can converge on the correct synchronous frequency virtually eliminating a transient that might otherwise occur in other prior art speed identification algorithms.

Rotating Restart Module 190 is effective even when the initial direction of the actual rotation is not known. This can be of particular advantage in fan ventilation systems where back draft can result in the motor spinning backwards continuously before the motor drive engages with the motor. Such performance is superior to many prior art rotating restart schemes that typically exhibit wide performance variation and high dependence on the system inertia, or use complex multi-sequence current probing techniques that take seconds to complete.

Failure Mode Operation

Figure 23:
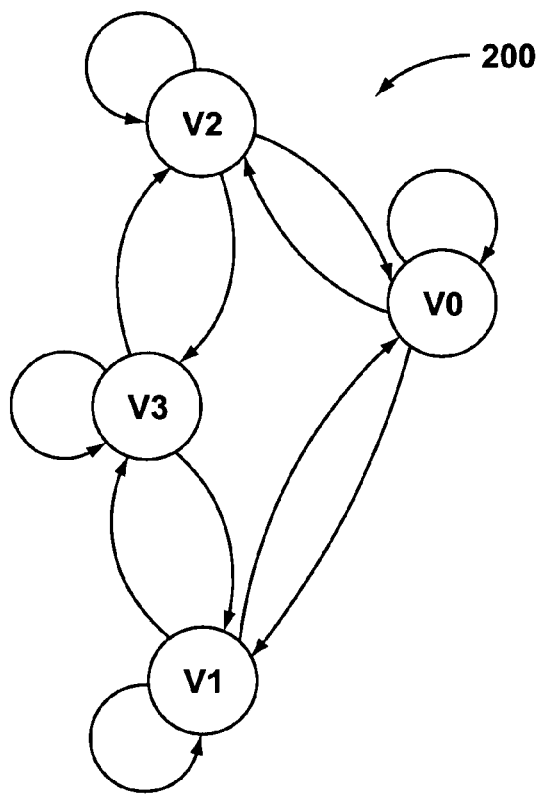
FIG. 23 is an example of a severed finite state transition diagram that can be utilized by the control system of FIG. 5A in the case of a particular detected failure mode.

FIG. 23 illustrates a severed finite state machine 200 that corresponds to failure-mode operation of power circuit 114 with induction motor 112 controlled by control system 100. In the event of failure, it is desirable for control system 100 to maintain torque control of the induction motor, long enough to bring the motor to a controlled stop, or operate at reduced power quality performance. For example, in the case of paper machines a complete instantaneous shutdown results in considerable wasted effort (and money) in production down time as the machine must be re-threaded with paper after the drive is repaired.

Specifically, when operational failure is detected by control system 100 (using conventionally known failure detection hardware equipment) control system 100 can be programmed to load in a new controller configuration and state transition constraints (i.e. severed finite state machine 200) into Next State Contemplator 136 to still allow operation, albeit possibly with greater torque and/or flux ripple. In contrast, prior art control systems do not provide the facility for surviving a switch failure short (or open) while still maintaining control of the motor.

Referring now to FIGS. 7A and 23, and specifically to the a-phase of the three phase voltage source inverter, a failed power circuit 114 having a bottom a-phase switch that fails in a shorted state can be accommodated by control system 100. When the bottom a-phase switch fails, circuitry can be designed which will detect and confirm to software that the power circuit 114 has a failed short on phase a—lower leg.

Control system 100 can then replace finite state machine 50 with severed finite state machine 200 resulting in reducing the available power circuit states from eight to four. Originally the switch states S{a,b,c} were defined as follows:

abc
000
001
010
011
100
101
110
111

With the lower leg (i.e. a-phase) shorted, all of the 1XX states are not possible because a-lower leg is defined as stuck on (i.e. closed), and accordingly the new available sequences are:

abc
000
001
010
011

The present control system 10 and 100 can be modified very easily by simply excluding the 1xx states from the Next State embedded simulation pre-runs as potential Next State candidates. If this is done, the simulation pre-runs will be done on only those Next State candidates that are truly available in the power circuit and hence the algorithm will "do the best possible" given the limitations presented. In a similar fashion to the case of the top leg of the A-phase switch being in a shorted condition, all other phases that are faulted can be handled in an analogous way.

An "open" switch (i.e one that does not turn on for some reason) can also be handled in a corresponding way described as follows. When a switch is identified as not responding to an "on" command, control system 100 operates as follows. An open switch can have voltage across it, or not (e.g. freewheeling diode conducts). Since the external circuit decides the state of the pole with the open switch, circuitry can be added to control system 100 which "measures" the true state of the voltage of the pole irrespective of the gating command, and this can be used in the algorithm to produce an accurate flux prediction.

Hence, when a switch is open, it is possible to program control system 100 to not consider states which would consist of commanding the turn-on of a particular switch. For example, if a-lower leg switch is open circuit, then all Next States with the form: 0XX would be excluded as viable next state candidates, and the true state of the output would be measured on phase-a when a-upper leg was turned off, because in that condition the pole voltage is determined by the external circuit. In this way, power circuit 114 would be able to run and control induction motor 112. Again, while operation in failure mode occurs at the cost of higher ripple current etc., nonetheless operation is possible.

Two-Step Look Ahead

In the one-step look ahead approach discussed above, control system 100 begins in a Present State (i.e. S{x}). When a change of state has been determined necessary, several Next States can be contemplated (i.e. S{e}, S{f}, S{g} and S{k}). A simulation pre-run is executed for the e,f,g,k states and the optimal state is chosen. A set of predicted internal states for the motor is obtained, and once the internal states of the motor is predicted, any internal variable of the motor can be computed, for example the current, the torque, the flux as discussed in detail above. The Next State is chosen by selecting one of Next States S{e}, S{f}, S{g} or S{k} based on the state that will achieve the minimal error of the stator flux compared to the stator flux reference.

In a more complex criterion for the choice of Next State, it may be desired to minimize the "change" of flux in the main inductance Lm as an overall strategy of reducing magnetic losses and/or noise. It is entirely possible that more than one of the Next State choices S{e}, S{f}, S{g} and S{k} will still produce a resultant flux that falls within the hysteresis (i.e. change of state required) criterion. For example, it is possible that Next State S{e} produces the minimal error, Next State S{f} produces the next largest error, and that Next State S{g} and S{k} both fall outside of the hysteresis band. Control system 100 discussed above would simply select Next State S{e}. However, Next State S{f} could also be considered since it still results in a flux that falls within the acceptance band, and there is a possibility that the possible Next State transitions from Next State S{f} could be more optimal for induction motor 112 than those possible from Next State {e}.

Accordingly, another level of look ahead could be conducted within control system 100 to increase the effectiveness of the achievable control. Assuming Next State S{e} is chosen, a second set of fictitious hypothetical predictive iterations are conducted which represent the potential next Next State after S{e} is asserted. They would be S{e1}, S{e2}, S{e3}, S{e4}. Assuming Next State S{f} is chosen, a second set of fictitious hypothetical predictive iterations would result in S{f1}, S{f2}, S{f3}, S{f4}.

Each of these scenarios now produce a set of potential state transition sequences as follows:

S{e}>S{e1}, S{e}>S{e2}, S{e}>S{e3}, S{e}>S{e4}
S{t}>S{f1}, S{f}>S{f2}, S{f}>S{f3}, S{f}>S{f4}

Each sequence will produce a set of two hypothetical motor internal state predictions and these can now be used to compute a "change of flux in Lm" prediction corresponding to each of the proposed sequences (eight in total). Subsequently, this modified approach would look to see which state change sequence satisfies the dominant torque/flux criterion established by the hysteresis bands, but at the same time also minimizes the change in Lm*Im (i.e the excursion of Lm*Im). Once the S{e} or S{f} decision is made it will allow for actual assertion of the Next State S{e} or S{f} as well as the following state after that S{xx}. Alternatively, the next cycle S{xx} can be taken as the preferred choice but may be over-ridden if for some reason external influences (like a large change in torque between cycles) have rendered the second level of look ahead impractical for that cycle.

In essence this proposed second level of look ahead strategy will produce a set of favoured sequences which might otherwise never have the opportunity to have been executed, and so statistically, the lower loss/noise sequences will be chosen whenever possible subject to the prioritized criteria. In view of the substantial digital signal processing power coming available at low cost (i.e. the ability to switch at 20,000 Hz or greater will be available inexpensively), improved efficiency and/or noise reduction can be achieved.

Synchronous Motor Control

Control system 10 can also be adapted to control a power circuit associated with a large number of different types of devices. For illustrative purposes, it will now be discussed how control system 10 can be adapted to control a synchronous machine, which include permanent magnet types. Synchronous machines differ from induction motors in that the rotor flux is established by use of a fixed magnet or separately excited field winding mounted appropriately. The torque and stator flux equations are still the same as in the induction motor as shown below:

$$Te = \frac{P}{3}[\lambda_{ds}Iqs - \lambda_{qs}Ids]$$

$$\overline{\lambda_s} = (L1s + Lm)\overline{Is} + Lm\overline{Ir}$$

The machine model for a permanent magnet motor is very similar to an induction motor, but with an additional fixed current source. The current source vector idr+j iqr is envisioned which effectively drives a current into the magnetization inductance Lm and results in a flux magnetic motive force (mmf) pattern in the machine, even when the power source is disconnected. Rotation of the machine as a generator produces a voltage proportional to the speed multiplied by the flux. As the current source frequency increases so does the voltage supported by Lm. Normally, no slip exists (i.e s=0), and the speed is proportional to frequency under all conditions.

Figure 24:
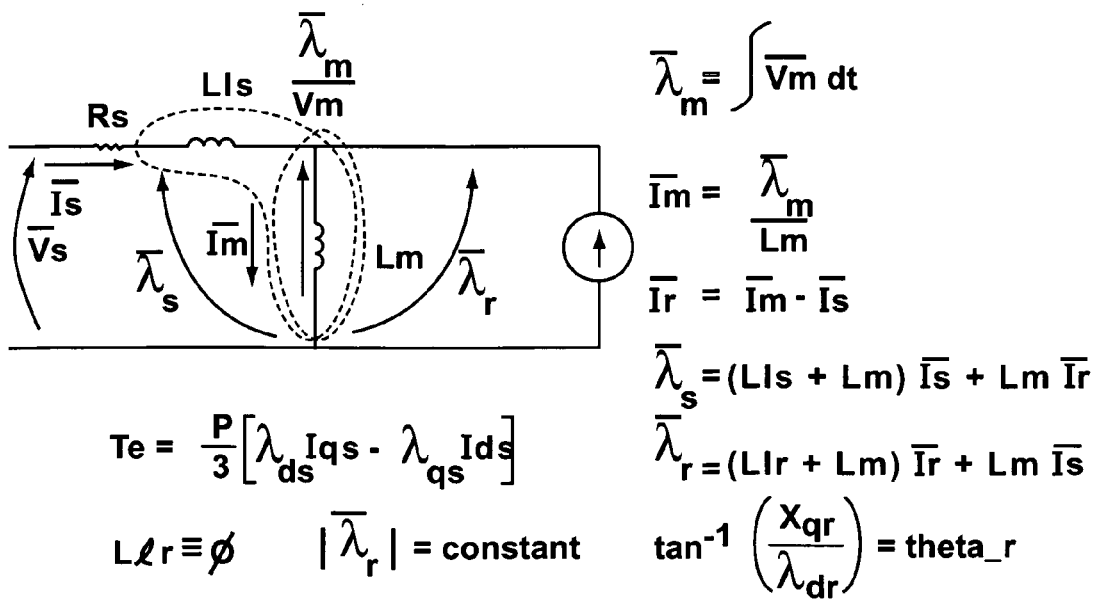
FIG. 24 is a schematic of a modified motor model for a synchronous machine having field magnets, or wound field excitation coils.

FIG. 24 shows the synchronous motor model. In contrast, to the inductance motor model (FIGS. 6A and 6B), inductance Llr is not in the diagram (Llr=0). Also, the rotor resistance "Rr" and slip "s" are not in the diagram since the value of slip "s" is zero and accordingly the relation (Rr/s) approaches infinity and no longer has effect on the circuit model. It should be noted that some synchronous machine designs utilize induction motor rotor bars as a stabilizing technique, and the inventor herewith contemplates synchronous motor control schemes where the Rr/s branch and Llr branch could also be allowed to remain in the model of FIG. 24 to account for sub transient behaviour of the machine related to this combinational synchronous/induction motor structure, typically not modeled in prior art synchronous motor control schemes. However, for the sake of clearly describing the basic synchronous motor control, these elements are not shown in FIG. 24. The calculations for the sensor-less control of the induction motor control 112 (FIG. 5A and 12A) described in this disclosure have shown that the stator flux can be determined extremely quickly and accurately as the motor rotates. It should be noted that this is accomplished with virtually no involvement of the rotor parameters, except in developing the sensor-less speed acquisition signal ZTC_Wrr, which is not required for basic torque control and in the case of the permanent magnet machine the speed signal is not required at all because frequency (or rate of change of rotor angle) is synonymous to speed in synchronous machines. The actual stator flux and torque in the synchronous machine can be determined using the same methodology as used for induction motor 112 discussed above as per control system 100. Hence, very little changes between the induction motor control and the synchronous motor control are required, because in the induction motor case, rotor flux magnitude and angle are controlled, and in the second case only the rotor angle theta_r is unknown. The rotor flux magnitude is fixed by virtue of the separately excited field winding, or the presence of a permanent magnet in the synchronous machine.

To achieve proper control, some modifications to the "ideal" stator flux concept are necessary. The exact rotor angle can be determined indirectly in the same way as was discussed for induction motor 112 where the slip frequency is generated indirectly in the torque control process without a sensor. Synchronization (i.e. the rotating restart procedures discussed above) operates in a similar way in association with a synchronous motor, in that an applied low initial pulse width having a zero-torque reference can be used to identify the actual rotor flux and steer the switching process to the ideal solution. In so doing the rotor angle is determined and regulated indirectly, one of the most difficult aspects of synchronous sensor-less control.

The methodology and modifications to the sensor-less motor control techniques discussed above in association with control system 10 and control system 100 are as follows. First, the induction value Llr is set to zero since there is no rotor leakage inductance. Second, the "ideal stator flux" derivation of FIG. 17A is used but modified as follows. The value of Llr is set to zero. Also, the value of |λr| is no longer an estimated variable, but is a constant. Also, the command |λs|* no longer applies and |λs|* in FIG. 17A is replaced with |λs| (the actual estimated stator flux). Finally, the start sequence of each and every initial "enable" of control system 10 or 100 no longer resets the state variables λs and λr to zero in the embedded motor model (i.e. in Embedded Simulator 124), but initializes them to an arbitrary vector λr=x+jw such that |λr|=|λs|=constant referred to above (i.e. the constant value of |λr|). In this way, during the rotating restart sequence, with Te*=0, the model is initialized to a state where only the rotor angle (theta_r2) is unknown, whereupon "engagement" of the inverter to the motor will naturally correct the angle by advancing or retarding the ideal stator flux vector command appropriately to allow the embedded model to become congruent with the actual motor. This is analogous to the induction motor case whereupon the frequency is determined indirectly.

Sensorless Torque Control and Current Regulation

In some machines it is often desired to operate with one or more stator windings. Traditional systems that employ two or more windings depend on independent current regulation to ensure that each winding carries an equal load current. In sensor-less schemes, the ability to do this is more difficult due to the well known high-speed limitations of sensor-less current mode control. Furthermore, in high speed machines, phase lag, matching, and inadequate switching frequency make it very difficult to keep harmonic currents in each winding under control. All of these factors exasperate the problem of executing a high performance sensor-less current regulated control system with multiple windings, and practical current sharing.

Figure 25:
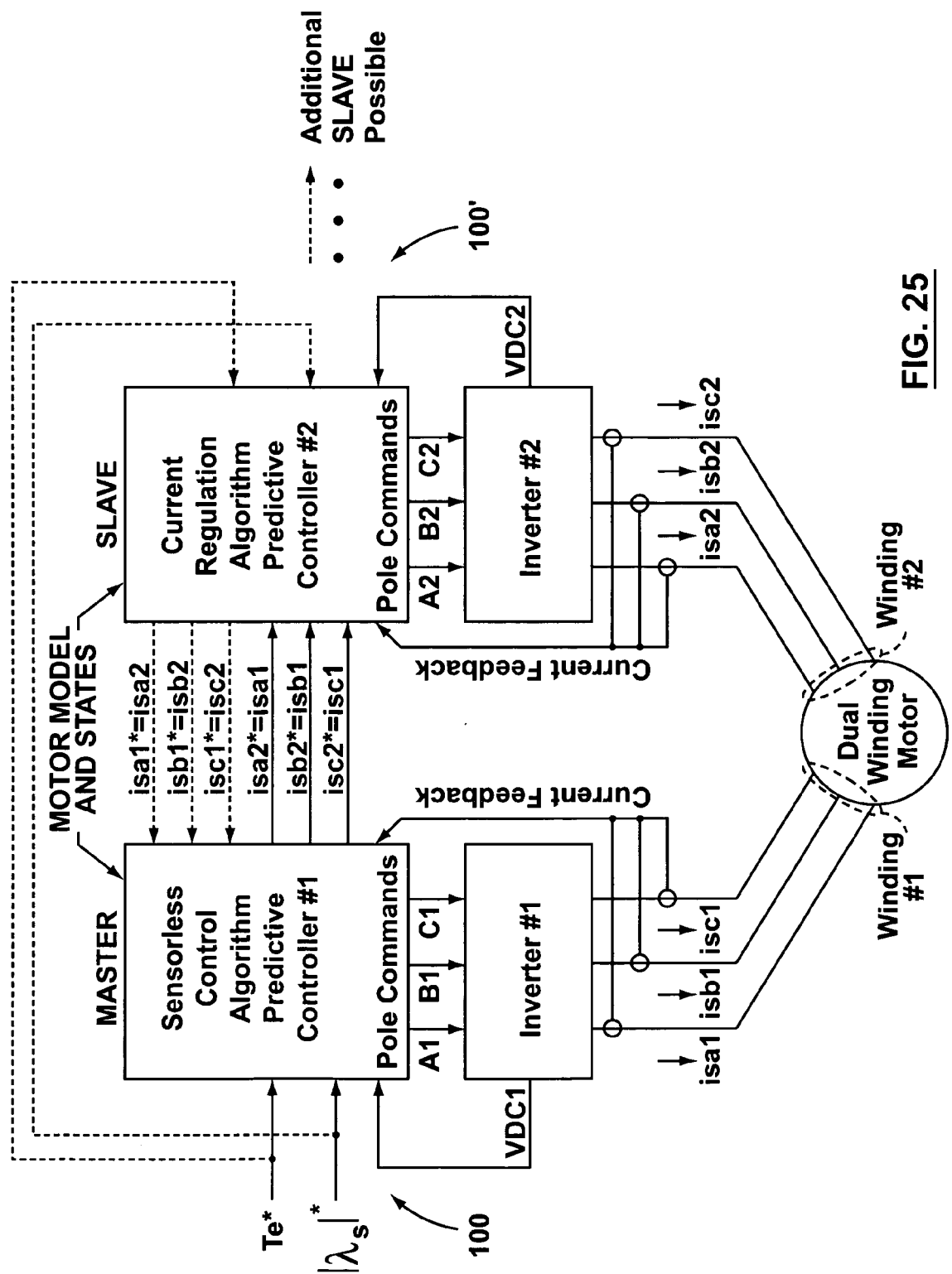
FIG. 25 is a schematic diagram of an arrangement of two (or more) control systems of FIG. 5A configured to control torque or flux within a multi-stator winding machine while providing current regulation.

Given the abilities of the sensor-less control system 10 as described in respect of both an induction motor 112 and a synchronous motor, the multi-winding current regulation issue can be eliminated according to the following methodology as shown in FIG. 25. First, control system 100 is used to control the first winding as discussed in detail above (i.e. the "Master" controller). Then, a second control system 100' controller is used to control the second winding (i.e. the "Slave" controller). The objective of this arrangement is to control torque and/or flux optimally while maintaining equal power (current) delivery to each motor winding. Several embodiments are possible utilizing the following core concepts. The first control system 100 will out of necessity produce currents with varying degrees of sinusoidal quality. These real time currents can be passed to a second control system 100' (current regulator) having a Change of State Criterion Module 126' and Next State Contemplator 136' and Embedded Simulator 124'. Control system 100' can be used to regulate current "ideally" subject to a set of "targets". A Present State Contemplator 128' can be developed to determine what conditions set a need for contemplating the next state.

The currents established in normal motor control by control system 100, can be set as target currents for controller 100'. This will serve the purpose of forcing currents to match. Controller 100' then would have an ideal current vector. The Embedded Simulation 124' of controller 100' may simply be an inductance and a known or estimated voltage differential across the inductance. Sets of Next States, and transition constraints can be set up to provide control of the current in the second winding. It should be understood that VDC1 and VDC2 can be separate and independent or can be one and the same, (i.e. a common DC link energy source). Further, since Master and Slave are essentially identical hardware, true dual-redundant failsafe operation (of particular interest to aerospace and military) can be achieved by simply holding both control system 100 (Master) and control system 100' (Slave) so that when one system fails, the other can take over, albeit at reduced power capacity.

This control system 100' current regulator concept has many benefits. It can be precisely synchronized to controller 100 or not. It can offer predictive control benefits, which do not suffer from the same phase lag problems associated with traditional current regulation. Smarter current regulators can be conceived that adjust the "target" currents to eliminate or reduce current ripple resulting from controller 100. If the system is properly configured, this can reduce magnetic space harmonics contributing to eddy current losses and parasitic heating. This approach is not limited to motors at all, and in fact any current regulation challenge can be resolved using this approach. Finally, it should be understood that any number of additional devices or motors may be controlled in this manner with an associated number of control systems.

Synchronous Reluctance Motor Control

Control system 10 can also be adapted to control a power circuit associated with a synchronous reluctance motor. Synchronous reluctance motors have stators that are similar to those used in induction motors, permanent magnet motors and synchronous motors. Accordingly each of these motors produces a rotating stator flux in a similar fashion. However, synchronous reluctance motors do not produce an independent rotor flux since the rotor in a synchronous reluctance motor does not contain any magnets or windings. Instead, synchronous reluctance motors develop torque based on the principle of minimum reluctance.

The rotor of a synchronous reluctance motor rotates since it is always seeking a minimum reluctance path in the magnetic circuit comprising the rotor and the stator with the flux flowing therebetween. Induction motors, permanent magnet motors and synchronous motors typically do not have a dominant reluctance characteristic and thus have a more constant magnetization inductance that is more independent of rotor position relative to the stator. In contrast, synchronous reluctance motors have a magnetization inductance that varies with position. Thus, the synchronous reluctance motor has a d and q axis magnetization inductance Ldm and Lqm that differ from one another. Accordingly, for a synchronous reluctance motor, the equations for direct and quadrature stator flux are different from those of the previous motors and are given by:

$$\overline{\lambda}_{ds} = Lls\,\overline{Ids} + Ldm\,\overline{Ids}$$

$$\overline{\lambda}_{qs} = Lls\,\overline{Iqs} + Lqm\,\overline{Iqs}$$

The values Lls, Ldm and Lqm are motor parameters that are specified by the manufacturer of the synchronous reluctance motor and are therefore known a priori to the operation of the synchronous reluctance motor.

In synchronous reluctance motors, torque is produced due to the interaction between the rotating stator flux and the differing d and q axis magnetization inductances. However, in contrast to the equations for stator flux, the equation for torque is identical to the torque equations for the other machines and is given by:

$$Te = \frac{P}{3}[\lambda_{ds}Iqs - \lambda_{qs}Ids]$$

Figures 26, 27:
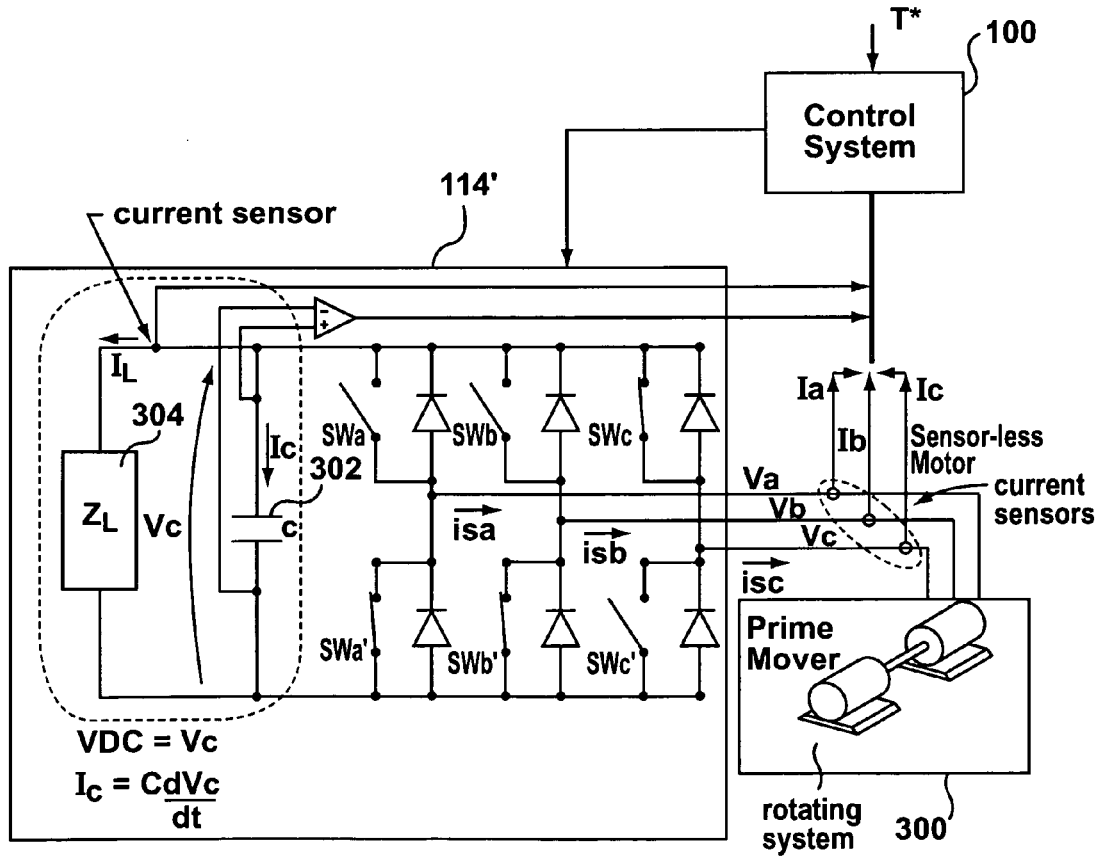
FIG. 26 is a schematic diagram of a modified motor model for a synchronous reluctance motor having a salient magnetic reluctance characteristic.
FIG. 27 is a schematic diagram illustrating the use of the control system of the present invention to generate and manage DC bus power for a DC link provided by a rotating system; and, FIG. 28 is a schematic diagram illustrating the use of the control system of the present invention to adjust the power delivered by a three-phase grid source.

Referring now to FIG. 26, shown therein is a machine model for a synchronous reluctance motor. The machine model for a synchronous reluctance motor is similar to that of an induction motor except that the rotor branch is non-existent (Llr and Rr are removed) and the magnetization inductance Lm is not the same for the direct and quadrature voltages Vds and Vqs. Instead the direct and quadrature magnetization inductances, Ldm and Lqm, must be used which are related to the magnetization inductance Lm according to $Lm=\sqrt{Ldm^2+Lqm^2}$. Accordingly, the stator voltage is given by Vs=Vds+jvqs and the stator current is given by Is=Ids+jIqs.

Despite the differences in the machine model and the above stator flux equations for the synchronous reluctance motor in comparison with the induction motor 112, the control system 10 (or the control system 100) may still be used to control the torque of the synchronous reluctance motor since the fashion in which current is measured and stator state variables are used in the torque control of a synchronous reluctance motor is similar to the control scheme developed for the induction motor. Therefore, the torque control method of the control system 10 may be used in essentially the same form as developed for the induction motor 112 with the rotor branch removed (Llr and Rr), and Lm replaced by Ldm and Lqm in all q axis and d axis calculations in the models. Furthermore, the rotor flux can be considered to be the same as the magnetizing flux km because the rotor branch is no longer present. In addition, for other calculations involving the scalar Lm, such as the "ideal stator flux" vector computation, the variable $Lm=\sqrt{Ldm^2+Lqm^2}$ should be used. For instance, adapting the equations in FIG. 17a for use with a synchronous reluctance motor involves using $Lm^2=Ldm^2+Lqm^2$, $L_R=\sqrt{Ldm^2+Lqm^2}$ and $L_S=Lls+\sqrt{Ldm^2+Lqm^2}$. Furthermore, the use of the control system 10 will produce accurate stator flux identification for a synchronous reluctance motor due to the interlock delay compensation, and the stator flux and torque control schemes used in control system 10.

The induction, synchronous and synchronous reluctance motors may all be controlled in a similar fashion using control system 10 with various modifications to the corresponding parameters and equations and the structure which implements the equations. Accordingly, the structure of the control system 10 (or control system 100) along with other features such as sensor-less torque control and current regulation as well as rotating restart, and failure mode operation form a generic motor control system that can be applied to a wide variety of motors.

Furthermore, the architecture of the control system 10 does not utilize Proportional Integral Derivative (PID) controllers which means that "tuning" the control system 10 is effected by altering the simulation model and associated parameters that are embodied by the Embedded Simulator 24 and the Load and Power Circuit Parameter Module 30 respectively as well as by altering the other predictive controller constraints and criteria such as the Next State Choice Criteria 34, the State Transition Constraints 32 and the Change of State Criteria Module 26 (this also applies to control system 100 and the appropriate modules contained therein). This is beneficial since traditional PID controllers require tuning to ensure adequate phase and gain margin. If the tuning of these PID controllers changes, which may occur due to temperature variations, or the load parameters change in value due to temperature variations, then practical stability considerations must be reviewed to ensure operability of the PID controller for the intended operating range. However, the control systems of the present invention have a more robust performance since most parameters are essentially temperature independent (except for Rs which can be tracked or measured). Hence, the stability issues of PID controllers do not arise with the control systems of the present invention.

DC Bus Power Generation and Management

Referring now to FIG. 27, the control systems of the present invention (control system 100 is shown for example) may be used for DC bus power generation and management for a rotating system 300 that is used to generate voltage. The control system 100 is coupled to a modified power circuit 114' to control the rotating system 300 to control the voltage that is provided to a second load 304 via a link supply comprising a capacitor C. The power circuit 114' is modified in that the link supply is no longer a fixed source (as was shown in FIG. 5a) but is now one of a capacitor, a source and a combination of a capacitor and a source (the first option is shown in FIG. 27) which may provide DC and AC power to the second load 304. This configuration allows the control system 100, the power circuit 114' and the rotating system 300 to produce and manage the DC voltage, the DC current and the active and/or reactive power that is delivered to the second load 304.

The second load 304 is typically thought of as being capable of supporting an average DC current and DC voltage. However, in most general terms, the second load 304 is also capable of supporting AC components of voltage and current as long as the voltage across the capacitor C is greater than or equal to zero. The second load 304 may also contain energy producing elements, such as, but not limited to, a battery or another rotating system, which will produce energy that flows back to the rotating system 300. Accordingly, and in the most general case, the second load 304 can have an AC and average power flow from and to the rotating system 300, and the rotating system 300 can have an AC and average power flow to and from the second load 304. Since power is due to the product of speed and torque, it is possible for the control system 100 to manipulate the torque of the rotating system 300 to control the power flow to and from the rotating system 300 to achieve various control objectives such as, but not limited to, the examples discussed below.

A control objective may be the regulation of the DC link voltage that is provided to the second load 304 by the rotating system 300. This typically has applications in DC power generation. In this case, the torque reference may be determined according to:

$$T^* = I_L \cdot V_{DC}/\omega$$

where * denotes a reference variable, T* is the torque reference and ω is the speed of the rotating system 300. Another control objective may be the control of the DC link current provided to the second load 304 which is typically required in welding or chemical applications.

Another control objective may be reactive power compensation to the second load 304 by using the rotating system 300 to provide a first reactive power that cancels out a second reactive power that is currently present in the second load 304. The second reactive power that is currently present in the second load 304 is given by $Im(V_{DC,AC} \cdot I_{LAC})$ where $Im( )$ represents the imaginary component, $V_{DC,AC}$ is the AC component of the DC link voltage and $I_{LAC}$ is the AC component of the load current. This is usually done to reduce the ripple in the DC link voltage that is provided to the second load 304. In this case, the inertia J of the rotating system 300, which stores energy of magnitude $(½)J\omega^2$, may be used to supply the first reactive power, by using suitable AC torque commands from the control system 100, such that changes in the energy provided by the inertia of the rotating system 300 balance the changes that would otherwise occur in the power provided to the second load 304. A suitable torque command can be derived from the relation:

$$T^* = Im(V_{DC,AC} \cdot I_{LAC})/\omega$$

Consequently, the inertia of the rotating system 300 may be used to reduce the size of the capacitor C in the DC link, i.e. instead of having a larger capacitor C to provide the first reactive power to the second load 304, the inertia of the rotating system 300 is utilized instead.

Another example of a control objective may be to utilize the rotating system 300 as a rotating energy sink, if the second load 304 is providing energy, to stabilize the DC link voltage. This typically has application where the second load 304 can produce energy that results in an uncontrolled rise in the DC link voltage across the capacitor C. In this case, a maximum DC bus voltage reference, $V_{MAX}^*$ is defined such that:

$$T^* = 0 \text{ for } V_{DC} < V_{MAX}^* \text{ and}$$

$$T^* = (V_{MAX}^* - V_{DC}) \cdot I_L/\omega \text{ for } V_{DC} > V_{MAX}^*$$

Various control methodologies may be conceived to implement the control objective examples given above, however, all control methodologies would use the principle of developing a torque command at any speed of the rotating system 300 to produce a power transfer equal to the power desired in the DC link, as described above.

Active Front-End

Figure 28:
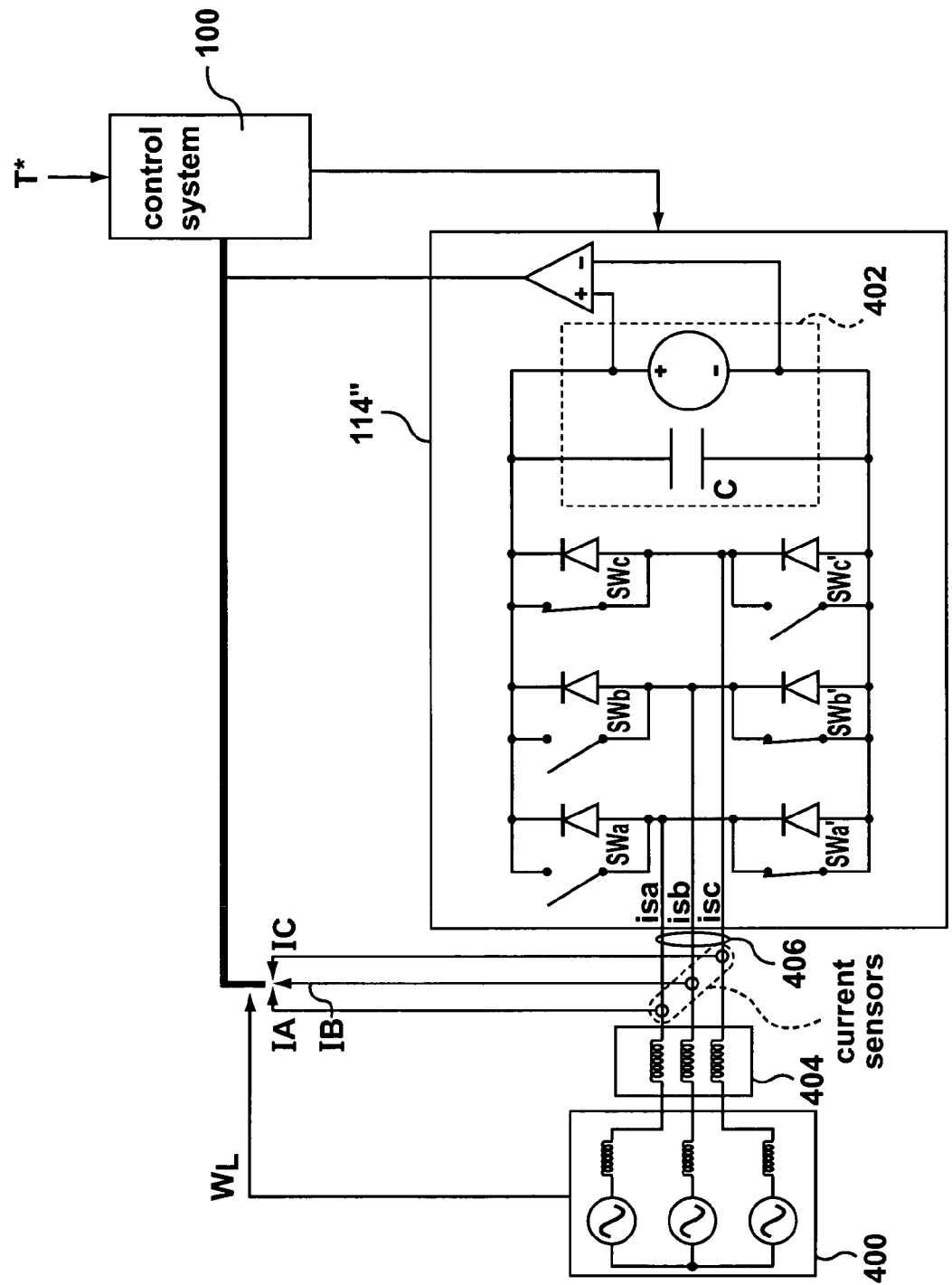

Referring now to FIG. 28, the control systems of the present invention (control system. 100 is shown for example) may be used to adjust the power delivered by a three phase grid source 400. The control system 100 is coupled to the three-phase grid source 400 via a power circuit 114" which comprises a three-phase inverter and a DC link 402 having one of a capacitor C, a DC energy source, and a capacitor C and a DC energy source (the latter option is shown in FIG. 28). Coupling to the three-phase grid source 400 may also include line reactors 404 to limit the changes in current that are incurred during the switching of the three-phase inverter.

In this case there is no motor in the system. However, the three-phase grid source 400 may be considered to be a large motor that is located remotely (i.e. the fictitious motor is located at a generating facility for example). The motor parameters of the fictitious motor may be automatically identified using identification software which is readily available to those skilled in the art. The magnetizing inductance of the fictitious motor should be very large and the leakage inductance reflects the actual circuit inductance. The speed of the fictitious motor can be considered to be constant since the three-phase grid source 406 can be considered to be an enormous prime mover. In this case, the speed is invariant regardless of the load level since the grid frequency is designed to be invariant. Accordingly, power will be directly proportional to torque and power may be extracted from the DC link 402 and inverted back to the power grid 406 by issuing torque commands from the control system 100. The torque command may be given by $T^* = P^*/\omega_L$ where P* is the reference power and $\omega_L$ is a constant for a measured signal representing the line frequency of the power grid 406 (this can be measured or assumed to be 60 Hz for a North American power grid or 50 Hz for a European power grid). In this example, the DC bus source should have a greater voltage than the peak of the line-line voltage in the power grid 406.

The process of connecting to the power grid 406 is done without the need for line voltage sensing and filtering. Neither the frequency, nor the phase of the power grid 406 is initially known, however, in the same fashion that sensor-less torque control can be engaged with a spinning motor as discussed previously, the control system 100 can engage the power grid 406. Accordingly, the control system 100 and the power circuit 114" can be used with a 60 Hz grid (i.e. North American power grid) or a 50 Hz grid (i.e. a European power grid) without any changes in the structure of the control system 100.

In contrast, prior art control schemes depend on the measurement of the line voltage of the power grid 406 in order to synchronize typical prior art current regulators with the three-phase grid source 400. However, the presence of finite source impedance in the three-phase grid source 400 introduces distortion in the line voltage when an inverter is being switched and elaborate filtering methods have been conceived to deal with this issue. This is not required in the sensor-less torque control methodology of the present invention.

The arrangement shown in FIG. 28 may be used to achieve several objectives such as, but not limited to:

1) The use of the power circuit 114" to produce reactive currents in the grid 406 to compensate for reactive power flow in the interest of achieving unity power factor in the power grid 406. This may be achieved by measuring the reactive power using conventional methods. Once this reactive power is measured, the process requires a torque reference (T*) to be developed such that $T^* \omega_L$ is equal to the negative of the measured reactive power.

2) The use of the power circuit 114" to produce negative phase currents in the power grid 406 to remove harmonics in the grid current. This may be achieved by using conventional methods to extract the harmonic power signal from the total power in the power grid 406 and producing a torque command (T*) such that $T^* \omega_L$ is equal to the negative of the harmonic power.

3) The use of the power circuit 114" to accomplish grid-power regeneration involves generating power from, the DC link 402 and the power circuit 114" and feeding this power back into the power grid 406 under control of system 100. This may be achieved by using a torque command given by $T^* = P^*/\omega_L$ where P* is the reference power and $\omega_L$ is a constant representing the line frequency of the power grid 406.

In examples 1 and 2 above, a prime mover is optional. Furthermore, for each of these objectives, torque commands would be produced by the control system 100 to actuate the power circuit 114" to provide the appropriate currents to the grid 406 to achieve the desired objective.

Control systems 10 and 100 offer improved control facility over known prior art device controllers. Specifically, the switching frequency associated with control system 10 and 100 is lower than other systems, while at the same time operating at higher energy efficiency, smaller volume and/or lower weight and less EMI. Control system 10 and 100 are particularly suited to digital implementation and accordingly may be built within many computational hardware embodiments and used in association with any loads or power circuit types. The adaptability of performance constraints allows control system 10 and 100 to be tailored to meet specific power applications by making the appropriate tradeoffs between switching frequency, performance, processing capability and cost, and variations in power circuit, or motor types. Further, the behaviour of control system 10 and 100 can be adapted, during operation, which suggests further opportunities for motor control functionality. As discussed above, control system 10 and 100 can be adapted to survive failures. Of particular advantage in control system 10 and 100 is that no filters are used, in sharp contrast to traditional controllers. Traditional controllers utilize filters which traditionally introduce phase lag and attenuation into the system. Since control system 10 and 100 do not use filters, they can be applied to a wide range of speed applications without the attendant complications associated with filters.

More specifically, control system 100 produces sensorless control of torque and speed down to zero speed and with very reliable capability of starting into already spinning machines. The torque control reference command step response and the stator flux control response is the fastest theoretically and practically attainable in view of all of the implementation characteristics of the associated hardware elements. The load impact response is as fast as the reference command response while controlling torque, such that the motor control operates in a robust manner against suddenly applied shaft loads. The structure of control system 100 allows for the sensing of a disturbance at the shaft, and then for application of load driven shaft torques even at zero speed. Finally, the fact that the control switches of power circuit 114 are not controlled using a conventional modulator results in lower audible noise, lower energy loss and lower EMI compared to other controls with the same torque control performance.

Overall, control system 10 and 100 compensates for the shortcomings of power circuits, load and processing technologies, by adequately modeling the individual elements as part of its decision process. Since Embedded Simulator 124 simulation of load circuit characteristics occur within, products incorporating control system 10 will not show the traditional simulation challenges faced with desktop computing software. In fact, products using the control system 10 and 100 can be used as tools to predict and evaluate the performance of the product themselves, offering time and cost benefits associated with engineering rework and redesign tasks. Control system 10 and 100 is capable of becoming a standard control structure for power electronic applications because it can be re-used and easily migrated toward improved future technology.

As will be apparent to those skilled in the art, various modifications and adaptations of the structure described above are possible without departing from the present invention, the scope of which is defined in the appended claims.

The invention claimed is:

1. A method for determining a voltage provided by a power circuit having N switches in a circuit configuration, where each switch includes a unidirectional current element having a connected node that is coupled to a voltage source and an opposite node, each switch having a present current direction, said method comprising the steps:
   (a) for each switch that opens:
      (i) determining the direction of the present current direction with respect to a free-wheeling current path of the unidirectional current element;
      (ii) if the present current direction is positive with respect to the free-wheeling current path, then the voltage at the opposite node is a determined voltage and is equal to the voltage at the connected node; and,
      (iii) if the present current direction is negative with respect to the free-wheeling current path, then the voltage at the opposite node is an undetermined voltage;
   (b) combining the values of all determined voltages present at the opposite nodes of each switch in accordance with the circuit configuration of the power circuit to form a vector representing the voltage provided by the power circuit; and
   (c) using the vector to estimate a main flux linkage of a load circuit associated with the power circuit to model and predict the behavior of the load circuit in order to select switching states for the power circuit to achieve specified performance criterion for the load circuit.

* * * * *

UNITED STATES PATENT AND TRADEMARK OFFICE
CERTIFICATE OF CORRECTION

PATENT NO. : 7,286,906 B2
APPLICATION NO. : 11/504595
DATED : October 23, 2007
INVENTOR(S) : Michael J. Richards It is certified that error appears in the above-identified patent and that said Letters Patent is hereby corrected as shown below:

Column 11, line 34, the term "ADSP-21061K5133" has been changed to -- ADSP-21061KS133 --, so that the line reads -- contains a SHARC ADSP-21061KS133 digital signal processor --.

Column 15, line 53, the term "ZTC_lambda_magnitude," has been changed to -- ZTC_lambda_r_magnitude, --, so that the line reads -- sample of rotor flux angle), ZTC_lambda_r_magnitude, --.

Column 27, line 15, the term "Vintik." has been changed to -- Vintlk. --, so that the line reads -- Vintlk. Second, the main flux is predicted/corrected and time --.

Column 30, line 66, the expression "ZTC_lambda_ds_np1*ZTC_ambda_ds_np1" has been changed to -- ZTC_lambda_ds_np1*ZTC_lambda_ds_np1 -- ; and line 67, the term "ZTC_ambda_qs_np1*" has been changed to -- ZTC_lambda_qs_np1* --.

Column 31, line 34, the term "SELUX_DELTA" has been changed to -- SFLUX_DELTA --, so that the line reads -- SFLUX_DELTA which represents a tolerance band, consists --.

Column 33, line 58, the word "fir" has been changed to -- for --, so that the line reads -- minimum to maximum. This second method is useful for --.

Column 34, lines 28 and 29, the term "ZTC_limited_flux_ommand" has been changed to -- ZTC_limited_flux_command --, so that the two lines read -- of the rotor flux vector), and the variable ZTC_limited_flux_command (which represents the present inferred sample of --.

Column 45, line 43, the term "km" has been changed to -- $\lambda$m --, so that the line reads -- be considered to be the same as the magnetizing flux $\lambda$m --.

UNITED STATES PATENT AND TRADEMARK OFFICE
CERTIFICATE OF CORRECTION

PATENT NO. : 7,286,906 B2
APPLICATION NO. : 11/504595
DATED : October 23, 2007
INVENTOR(S) : Michael J. Richards It is certified that error appears in the above-identified patent and that said Letters Patent is hereby corrected as shown below:

Column 48, lines 51 and 58, for the expression "$T*\omega_L$", each occurrence has been changed to -- $T*\bullet\omega_L$ --.

Signed and Sealed this

Thirtieth Day of December, 2008

JON W. DUDAS
*Director of the United States Patent and Trademark Office*